(12) United States Patent
Chia et al.

(10) Patent No.: US 12,193,242 B2
(45) Date of Patent: Jan. 7, 2025

(54) MULTI-LEVEL MAGNETIC TUNNEL JUNCTION NOR DEVICE WITH WRAP-AROUND GATE ELECTRODES AND METHODS FOR FORMING THE SAME

(71) Applicant: Taiwan Semiconductor Manufacturing Company Limited, Hsinchu (TW)

(72) Inventors: Han-Jong Chia, Hsinchu (TW); Bo-Feng Young, Taipei (TW); Sai-Hooi Yeong, Zhubei (TW); Chenchen Jacob Wang, Hsinchu (TW); Meng-Han Lin, Hsinchu (TW); Yu-Ming Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/510,808

(22) Filed: Nov. 16, 2023

(65) Prior Publication Data
US 2024/0090236 A1    Mar. 14, 2024

Related U.S. Application Data

(63) Continuation of application No. 17/748,095, filed on May 19, 2022, now Pat. No. 11,864,392, which is a continuation of application No. 16/909,080, filed on Jun. 23, 2020, now Pat. No. 11,355,551.

(51) Int. Cl.
*H10B 61/00* (2023.01)
*H10N 50/01* (2023.01)
*H10N 50/80* (2023.01)

(52) U.S. Cl.
CPC ............. *H10B 61/22* (2023.02); *H10N 50/01* (2023.02); *H10N 50/80* (2023.02)

(58) Field of Classification Search
CPC ........ H10B 61/22; H10N 50/80; H10N 50/01; H01L 27/228; H01L 43/02; H01L 43/12
USPC ....................................................... 257/427
See application file for complete search history.

(56) References Cited

U.S. PATENT DOCUMENTS

| | | |
|---|---|---|
| 9,190,260 B1 * | 11/2015 | Zhang ................... H10N 50/10 |
| 11,355,551 B2 | 6/2022 | Chia et al. |
| 2004/0150016 A1 | 8/2004 | Ooishi |

* cited by examiner

*Primary Examiner* — Tu-Tu V Ho
(74) *Attorney, Agent, or Firm* — The Marbury Law Group, PLLC

(57) ABSTRACT

A magnetic tunnel junction memory device includes a vertical stack of magnetic tunnel junction NOR strings located over a substrate. Each magnetic tunnel junction NOR string includes a respective semiconductor material layer that contains a semiconductor source region, a plurality of semiconductor channels, and a plurality of semiconductor drain regions, a plurality of magnetic tunnel junction memory cells having a respective first electrode that is located on a respective one of the plurality of semiconductor drain regions, and a metallic bit line contacting each second electrode of the plurality of magnetic tunnel junction memory cells. The vertical stack of magnetic tunnel junction NOR strings may be repeated along a channel direction to provide a three-dimensional magnetic tunnel junction memory device.

20 Claims, 44 Drawing Sheets

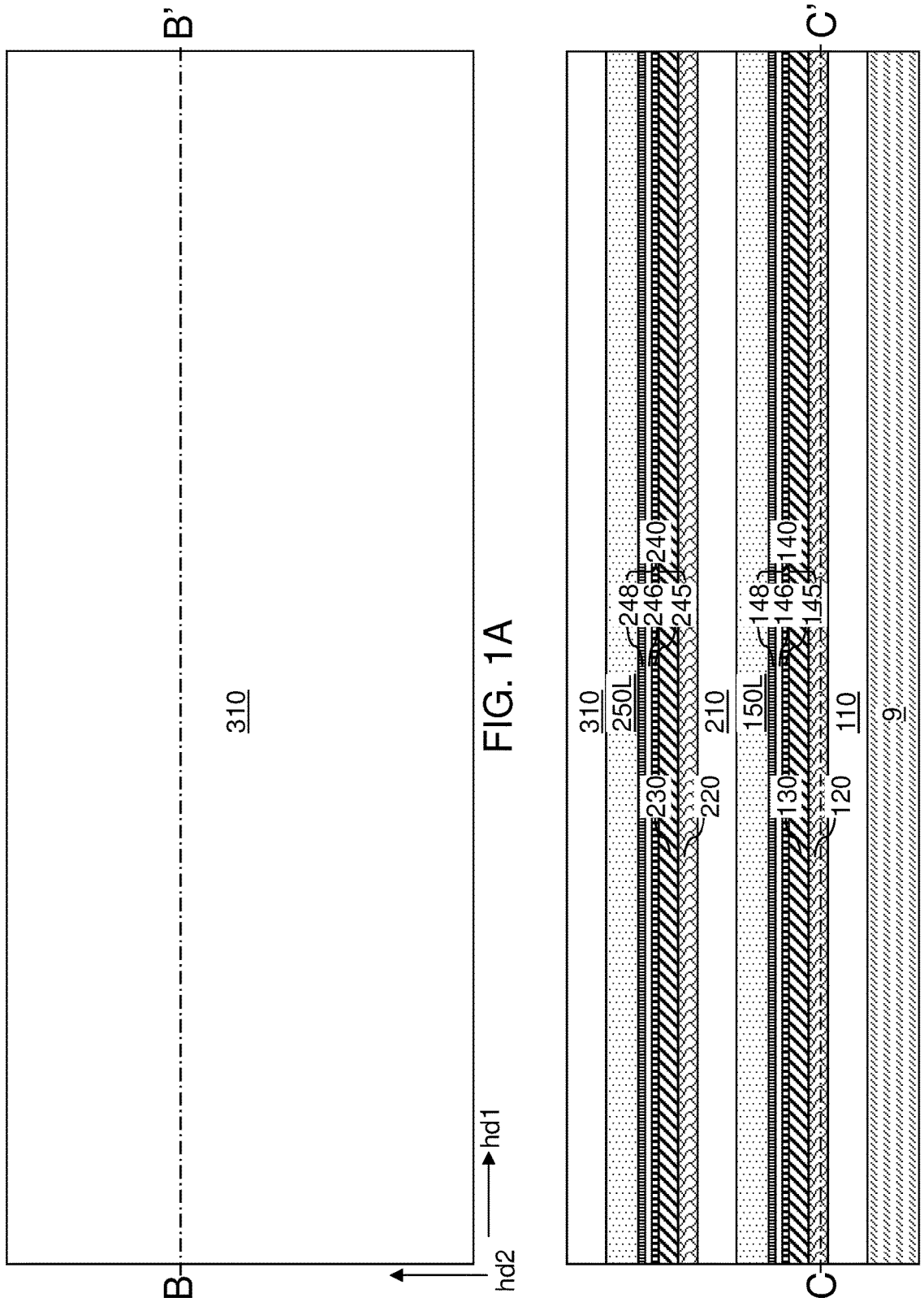

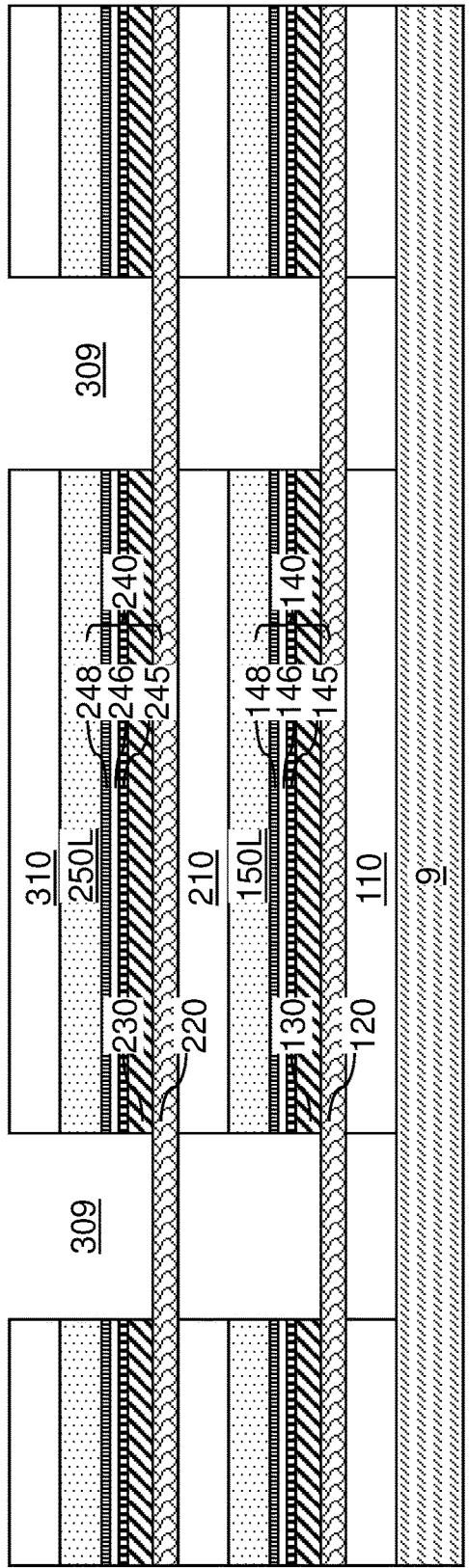
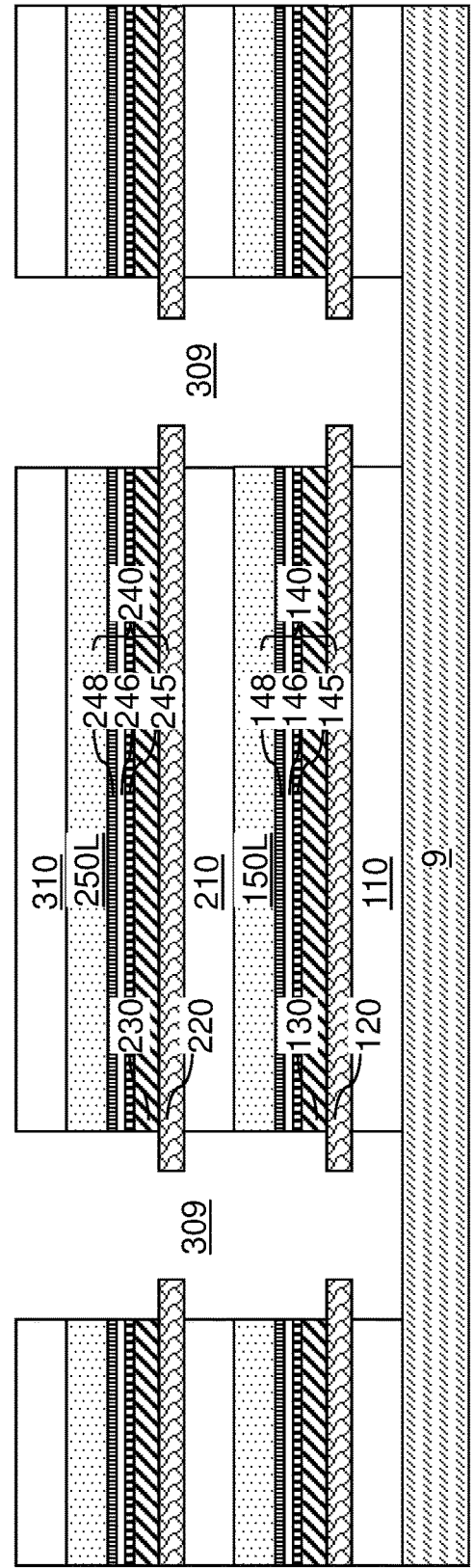
FIG. 3B
FIG. 3C

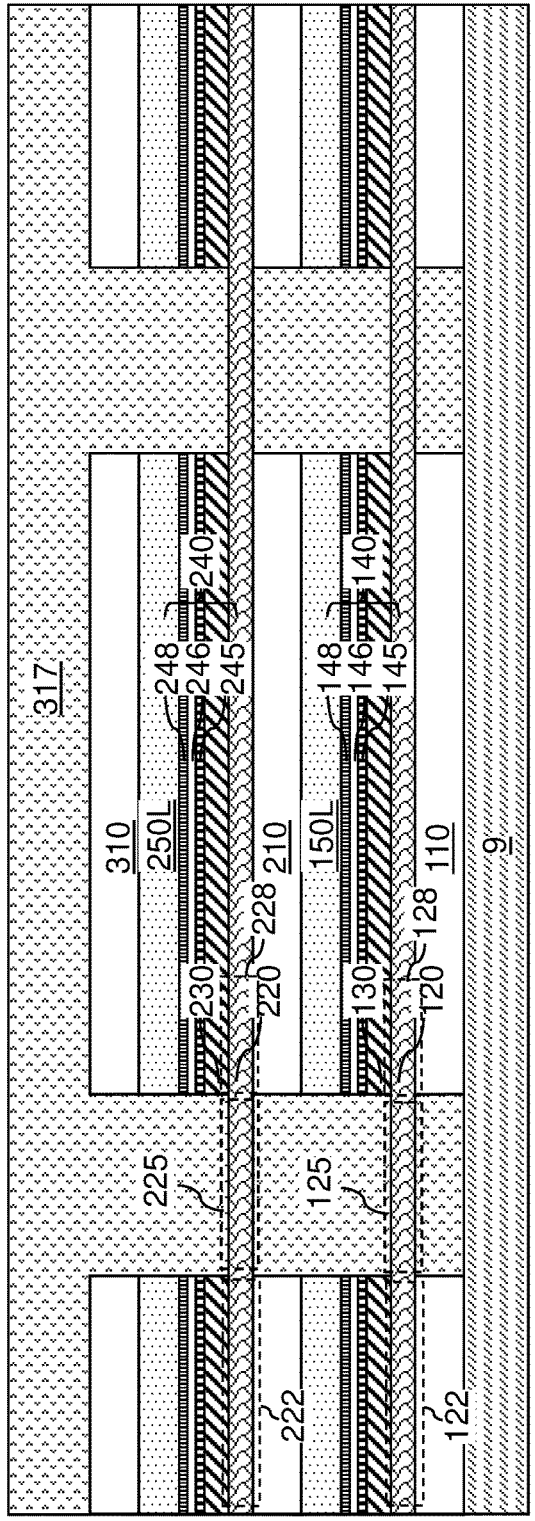
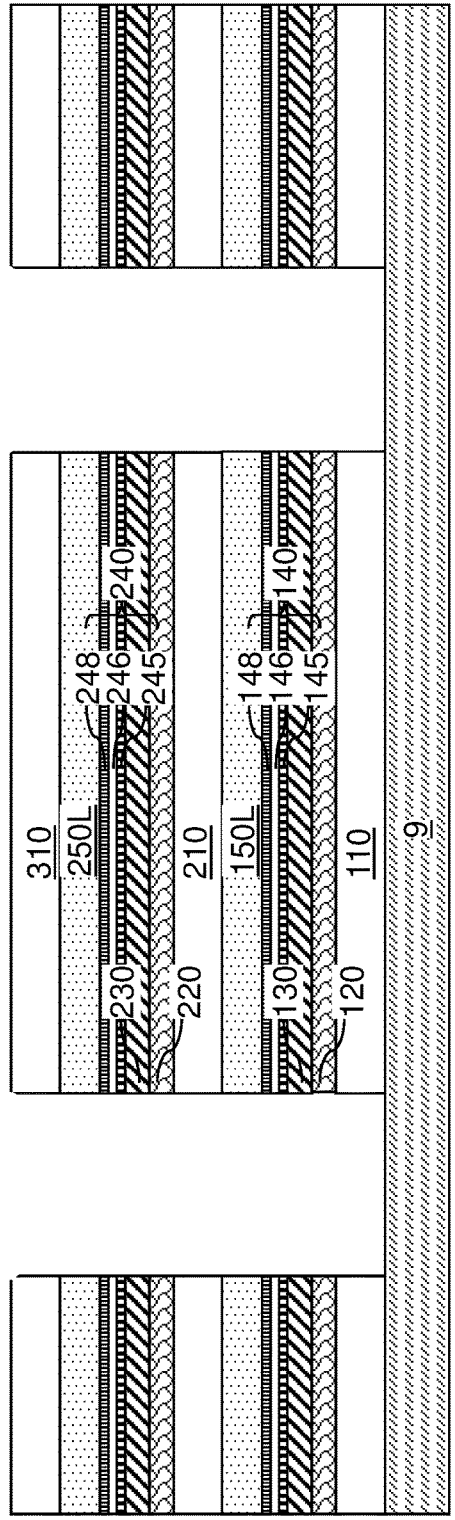

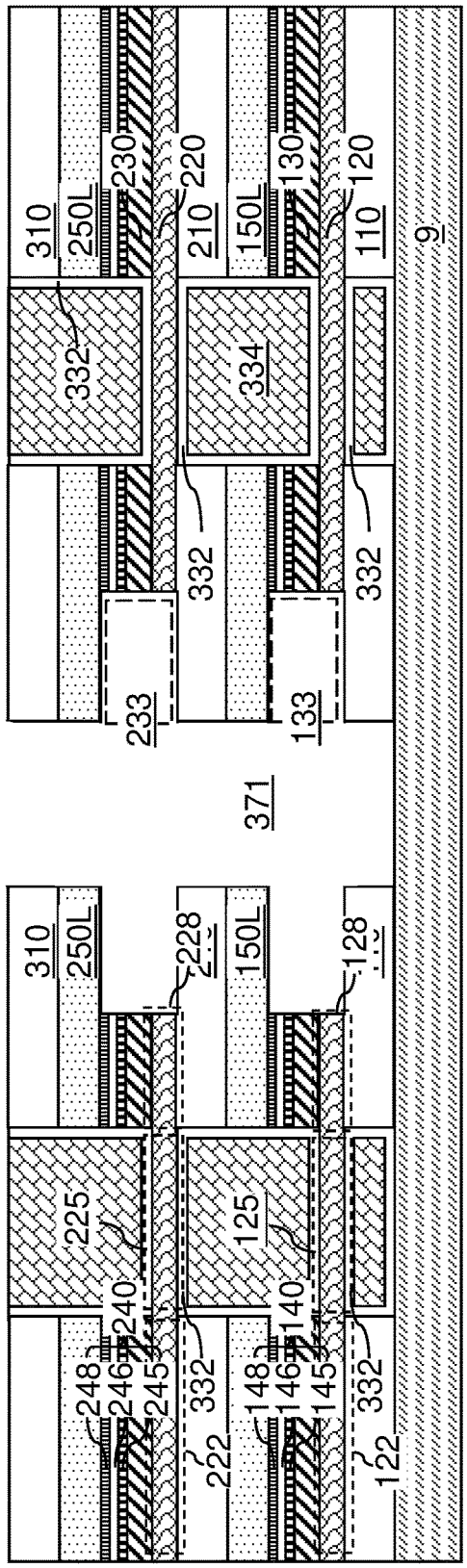
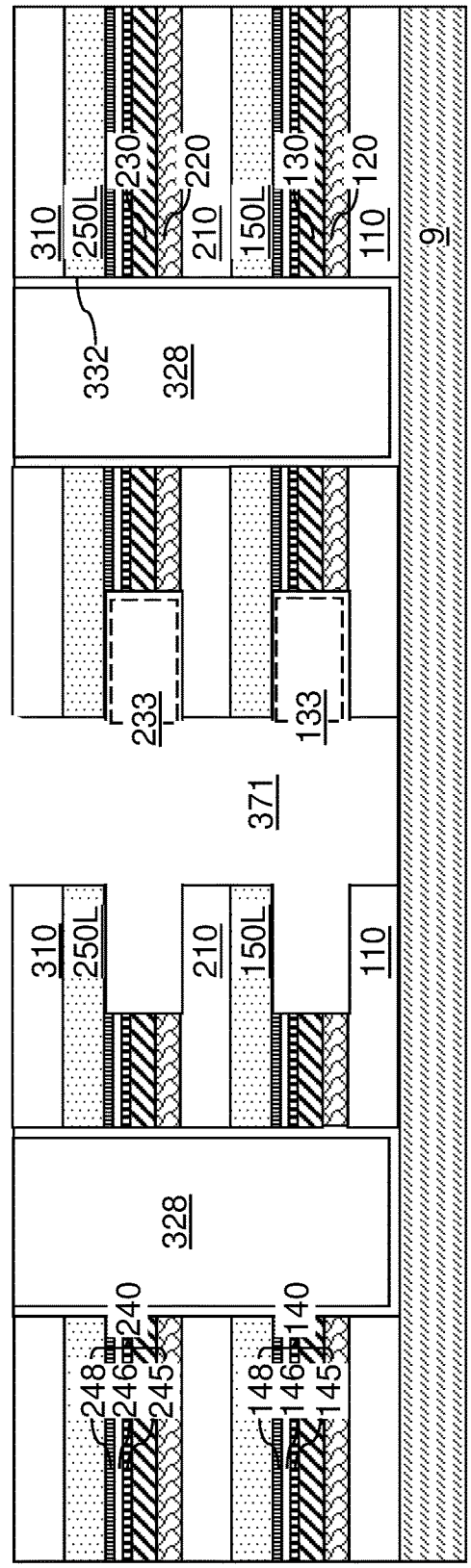
FIG. 9A
FIG. 9B

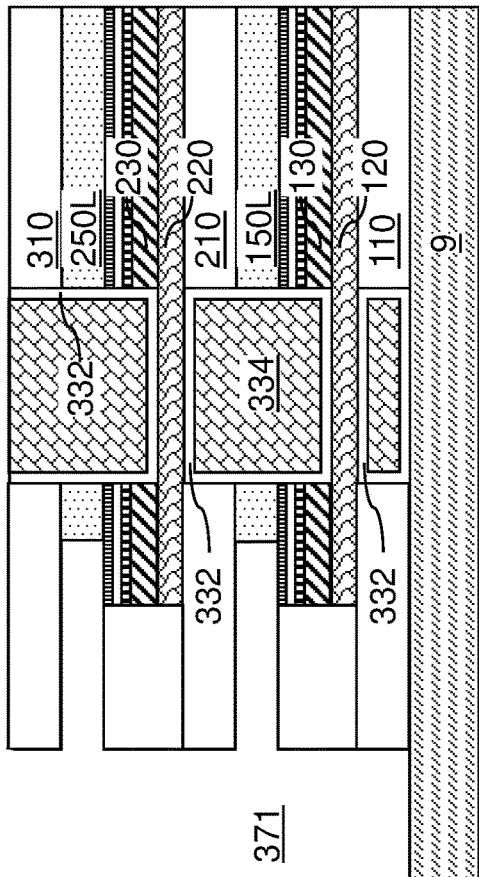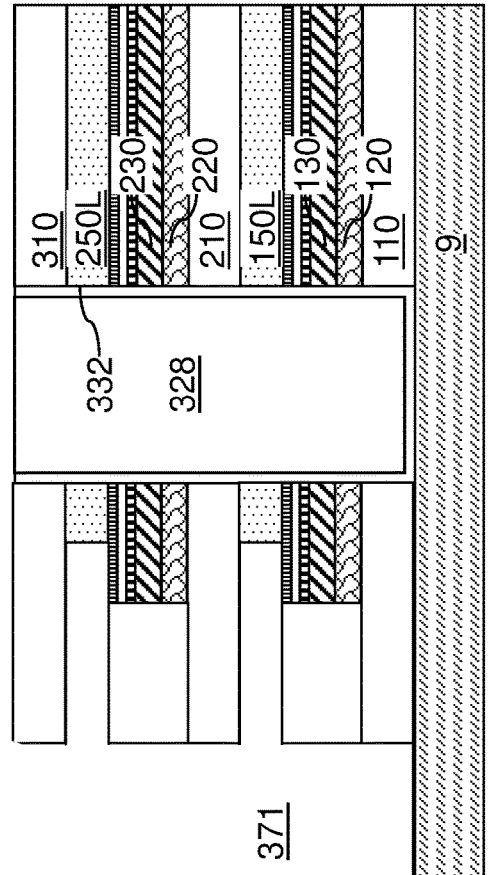
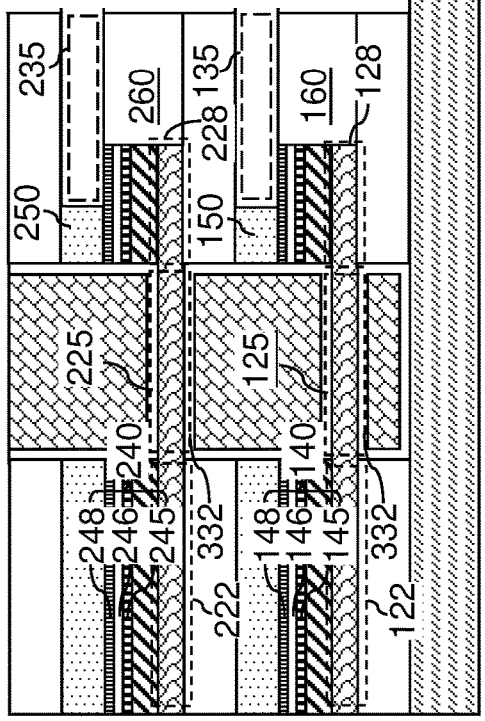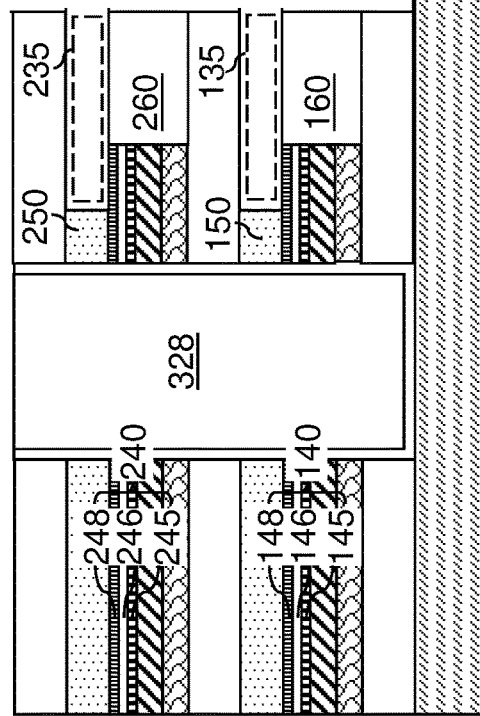
FIG. 11A
FIG. 11B

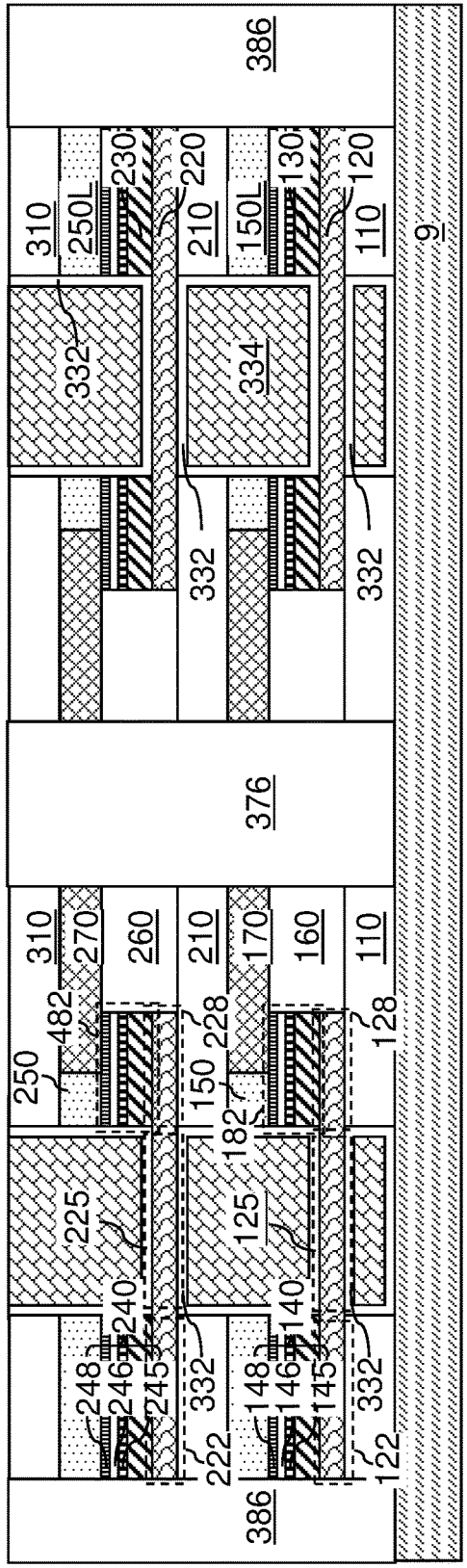
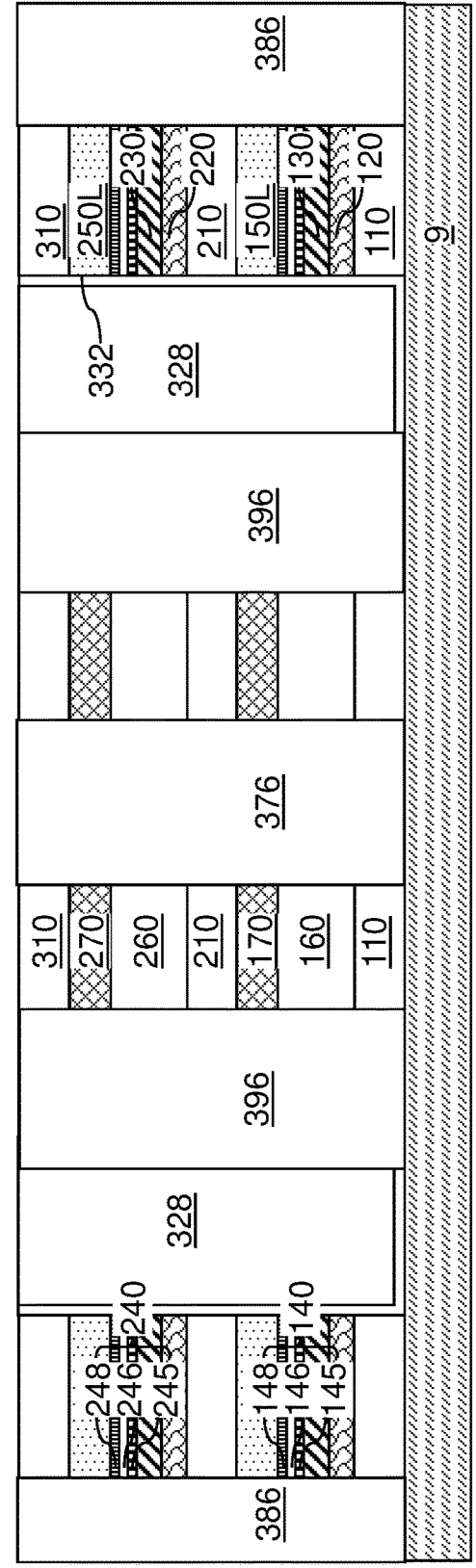
FIG. 14B
FIG. 14C

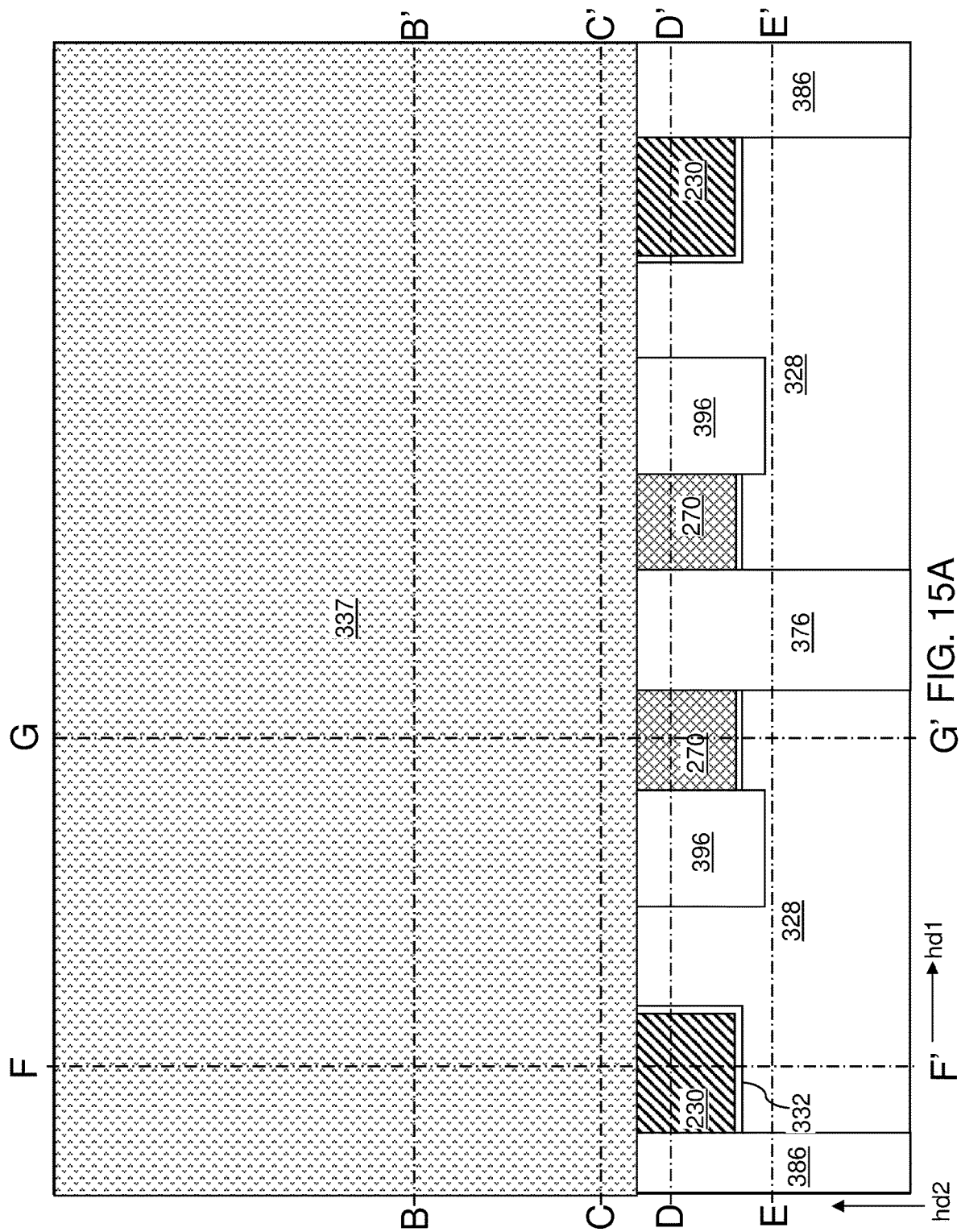

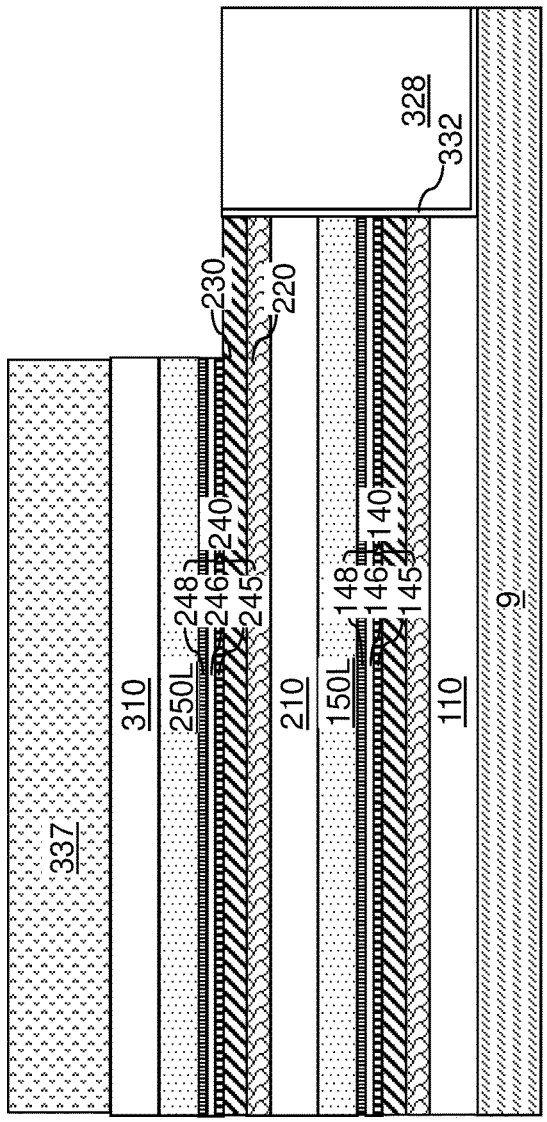
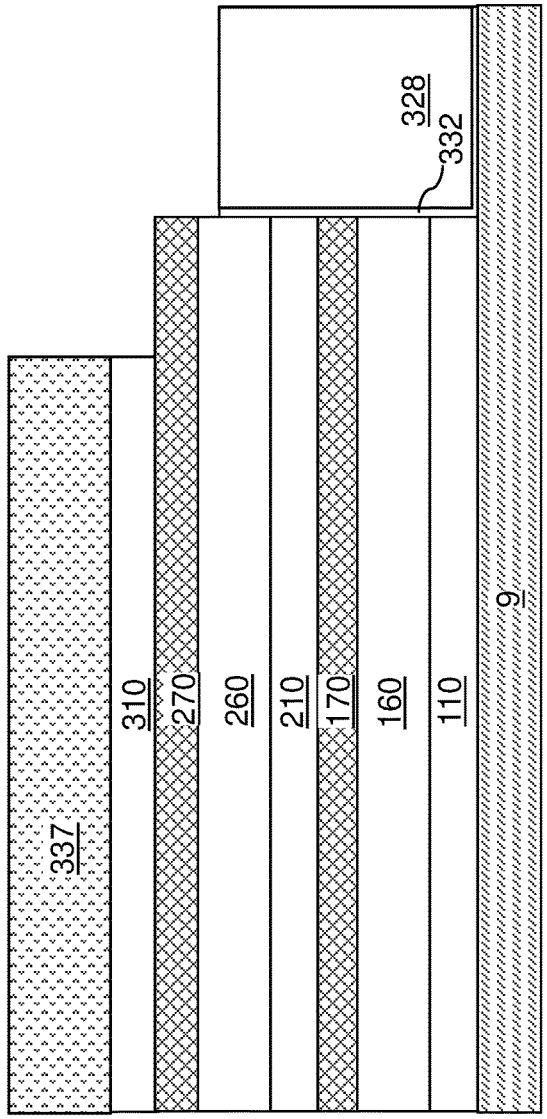
FIG. 15F
FIG. 15G

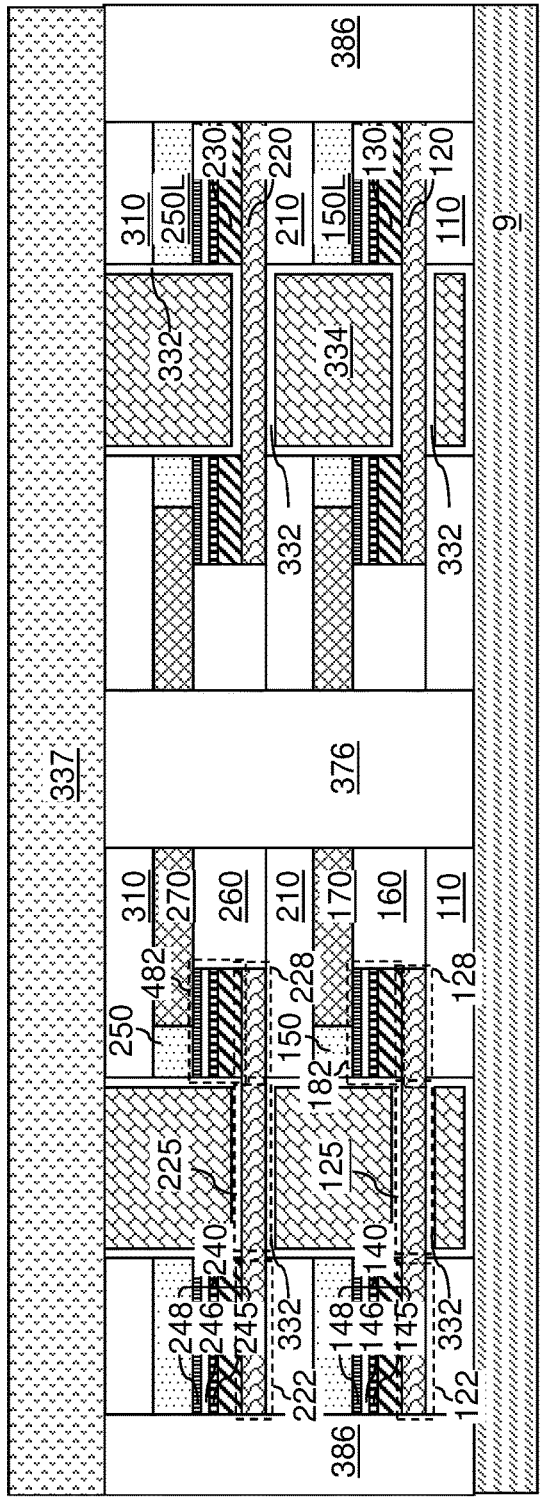
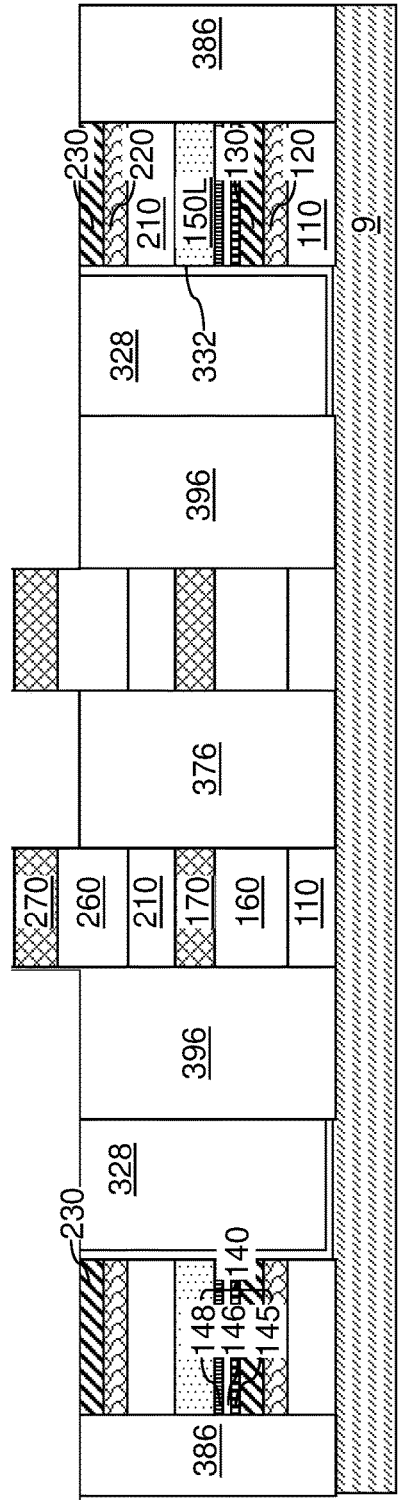
FIG. 16B
FIG. 16C

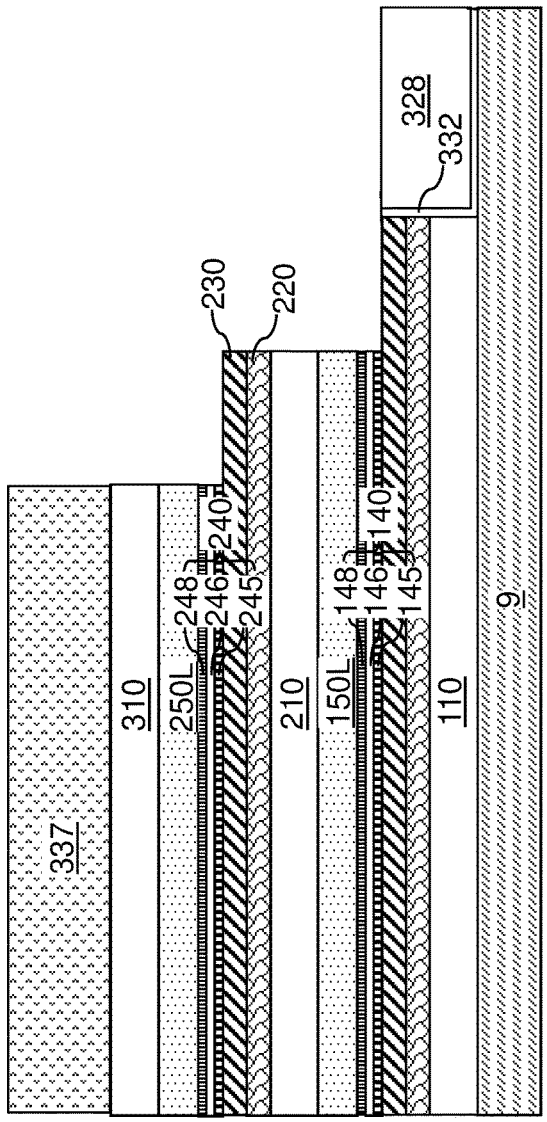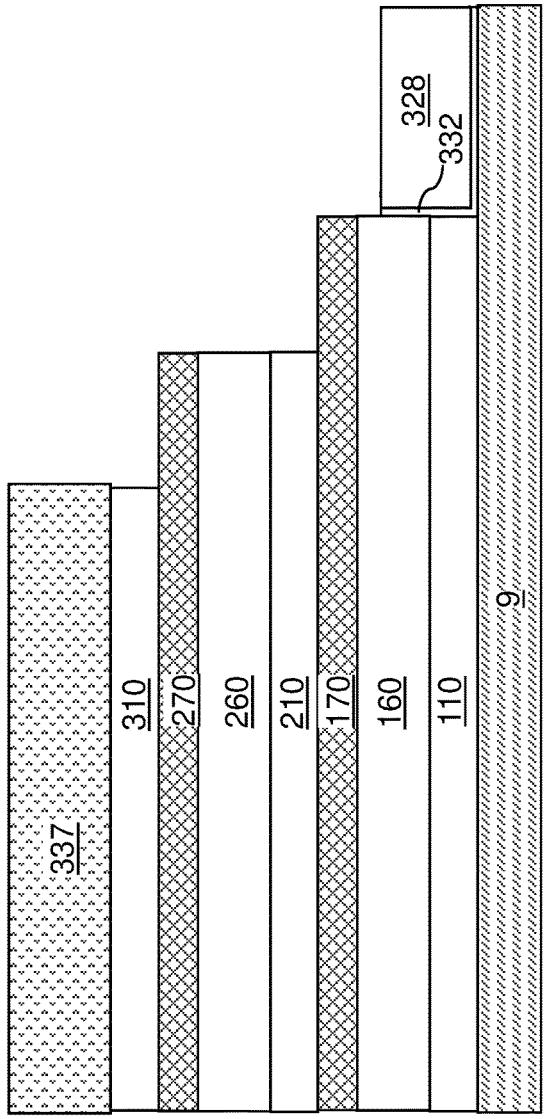

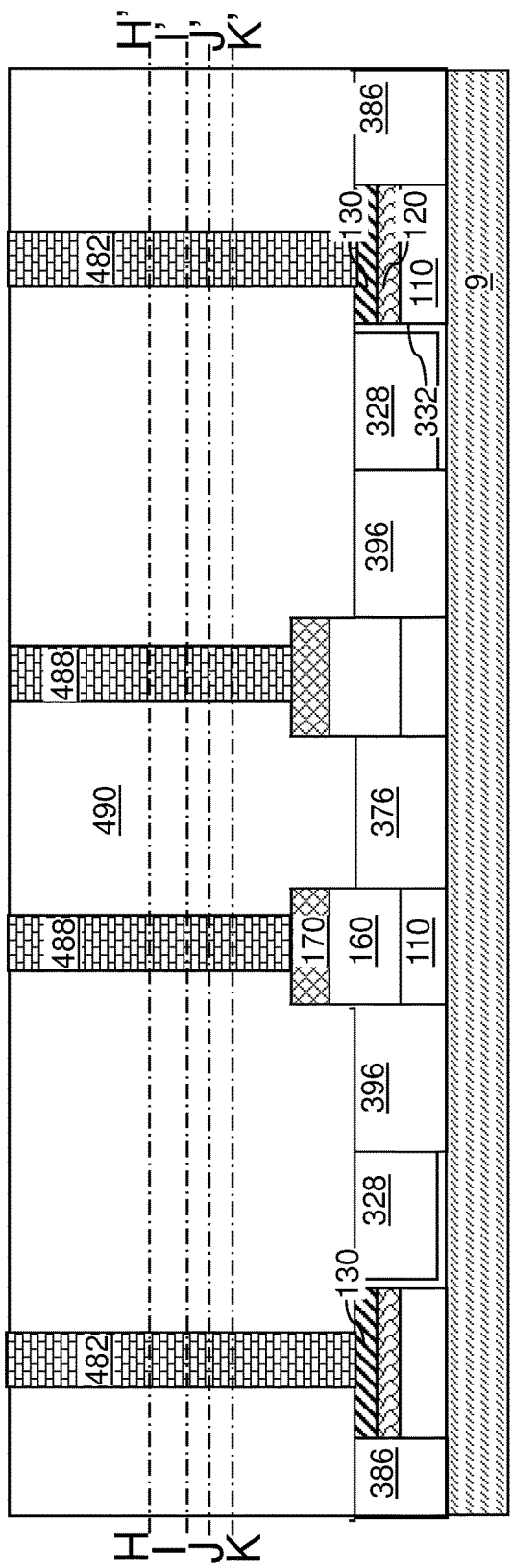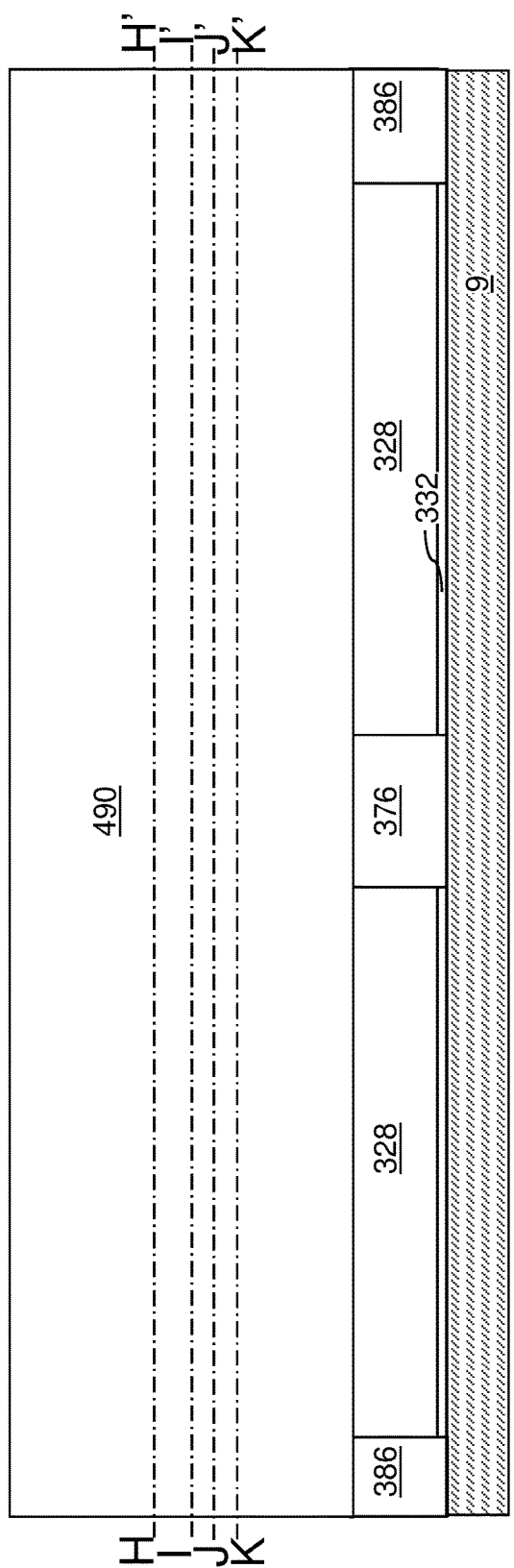

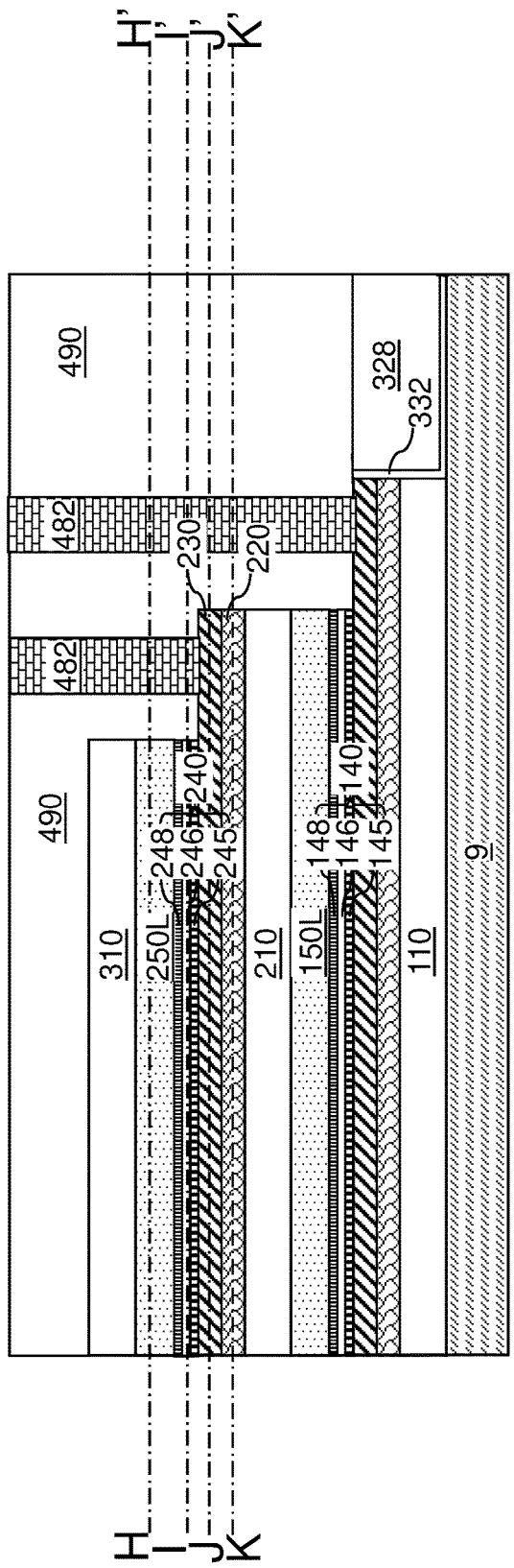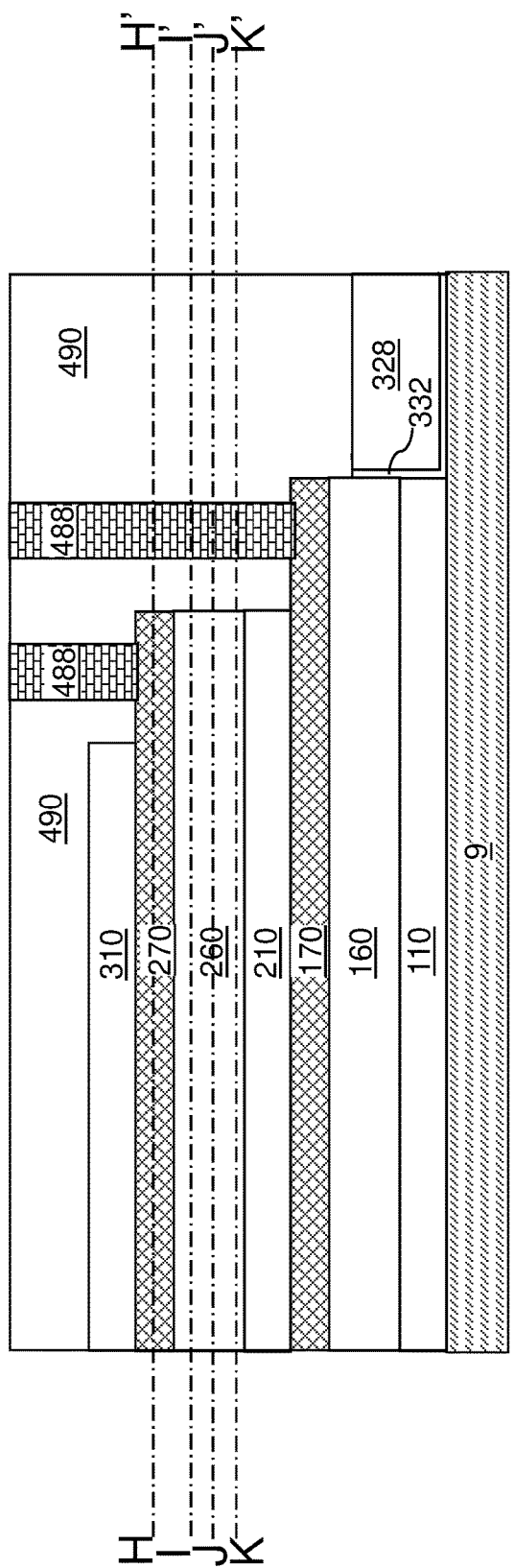
FIG. 17F
FIG. 17G

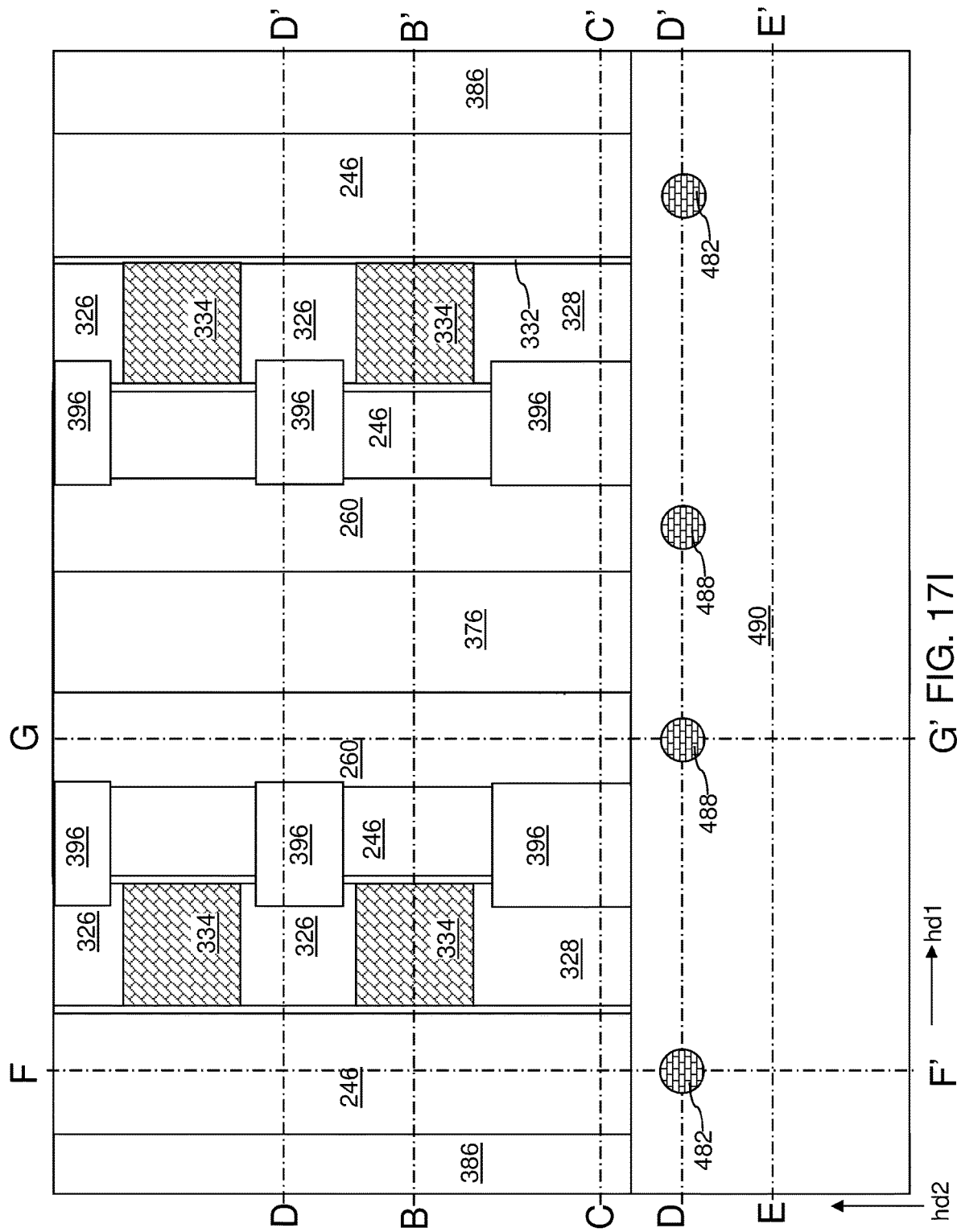

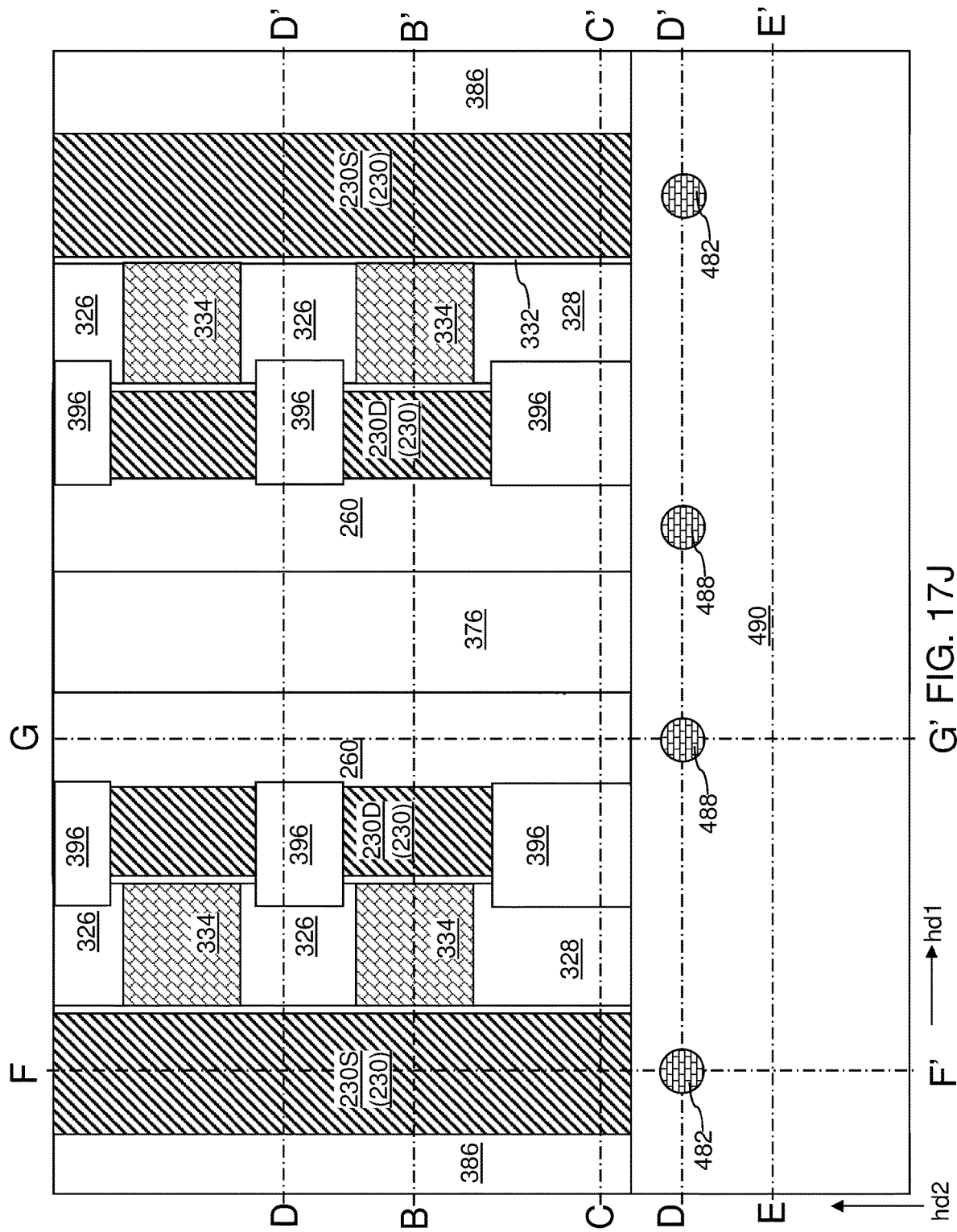

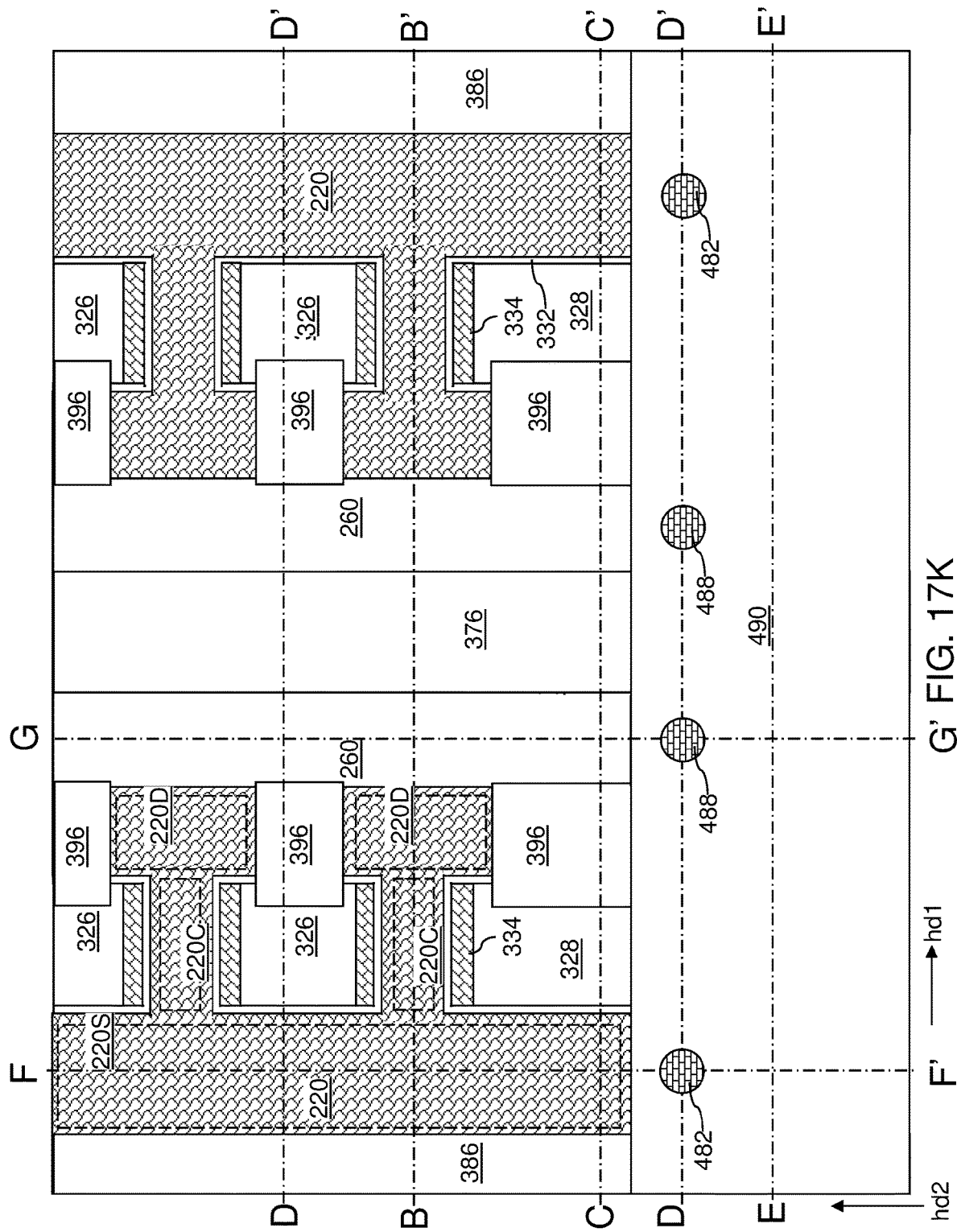

MULTI-LEVEL MAGNETIC TUNNEL JUNCTION NOR DEVICE WITH WRAP-AROUND GATE ELECTRODES AND METHODS FOR FORMING THE SAME

RELATED APPLICATION

This application is a continuation application of U.S. application Ser. No. 17/748,095 filed on May 19, 2022, which is a continuation application of U.S. application Ser. No. 16/909,080 filed on Jun. 23, 2020 and issued as U.S. patent Ser. No. 11/355,551 B2 on Jun. 7, 2022, the entire contents of all of which are incorporated herein by reference for all purposes.

BACKGROUND

The present disclosure is directed to semiconductor devices, and specifically to a multi-level magnetic tunnel junction NOR device with wrap-around gate electrodes and methods of forming the same.

Semiconductor memory devices are widely used in modern electronic devices. Some semiconductor memory devices use memory cells including a respective magnetic tunnel junction. Each magnetic tunnel junction memory cell may be controlled by a respective field effect transistor. However, the size of a field effect transistor driving a magnetic tunnel junction is significantly larger than the size of the magnetic tunnel junction. Thus, scaling of a one-transistor one-junction configuration for a magnetic tunnel junction memory device is limited by the ability to scale a field effect transistor that may provide sufficient programming current to a magnetic tunnel junction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of an exemplary structure after formation of a vertical stack including multiple instances of a unit layer stack that includes an insulating material layer, a semiconductor material layer, a metallic material layer, a magnetic tunnel junction layer, and a dielectric spacer layer according to an embodiment of the present disclosure.

FIG. 1B is a vertical cross-sectional view of the exemplary structure along the vertical plane B-B' of FIG. 1A.

FIG. 3B is a vertical cross-sectional view of the exemplary structure along the vertical plane B-B' of FIG. 3A.

FIG. 3C is a vertical cross-sectional view of the exemplary structure along the vertical plane C-C' of FIG. 3A.

FIG. 4B is a vertical cross-sectional view of the exemplary structure along the vertical plane B-B' of FIG. 4A.

FIG. 4C is a vertical cross-sectional view of the exemplary structure along the vertical plane C-C' of FIG. 4A.

FIG. 9A is a vertical cross-sectional view of the exemplary structure after formation of first lateral recesses according to an embodiment of the present disclosure.

FIG. 9B is another vertical cross-sectional view of the exemplary structure of FIG. 9A.

FIG. 11A is a vertical cross-sectional view of the exemplary structure after formation of second lateral recesses according to an embodiment of the present disclosure.

FIG. 11B is another vertical cross-sectional view of the exemplary structure of FIG. 11A.

FIG. 14B is a vertical cross-sectional view of the exemplary structure along the vertical plane B-B' of FIG. 14A.

FIG. 14C is a vertical cross-sectional view of the exemplary structure along the vertical plane C-C' of FIG. 14A.

FIG. 15A is a top-down view of the exemplary structure after formation of in-process stepped surfaces using a trimmable mask layer and an anisotropic etch process according to an embodiment of the present disclosure.

FIG. 15F is a vertical cross-sectional view of the exemplary structure along the vertical plane F-F' of FIG. 15A.

FIG. 15G is a vertical cross-sectional view of the exemplary structure along the vertical plane G-G' of FIG. 15A.

FIG. 16B is a vertical cross-sectional view of the exemplary structure along the vertical plane B-B' of FIG. 16A.

FIG. 16C is a vertical cross-sectional view of the exemplary structure along the vertical plane C-C' of FIG. 16A.

FIG. 16F is a vertical cross-sectional view of the exemplary structure along the vertical plane F-F' of FIG. 16A.

FIG. 16G is a vertical cross-sectional view of the exemplary structure along the vertical plane G-G' of FIG. 16A.

FIG. 17D is a vertical cross-sectional view of the exemplary structure along the vertical plane D-D' of FIG. 17A.

FIG. 17E is a vertical cross-sectional view of the exemplary structure along the vertical plane E-E' of FIG. 17A.

FIG. 17F is a vertical cross-sectional view of the exemplary structure along the vertical plane F-F' of FIG. 17A.

FIG. 17G is a vertical cross-sectional view of the exemplary structure along the vertical plane G-G' of FIG. 17A.

FIG. 17I is a horizontal cross-sectional view of the exemplary structure along the horizontal plane H-H' of FIGS. 17B-17G.

FIG. 17J is a horizontal cross-sectional view of the exemplary structure along the horizontal plane H-H' of FIGS. 17B-17G.

FIG. 17K is a horizontal cross-sectional view of the exemplary structure along the horizontal plane H-H' of FIGS. 17B-17G.

DETAILED DESCRIPTION

Figure 1C:
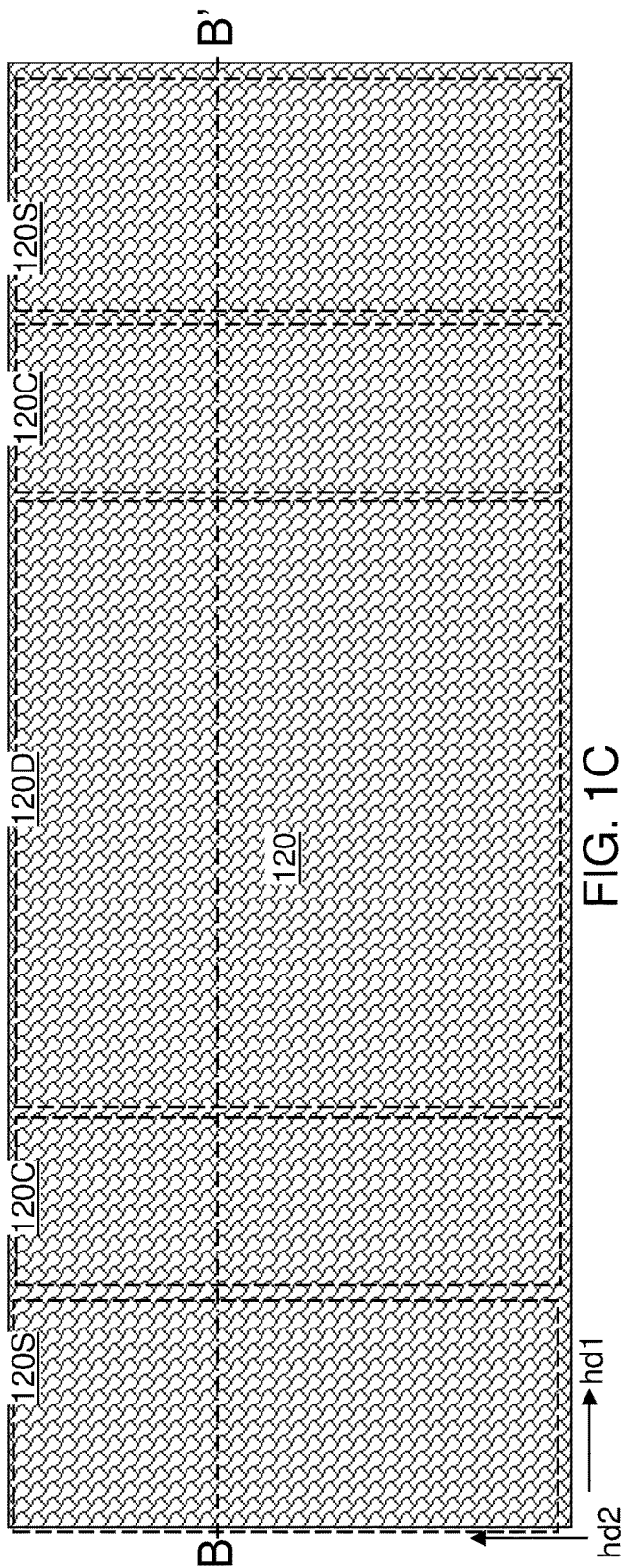
FIG. 1C is a horizontal cross-sectional view of the exemplary structure along the horizontal plane C-C' of FIG. 1B.
Figure 1D:
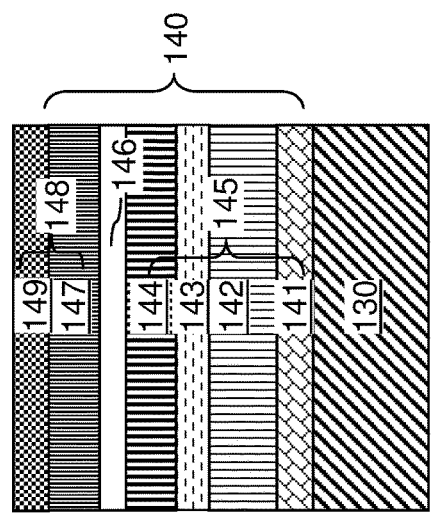
FIG. 1D is a magnified view of a portion of a magnetic tunnel junction layer of the exemplary structure of FIGS. 1A-1C.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to provide a magnetic tunnel junction memory device. The magnetic tunnel junction memory device may include a vertical stack of magnetic tunnel junction NOR strings. Each magnetic tunnel junction NOR string may include parallel connections of a field effect transistor and a magnetic tunnel junction memory cell. The field effect transistors within a magnetic tunnel junction NOR string may include a semiconductor material layer, which may include a semiconductor source region, a plurality of semiconductor channels, and a plurality of semiconductor drain regions. Each magnetic tunnel junction memory cell is connected to a semiconductor drain region of a respective field effect transistor. For example, each magnetic tunnel junction memory cell may have a respective first electrode that is located on a respective one of the plurality of semiconductor drain regions. A metallic bit line may contact each second electrode of the plurality of magnetic tunnel junction memory cells. The semiconductor channels of each field effect transistor in the vertical stack of magnetic tunnel junction NOR strings may be formed as a two-dimensional array of suspended silicon wires. The gate electrodes may vertically extend across multiple magnetic tunnel junction NOR strings such that overlying or underlying semiconductor channels are laterally surrounded by a same gate electrode. The gate electrodes provide a wrap-around configuration around a respective vertical stack of semiconductor channels. The vertical stack of magnetic tunnel junction NOR strings of embodiments of the present disclosure allow vertical stacking of semiconductor channels, thereby enabling vertical stacking of field effect transistors and increasing the memory device density per unit area. Further, the magnetic tunnel junction memory cells may be vertically stacked. Multiple instances of the vertical stack of magnetic tunnel junction NOR strings may be laterally repeated to provide a three-dimensional array of magnetic tunnel junction memory cells. The various features of the methods and structures of the present disclosure are now described with reference to accompanying drawings.

Referring to FIGS. 1A-1D, an exemplary structure according to an embodiment of the present disclosure is illustrated. A vertical stack including at least one instance of a unit layer stack that includes an insulating material layer (110 or 210), a semiconductor material layer (120 or 220), a metallic material layer (130 or 230), a magnetic tunnel junction layer (140 or 240), and a dielectric spacer layer (150L or 250L) may be formed over a top surface of a substrate 9, which may be a semiconductor substrate or an insulating substrate. A cap insulating material layer 310 may be formed over the at least one instance of the unit layer stack.

In the illustrated example, the vertical stack may include, from bottom to top, a first insulating material layer 110, a first semiconductor material layer 120, a first metallic material layer 130, a first magnetic tunnel junction layer 140, a first dielectric spacer layer 150L, a second insulating material layer 210, a second semiconductor material layer 220, a second metallic material layer 230, a second magnetic tunnel junction layer 240, a second dielectric spacer layer 250L, and a cap insulating material layer 310. While the present disclosure is described using an embodiment in which two instances of the unit layer stack are formed over the substrate 9, embodiments are expressly contemplated herein in which the total number of repetition of the unit layer stack is greater than two, such as a number in a range from 3 to 256. Alternatively, only a single instance of the unit layer stack may be formed over the substrate. Generally, at least one instance of the unit layer stack may be formed over the substrate 9. Further, while the present disclosure is described using an embodiment in which the sequence of the layers in each unit layer stack is from bottom to top, embodiments are expressly contemplated herein in which the sequence of layers in each unit layer stack is in reverse order, i.e., upside down.

Each instance of the insulating material layer (110, 210) and the cap insulating material layer 310 may include a first dielectric material, and each instance of the dielectric spacer layer (150L, 250L) includes a second dielectric material that may be etched selective to the first dielectric material. For example, the first dielectric material may be silicon oxide, and the second dielectric material may be silicon nitride. Alternatively, the first dielectric material may be silicon nitride, and the second dielectric material may be silicon oxide. Still further, the first dielectric material may be undoped silicate glass, and the second dielectric material may be a doped silicate glass material having an etch rate that is at least 10 times the etch rate of undoped silicate glass. In an illustrative example, the doped silicate glass material may include borosilicate glass or porous or non-porous organosilicate glass. Further still, the first dielectric material may be silicon oxide or silicon nitride, and the second dielectric material may include a dielectric polymer material that may be etched selective to the first dielectric material. Each instance of the insulating material layer (110, 210) and each instance of the dielectric spacer layer (150L, 250L) may be deposited by a respective chemical vapor deposition process. Each instance of the insulating material layer (110, 210) may have a thickness in a range from 10 nm to 100 nm, such as from 20 nm to 60 nm, although lesser and greater thicknesses may also be used. Each instance of the dielectric spacer layer (150L, 250L) may have a thickness in a range from 10 nm to 100 nm, such as from 20 nm to 60 nm, although lesser and greater thicknesses may also be used.

Each instance of the semiconductor material layer (120 or 220) includes a semiconductor material, which may be an elemental semiconductor material (such as silicon or germanium), a III-V compound semiconductor material (such as GaN, GaAs, etc.), a II-V compound semiconductor material (such as ZnO or an indium-gallium-zinc oxide (IGZO), or an organic semiconductor material. Each instance of the semiconductor material layer (120 or 220) may be deposited by a respective chemical vapor deposition process, a respective atomic layer deposition process, or a respective physical vapor deposition process. Each instance of the semiconductor material layer (120 or 220) may have a thickness in a range from 5 nm to 50 nm, such as from 10 nm to 30 nm, although lesser and greater thicknesses may also be used.

Each instance of the semiconductor material layer (120 or 220) may be suitably doped to provide doped semiconductor portions optimized for forming field effect transistors. Specifically, channel portions of each semiconductor material layer (120 or 220) may be doped with dopants of a first conductivity type to provide a semiconducting material having a doping of the first conductivity type and having electrical conductivity in the range from $1.0 \times 10^{-5}$ S/m to $1.0 \times 10^{2}$ S/m. For example, the first semiconductor material layer 120 may include first channel portions 120C having a doping of the first conductivity type and having electrical conductivity in the range from $1.0 \times 10^{-5}$ S/m to $1.0 \times 10^{2}$ S/m. Source portions and drain portions of each semiconductor material layer (120 or 220) may be doped with dopants of a second conductivity type to provide a semiconducting material having a doping of a second conductivity type and having electrical conductivity in the range from $1.0 \times 10^{4}$ S/m to $1.0 \times 10^{7}$ S/m. For example, the first semiconductor material layer 120 may include first source portions 120S and first drain portions 120D having a doping of the second conductivity type and having electrical conductivity in the range from $1.0 \times 10^{4}$ S/m to $1.0 \times 10^{7}$ S/m. Each of the semiconductor material layer (120 or 220) in the vertical stack may be doped with the same pattern of doping as the first semiconductor material layer 120. The semiconductor source regions, the semiconductor channels, and the semiconductor drain regions may be laterally arranged along a first horizontal direction hd1 such that a pair of p-n junctions laterally extend along a second horizontal direction hd2 that is perpendicular to the first horizontal direction hd1 within each area in which a vertical stack of magnetic tunnel junction NOR strings is to be subsequently formed.

Each instance of the metallic material layer (130 or 230) includes a metallic material such as titanium nitride, tantalum nitride, tungsten nitride, titanium, tantalum, tungsten, ruthenium, molybdenum, cobalt, copper, aluminum, or any other transition metal or a conductive metallic compound. Other suitable materials are within the contemplated scope of disclosure. Each instance of the metallic material layer (130 or 230) may be deposited by a respective physical vapor deposition process or by a respective chemical vapor deposition process. Each instance of the metallic material layer (130 or 230) may have a thickness in a range from 5 nm to 50 nm, such as from 10 nm to 30 nm, although lesser and greater thicknesses may also be used.

Each instance of a magnetic tunnel junction (MTJ) layer (140 or 240) includes a lower magnetic tunnel junction (MTJ) layer, a nonmagnetic tunnel barrier layer, and an upper magnetic tunnel junction (MTJ) layer. For example, the first magnetic tunnel junction layer 140 may include a first lower MTJ layer 145, a first nonmagnetic tunnel barrier layer 146, and a first upper MTJ layer 148. The second magnetic tunnel junction layer 240 may include a first lower MTJ layer 245, a first nonmagnetic tunnel barrier layer 246, and a first upper MTJ layer 248.

In one embodiment, each lower MTJ layer may include a respective layer stack of a metallic seed layer, a hard ferromagnetic layer, an antiferromagnetic coupling layer, and a reference layer, and each upper MTJ layer may include a free layer and a capping layer. Alternatively, in another embodiment, each lower MTJ layer may include a capping layer (which functions as a seed layer) and a free layer, and each upper MTJ layer may include a respective layer stack of a reference layer, an antiferromagnetic coupling layer, and a hard ferromagnetic layer. In other words, the free layer may be located within the lower MTJ layer and the reference layer may be located within the upper MTJ layer, or the free layer may be located within the upper MTJ layer and the reference layer may be located within the lower MTJ layer. Each contiguous combination of a reference layer, a nonmagnetic tunnel barrier layer, and a free layer constitutes a magnetic tunnel junction.

For example, the first lower MTJ layer 145 may include a layer stack of a first metallic seed layer 141, a first hard ferromagnetic layer 142, a first antiferromagnetic coupling layer 143, and a first reference layer 144. Each combination of a hard ferromagnetic layer, an antiferromagnetic coupling layer, and a reference layer constitutes a synthetic antiferromagnet (SAF) structure that provides stabilized antiferromagnetic coupling between the hard ferromagnetic layer and the reference layer. For example, the combination of the first hard ferromagnetic layer 142, the first antiferromagnetic coupling layer 143, and the first reference layer 144 constitutes a first SAF structure.

Each metallic seed layer, such as the first metallic seed layer 141, includes a polycrystalline metallic material that may initiate preferential grain growth for subsequently material layers in order to provide preferred magnetization directions for ferromagnetic material layers. Each metallic seed layer may include a material such as Ni, Cr, NiCr, Hf, Ru, Pt, or PtMn. Other suitable materials within the contemplated scope of disclosure may also be used. Each metallic seed layer may be deposited, for example, by physical vapor deposition, and may have a thickness in a range from 1 nm to 5 nm, although lesser and greater thicknesses may also be used.

Each hard ferromagnetic layer, such as the first hard ferromagnetic layer 142, includes a ferromagnetic material having positive perpendicular magnetic anisotropy (PMA) or negative PMA. Depending on the sign of the PMA of the deposited ferromagnetic material, the magnetization direction of each hard ferromagnetic layer may be along a vertical direction or within a horizontal plane. In one embodiment, each hard ferromagnetic layer may include a material such as CoFe, Co, Pt, CoPt, Pd, CoPd, Ni, CoNi, Ru, Ir, PtMn, IrMn, RhMn, FeMn, or OsMn; a bilayer stack of Co/Pt, Co/Pd or Co/Ni; or a combination or a multilayer stack thereof. Other suitable materials within the contemplated scope of disclosure may also be used. Each hard ferromagnetic layer may be deposited, for example, by physical vapor deposition, and may have a thickness in a range from 0.2 nm to 1.0 nm, although lesser and greater thicknesses may also be used.

Each antiferromagnetic coupling layer, such as the first antiferromagnetic coupling layer 143, may include an antiferromagnetic coupling material such as ruthenium, iridium, or chromium. Other suitable materials are within the contemplated scope of disclosure. Each antiferromagnetic coupling layer may be deposited, for example, by physical vapor deposition. The thickness of each antiferromagnetic coupling layer may be in a range from 0.3 nm to 1 nm, although lesser and greater thicknesses may also be used.

Each reference layer, such as the first reference layer 144, includes a ferromagnetic material that has a fixed magnetization direction that is antiferromagnetically coupled to the fixed magnetization direction of a respective hard ferromagnetic layer within a same SAF structure. Each reference layer may include a ferromagnetic material such as Ta, Mo W, CoFeB, FeB, Co, Fe, CoFe, CoFeTa, NiFe, CoPt, CoFeNi, etc. Other suitable materials are within the contemplated scope of disclosure. Each reference layer may be deposited, for example, by physical vapor deposition, and may have a thickness in a range from 0.2 nm to 0.8 nm, although lesser and greater thicknesses may also be used.

Each nonmagnetic tunnel barrier layer, such as the first nonmagnetic tunnel barrier layer 146, may include a tunneling barrier material, which may be an electrically insulating material having a thickness that allows electron tunneling. For example, each nonmagnetic tunnel barrier layer may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$) Other suitable materials within the contemplated scope of disclosure may also be used. Each nonmagnetic tunnel barrier layer may be deposited by physical vapor deposition. The thickness of each nonmagnetic tunnel barrier layer may be 0.7 nm to 1.3 nm, although lesser and greater thicknesses may also be used.

Each upper MTJ layer, such as the first upper MTJ layer 148, includes a respective free layer and a respective capping layer. For example, the first upper MTJ layer 148 may include a first free layer 147 and a first capping layer 149. Each free layer is a ferromagnetic layer having two preferred magnetic alignment directions between which the magnetization of the ferromagnetic layer is "free" to switch under suitable programming conditions.

Each free layer, such as the first free layer 147, includes a ferromagnetic material having two stable magnetization directions that are parallel or antiparallel to the magnetization direction of the reference layer within the same MTJ layer. Each free layer includes one or more hard ferromagnetic materials such as CoFeB, FeB, Co, Fe, CoFe, CoFeTa, NiFe, CoPt, CoFeNi, etc. Other suitable materials within the contemplated scope of disclosure may also be used. Each free layer may be deposited, for example, by physical vapor deposition. The thickness of the each free layer may be in a range from 1 nm to 6 nm, although lesser and greater thicknesses may also be used. The magnetization of the free layers and the reference layers may be axial, or may be in-plane depending on the magnetic anisotropy of the material of the reference layers and the free layers. The free layer may include a single ferromagnetic material, or may include a vertical stack of multiple materials of varying thicknesses that collectively exhibit ferromagnetic behavior.

Each capping layer, such as the first capping layer 149, includes a capping material such as Be, Mg, Al, Ti, Ta, W, Ge, Pt, Ru, Cu, Mo, Zr, Nb, Cr, ZrN, TiN, MoN, magnesium oxide (MgO), aluminum oxide ($Al_2O_3$), aluminum nitride (AlN), aluminum oxynitride (AlON), hafnium oxide ($HfO_2$) and/or zirconium oxide ($ZrO_2$). Other suitable materials within the contemplated scope of disclosure may also be used. Each capping layer may be deposited, for example, by physical vapor deposition. The thickness of the each capping layer may be in a range from 0.5 nm to 2 nm, although lesser and greater thicknesses may also be used.

Figure 2A:
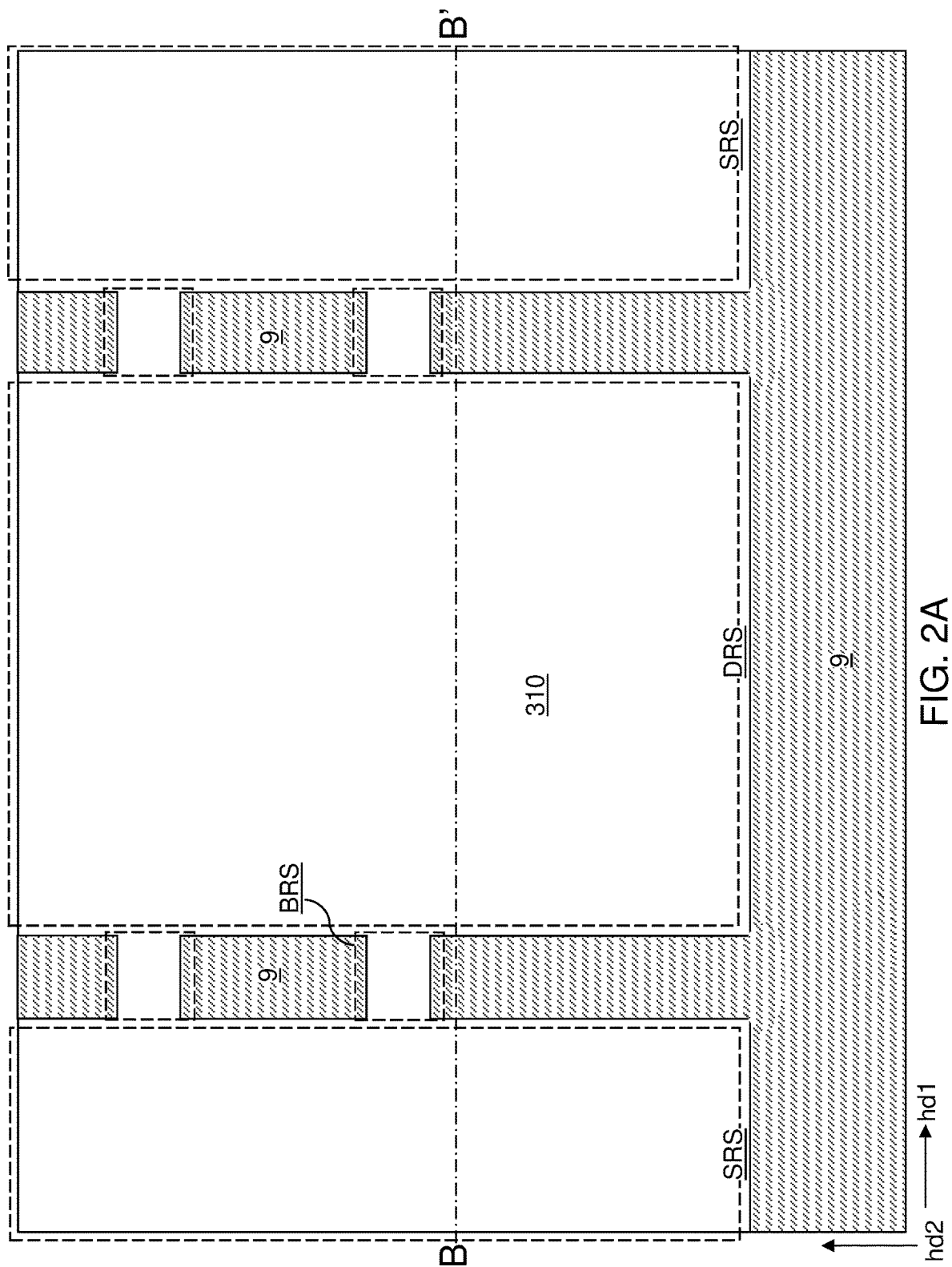
FIG. 2A is a top-down view of the exemplary structure after patterning the vertical stack into source region stack, drain region stacks, and bridge region stacks according to an embodiment of the present disclosure.
Figure 2B:
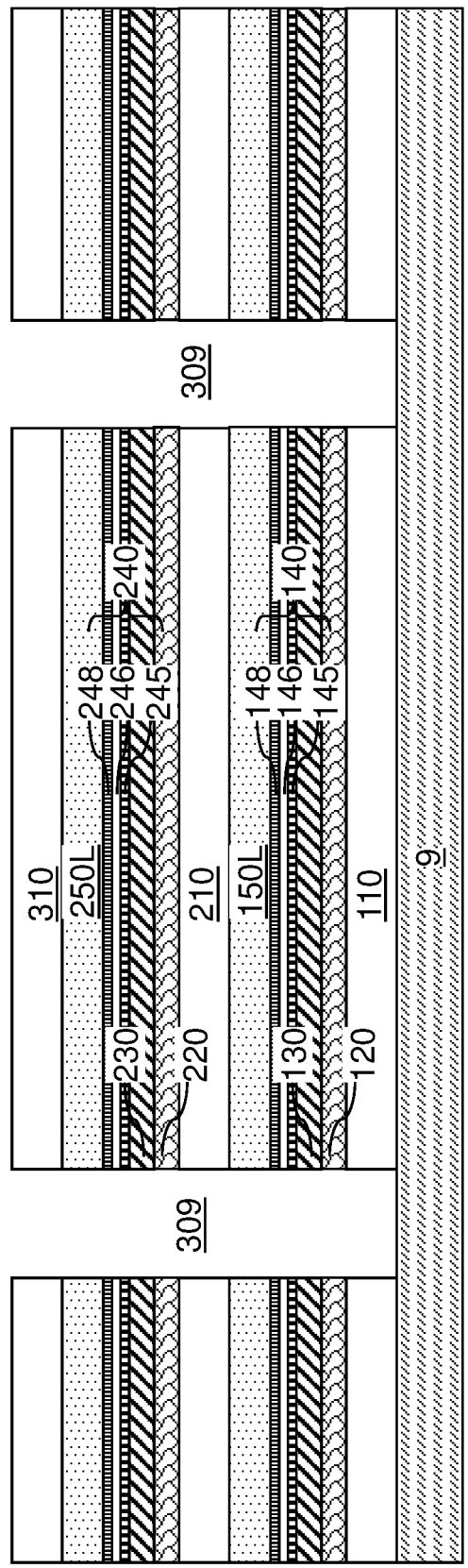
FIG. 2B is a vertical cross-sectional view of the exemplary structure along the vertical plane B-B' of FIG. 2A.

Referring to FIGS. 2A and 2B, a photoresist layer (not shown) may be applied over the vertical stack of the at least one instance of a unit layer stack that includes an insulating material layer (110, 210), a semiconductor material layer (120, 220), a metallic material layer (130, 230), a magnetic tunnel junction layer (140, 240), and a dielectric spacer layer (150L, 250L), and may be lithographically patterned to form a row of rectangular openings above the channel portions (such as the first channel portions 120C) of the semiconductor material layers (120, 220). Further, the source portions and the drain portions of the semiconductor material layers (120, 220) may be covered with a respective rectangular patterned portion of the photoresist layer such that a periodic one-dimensional array of gate bridge regions between a laterally neighboring pair of a source portion and a drain portion is covered with the patterned photoresist layer. Each gate bridge region may have a rectangular shape. Thus, an array of rectangular openings in the photoresist layer laterally extends above each channel portion of the semiconductor material layers (120, 220).

An anisotropic etch may be performed to transfer the pattern in the photoresist layer through the vertical stack of the at least one instance of the unit layer stack. The vertical stack may be patterned such that each layer within the vertical stack may have vertically coincident sidewalls, i.e., sidewalls that are contained entirely within a vertical plane that includes other sidewalls of other layers within the vertical stack of the at least one instance of the unit layer stack. A source region stack SRS of patterned portions of the vertical stack may be formed within each area of source portions of the semiconductor material layers (120, 220) and peripheral regions of adjoining channel portions of the semiconductor material layers (120, 220). A drain region stack DRS of patterned portions of the vertical stack may be formed within each area of drain portions of the semiconductor material layers (120, 220) and peripheral regions of adjoining channel portions of the semiconductor material layers (120, 220). A row of bridge region stacks BRS of patterned portions of the vertical stack may be formed within each area of channel portions of the semiconductor material layers (120, 220). Each bridge regions stack BRS may be laterally spaced from an adjacent source region stack SRS and from an adjacent drain region stack DRS by a lateral spacing of about one half of the width of the bridge region stacks BRS along the second horizontal direction hd2. Trenches 309 interlaced with the bridge regions stacks BRS laterally separate each neighboring pair of a source region stack SRS and a drain region stack DRS.

Each bridge region stack BRS may have a rectangular shape, and may have a length in a range from 20 nm to 200 nm along the first horizontal direction hd1, and may have a width in a range from 20 nm to 200 nm along the second horizontal direction hd2. The number of bridge region stacks BRS between a neighboring pair of a source region stack SRS and a drain region stack DRS may be the same as the number of semiconductor channels to be subsequently formed in the same area, and may be in a range from 2 to 1,024, although a greater number may also be used. The total number of semiconductor channels to be formed between a neighboring pair of a source region stack SRS and a drain region stack DRS can be less than the ratio of the tunneling magnetoresistance of a high resistance state of a magnetic tunnel junction memory cell in order to maintain the signal to noise ratio of a sense circuit of the magnetic tunnel junction NOR string of the present disclosure. The number of bridge region stacks BRS for a magnetic tunnel junction device may be determined by the drive current required by the MTJ device. The bridge region stack BRS between a neighboring pair of a source region stack SRS and a drain region stack DRS may be arranged as a one-dimensional periodic array along the second horizontal direction hd2. The pitch of the one-dimensional periodic array of the bridge region stacks BRS may be in a range from 40 nm to 400 nm, although lesser and greater pitches may also be used.

Figure 3A:
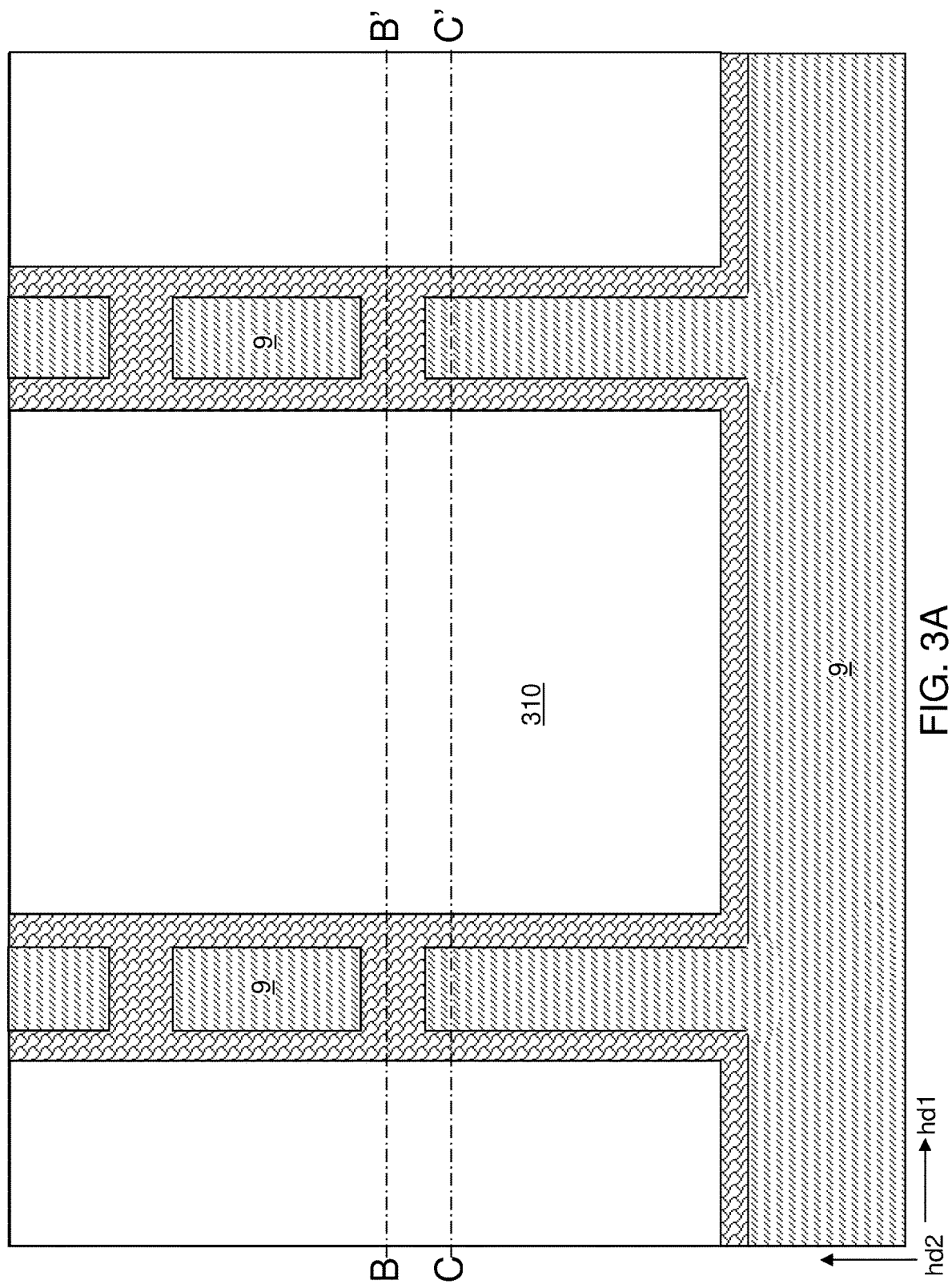
FIG. 3A is a top-down view of the exemplary structure after laterally recessing all layers other than semiconductor material layers according to an embodiment of the present disclosure.

Referring to FIGS. 3A-3C, a series of isotropic etch processes may be performed after the anisotropic etch process that forms the trenches 309. The series of isotropic etch processes laterally recess each layer within the vertical stack of the at least one instance of the unit layer stack except the semiconductor material layers (120, 220). Each isotropic etch process laterally etches at least one material within the vertical stack of the at least one instance of the unit layer stack selective to (i.e., without etching) the material of the semiconductor material layers (120, 220). For example, a wet etch using dilute hydrofluoric acid may be used to isotropically etch any silicon oxide material selective to silicon. A wet etch using an organic HF-containing etchant may be used to etch silicon nitride selective to silicon. Organic HF-containing etchants include, for example, a mixture of hydrofluoric acid and a polyol (such as ethylene glycol, propylene glycol, or a glycerol). A mixture of hydrofluoric acid and nitric acid may be used to etch metallic materials selective to silicon. Generally, any combination of isotropic etch processes may be performed to laterally recess each layer within the vertical stack of the at least one instance of the unit layer stack except the semiconductor material layers (120, 220) by a respective lateral etch distance that is greater than one half of the width of each bridge region stack BRS along the second horizontal direction hd2.

Each bridge portion of the semiconductor material layers (120, 220) located within the area of a respective bridge region stack BRS may be suspended between a pair of plate portions of a respective semiconductor material layer (120, 220). The sidewalls of all other layers within the vertical stack of the at least one instance of the unit layer stack except the semiconductor material layers (120, 220) are laterally recessed at least by one half of the width of each bridge region stack BRS along the second horizontal direction hd2. The sidewalls of layers other than the semiconductor material layers (120, 220) may, or may not, be vertically coincident to one another. While the present disclosure is described using an embodiment in which the sidewalls of layers other than the semiconductor material layers (120, 220) are vertically coincident, embodiments are expressly contemplated herein in which the sidewalls of layers other than the semiconductor material layers (120, 220) are not vertically coincident, i.e., not located within a same vertical plane.

Figure 4A:
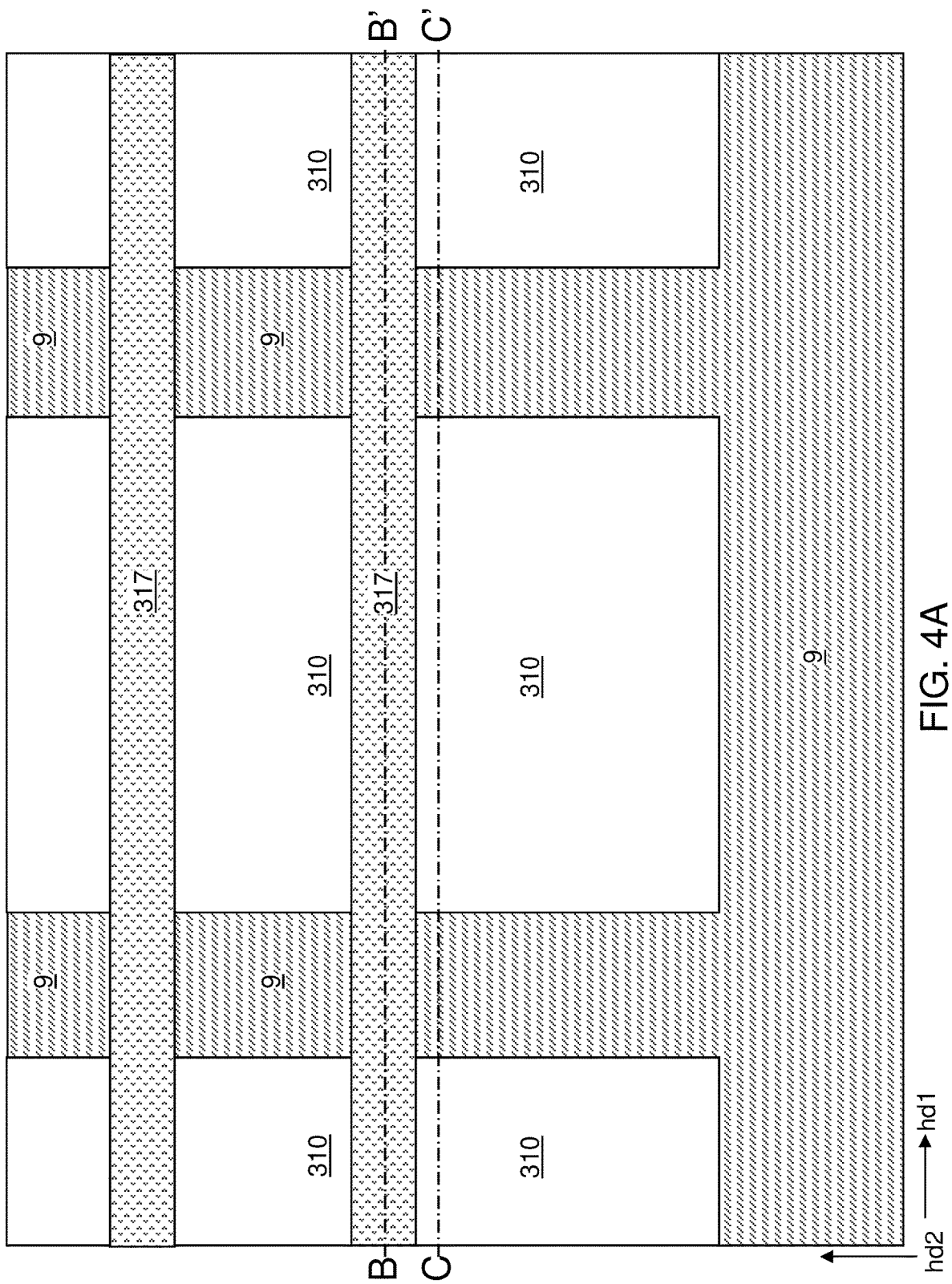
FIG. 4A is a top-down view of the exemplary structure after anisotropically etching peripheral fin portions of the semiconductor material layers using a patterned photoresist layer as an etch mask according to an embodiment of the present disclosure.

Referring to FIGS. 4A-4C, a photoresist layer 317 may be applied over the exemplary structure, and may be lithographically patterned in the pattern of strips that laterally extend along the first horizontal direction hd1. The patterned photoresist layer 317 may cover all areas in which semiconductor channels (125, 225) are to be formed, and may not cover areas from which laterally protruding portions of the semiconductor material layers (120, 220) (other than the semiconductor channels (125, 225) are present. Each strip of the photoresist layer 317 may overlie a respective column of suspended bridge portions of the semiconductor material layers (120, 220). The width of each strip of the patterned photoresist layer 317 may be the target width of the semiconductor channels to be subsequently formed, which may be in a range from 15 nm to 150 nm, although lesser and greater channel widths may also be used. An anisotropic etch process may be performed to remove unmasked portions of the semiconductor material layers (120, 220). The photoresist layer may be subsequently removed, for example, by ashing.

Suspended portions of the semiconductor material layers (120, 220) constitute semiconductor channels (125, 225), which may be arranged as a three-dimensional array. Each row of semiconductor channels (125, 225) arranged along the second horizontal direction hd2 may be patterned portions from a respective semiconductor material layer (120, 220), and may be located in an area between plate portions of the semiconductor material layers (120, 220). The semiconductor channels (125, 225) may have a doping of the first conductivity type, and the plate portions of the semiconductor material layers (120, 220) may have a doping of the second conductivity type that is the opposite of the first conductivity type. The plate portions of the semiconductor material layers (120, 220) that are patterned from the source portions (such as the first source portions 120S) of the semiconductor material layers (120, 220) constitute semiconductor source regions (122, 222). The plate portions of the semiconductor material layers (120, 220) that are patterned from the drain portions (such as the first drain portions 120D) of the semiconductor material layers (120, 220) constitute semiconductor drain regions (128, 228). The semiconductor channels (125, 225) may include, for example, first semiconductor channels 125 patterned from the first semiconductor material layer 120 and second semiconductor channels 225 patterned from the second semiconductor material layer 220. The semiconductor source regions (122, 222) may include, for example, first semiconductor source regions 122 patterned from the first semiconductor material layer 120 and second semiconductor source regions 222 patterned from the second semiconductor material layer 220. The semiconductor source regions (122, 222) may include, for example, first semiconductor drain regions 128 patterned from the first semiconductor material layer 120 and second semiconductor drain regions 228 patterned from the second semiconductor material layer 220.

Generally, the vertical stack of the at least one instance of the unit layer stack may be patterned to form a plurality of semiconductor channels (125, 225) that are suspended between a semiconductor source region (122, 222) and a semiconductor drain region (128, 228) from each instance of the semiconductor material layer (120, 220). Patterned portions of all layers other than each instance of the semiconductor material layer (120, 220) overlie, or underlie, the semiconductor source region (122, 222) or the semiconductor drain region (128, 228). Each patterned portion of each semiconductor material layer (120, 220) may include a semiconductor source region (122, 222), a plurality of semiconductor channels (125, 225), and a plurality of semiconductor drain regions (128, 228).

Figure 5A:
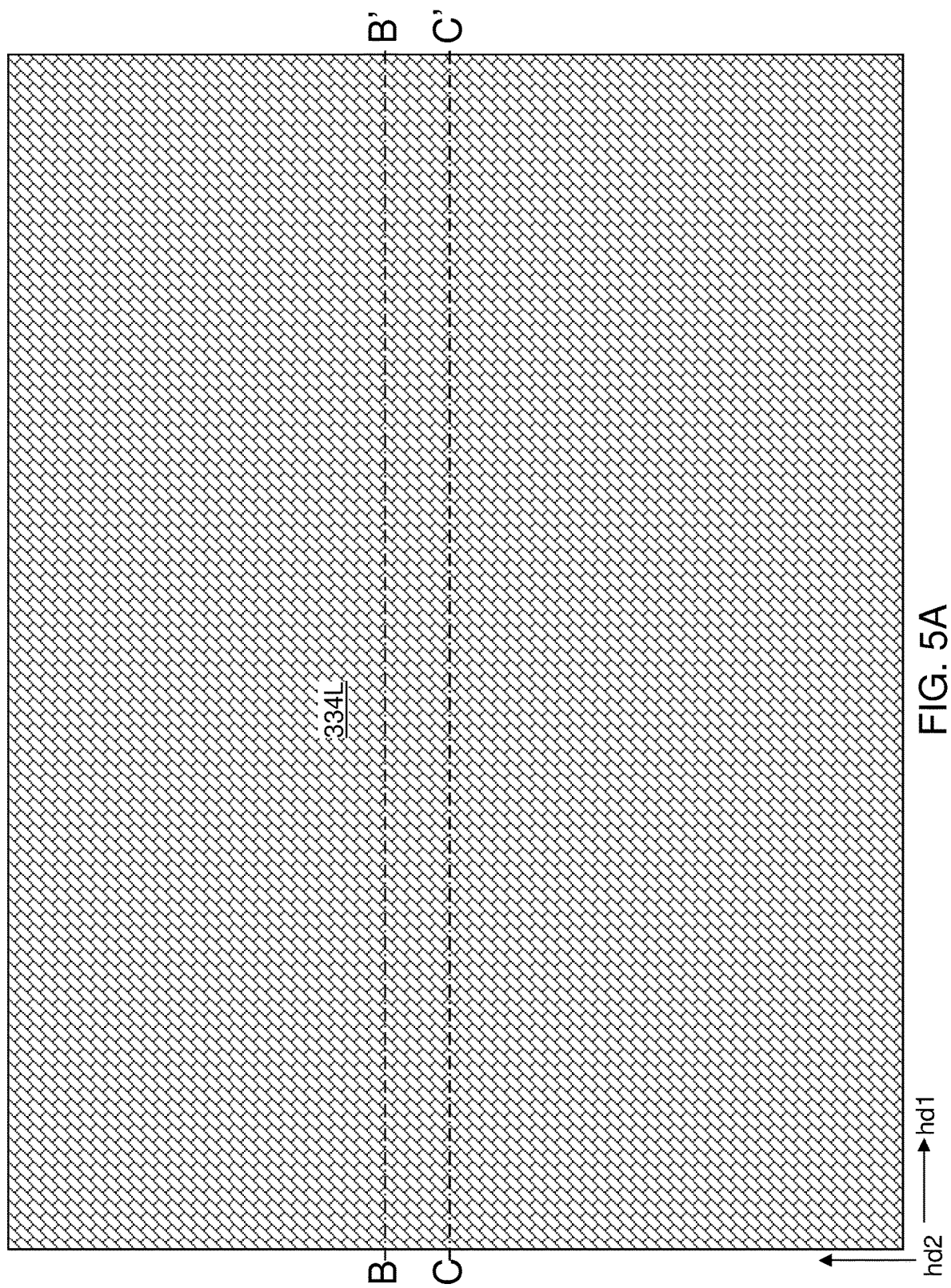
FIG. 5A is a top-down view of the exemplary structure after formation of a gate dielectric layer and a gate electrode material layer according to an embodiment of the present disclosure.
Figure 5B:
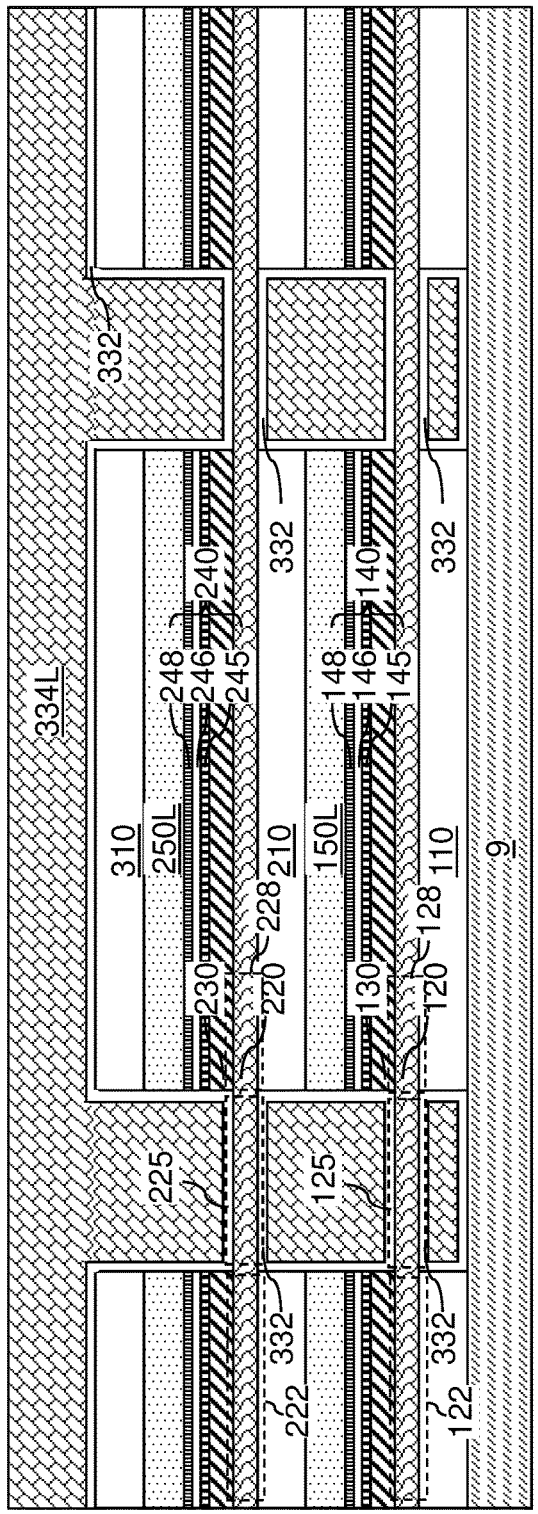
FIG. 5B is a vertical cross-sectional view of the exemplary structure along the vertical plane B-B' of FIG. 5A.
Figure 5C:
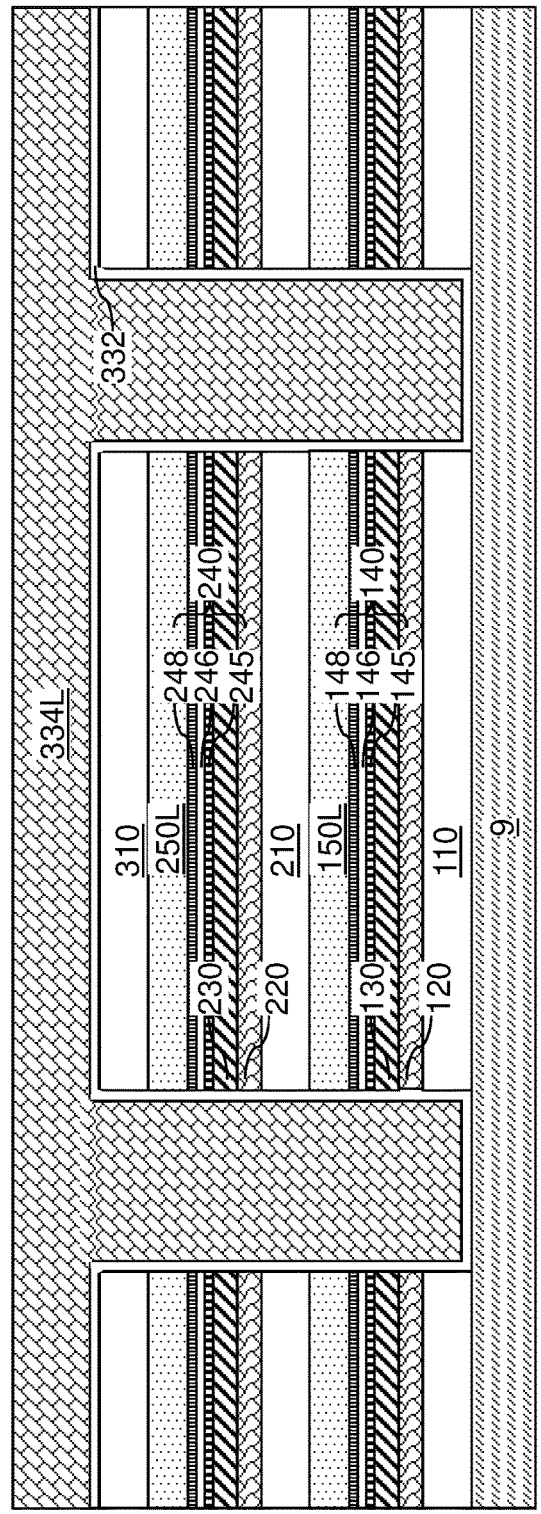
FIG. 5C is a vertical cross-sectional view of the exemplary structure along the vertical plane C-C' of FIG. 5A.
Figure 6A:
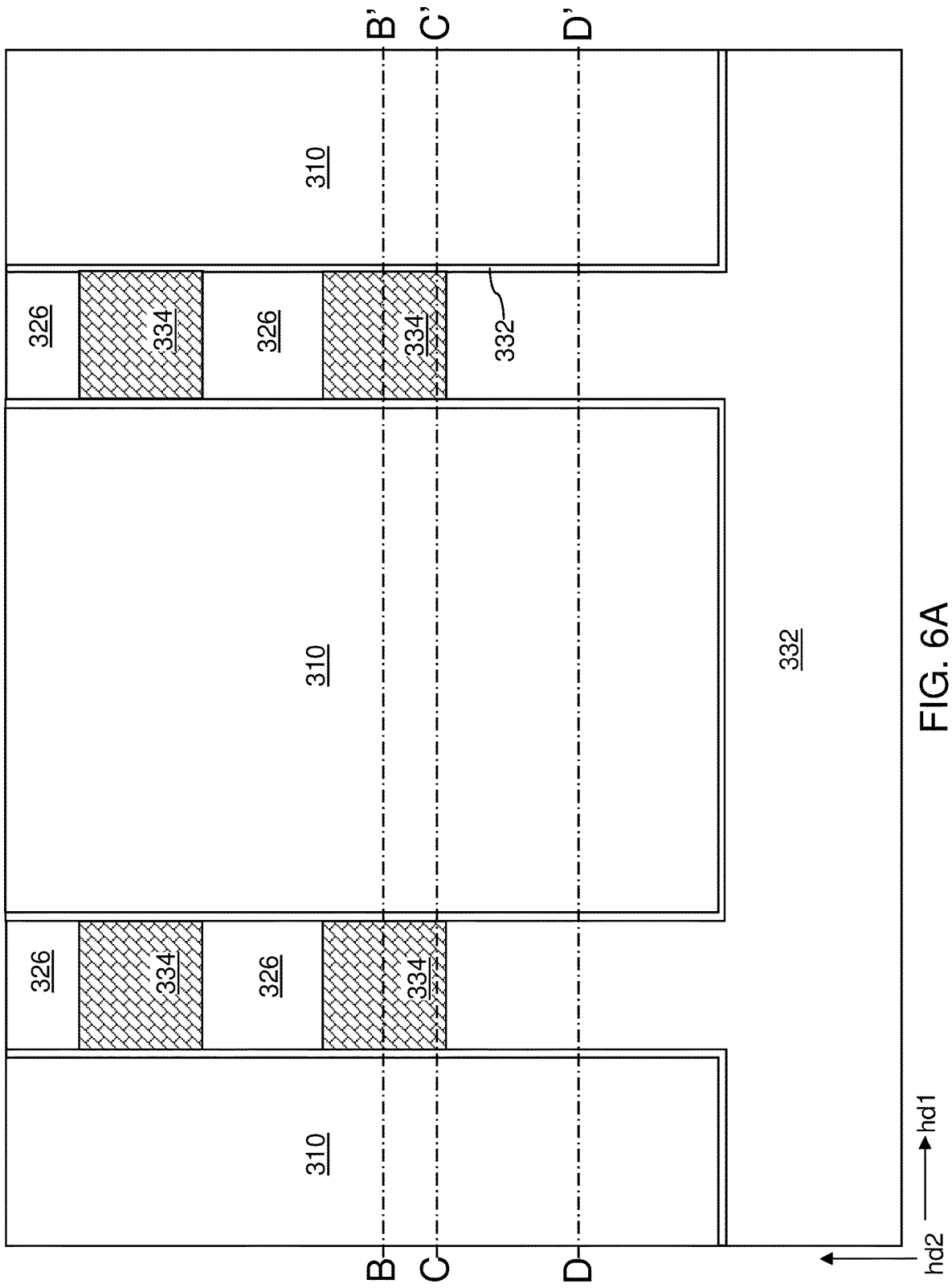
FIG. 6A is a top-down view of the exemplary structure after formation of gate electrodes according to an embodiment of the present disclosure.
Figure 6B:
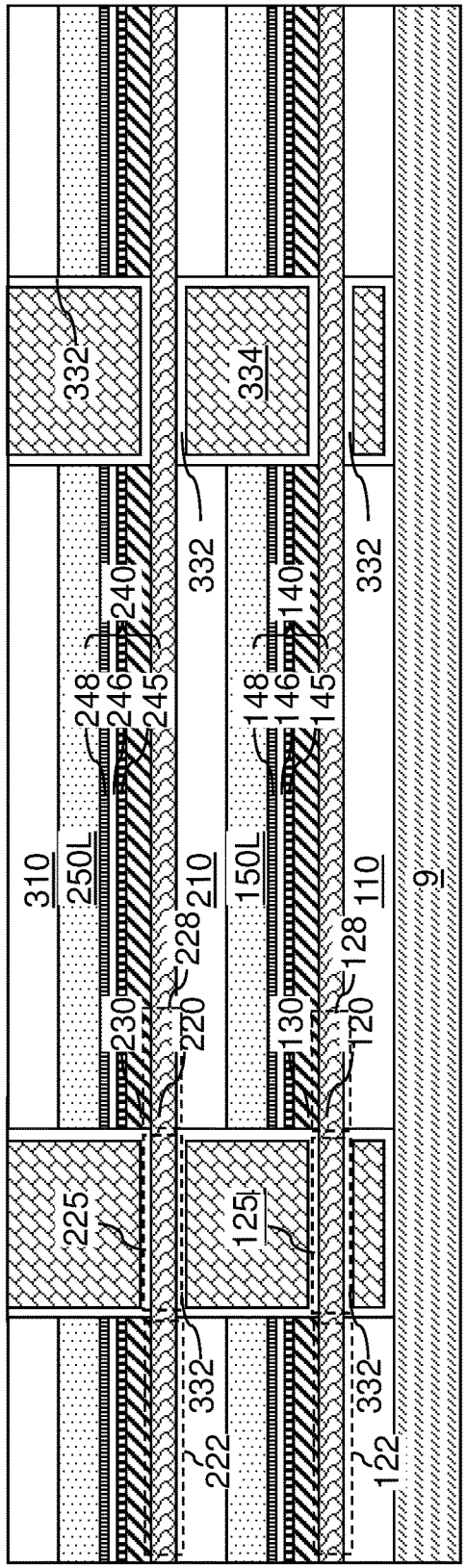
FIG. 6B is a vertical cross-sectional view of the exemplary structure along the vertical plane B-B' of FIG. 6A.
Figure 6C:
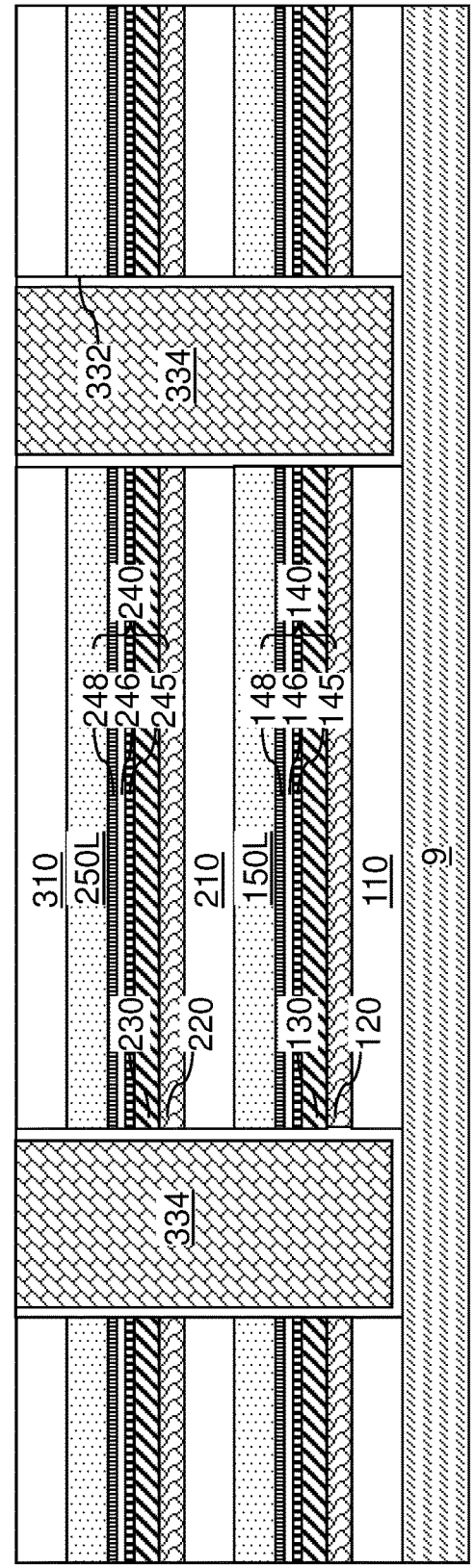
FIG. 6C is a vertical cross-sectional view of the exemplary structure along the vertical plane C-C' of FIG. 6A.
Figure 6D:
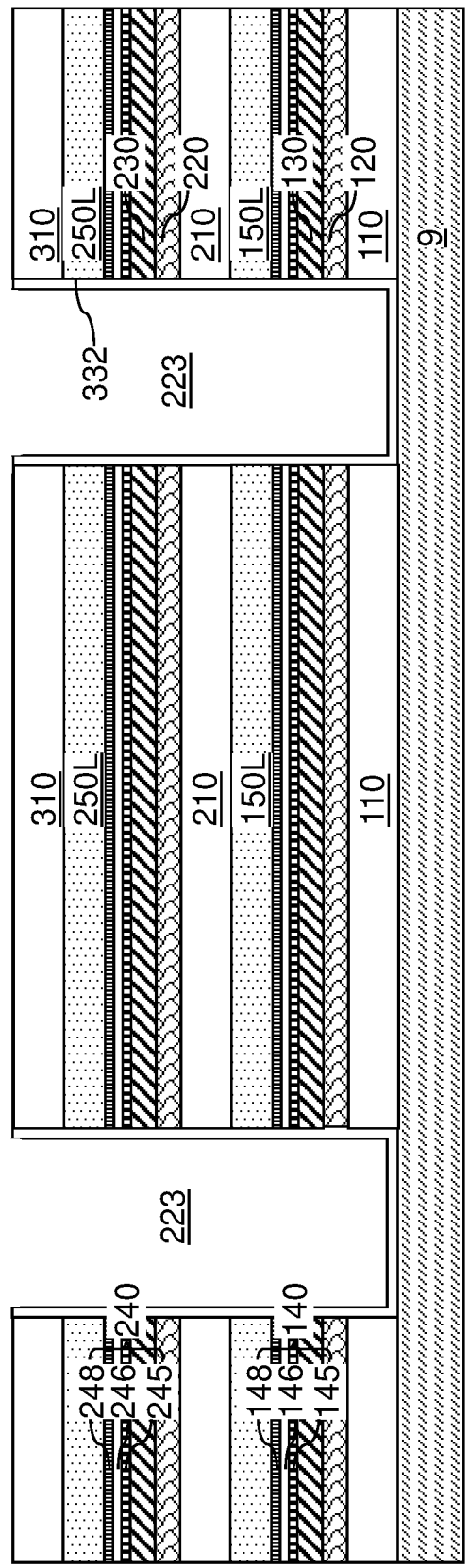
FIG. 6D is a vertical cross-sectional view of the exemplary structure along the vertical plane D-D' of FIG. 6A.

Referring to FIGS. 5A-5C, a gate dielectric layer 332 may be formed on the physically exposed surfaces of the exemplary structure, for example, by conformal deposition of a dielectric material layer. For example, a silicon oxide layer, a silicon oxynitride layer, and/or a dielectric metal oxide layer may be conformally deposited by at least one chemical vapor deposition process and/or at least one atomic layer deposition process to form the gate dielectric layer 332. The gate dielectric layer 332 may have a uniform thickness throughout, which may be in a range from 1 nm to 10 nm, such as from 1.5 nm to 6 nm.

A gate electrode material layer 334L may be subsequently deposited over the gate dielectric layer 332. The gate electrode material layer 334L may include any gate electrode material known in the art. The gate electrode material layer 334L may include a heavily doped semiconductor material such as doped polysilicon, and/or may include a metallic material such as TiN, TaN, WN, Ti, Ta, W, Ru, Cu, etc. Other suitable materials within the contemplated scope of disclosure may also be used. The thickness of the gate electrode material layer 334L may be greater than one half of the vertical separation distance between vertically-neighboring pairs of semiconductor channels such as the vertical separation distance between a vertically-neighboring pair of a first semiconductor channel 125 and a second semiconductor channel 225.

Referring to FIGS. 6A-6D, the gate electrode material layer 334L may be planarized, for example, using a chemical mechanical planarization process to remove portions of the gate electrode material layer 334L that protrude above the horizontal plane including the top surface of the cap insulating material layer 310. A photoresist layer (not shown) may be applied over the exemplary structure, and may be lithographically patterned in the pattern of strips. Each patterned strip of the photoresist layer laterally extends along the first horizontal direction hd1 and may have a uniform width along the second horizontal direction hd2. Each patterned strip of the photoresist layer may overlie a column of semiconductor channels (125, 225) arranged along the first horizontal direction hd1. An anisotropic etch process that etches the material of the gate electrode material layer 334L may be performed to remove unmasked portions of the gate electrode material layer 334L selective to the material of the gate dielectric layer 332. Each patterned portion of the gate electrode material layer 334L constitutes a gate electrode 334. Each gate electrode 334 may wrap around each semiconductor channel (125, 225) located within the area of the respective gate electrode 334. In embodiments in which the vertical stack of at least one instance of the unit layer stack includes a plurality of instances of the unit layer stack, each gate electrode 334 may wrap around a plurality of semiconductor channels (125, 225) having an areal overlap in a plan view, i.e., a view along a vertical direction. The lateral width of each gate electrode 334, as measured between a pair of outer sidewalls that laterally extend along the first horizontal direction hd1, may be greater than the width of each semiconductor channel (125, 225) along the second horizontal direction hd2 by a dimension in a range from 20 nm to 200 nm, although lesser and greater dimensions may also be used. The photoresist layer may be subsequently removed, for example, by ashing.

Generally, each of the gate electrodes 334 may wrap around at least one of the plurality of semiconductor channels (125, 225). Each semiconductor channel (125, 225) of the plurality of semiconductor channels may be laterally surrounded by a laterally-extending tubular portion of the gate dielectric layer 332. Each tubular portion of the gate dielectric layer 332 laterally extends along the first horizontal direction hd2. Each laterally-extending tubular portion of the gate dielectric layer 332 is laterally surrounded by a respective gate electrode 334.

Figure 7A:
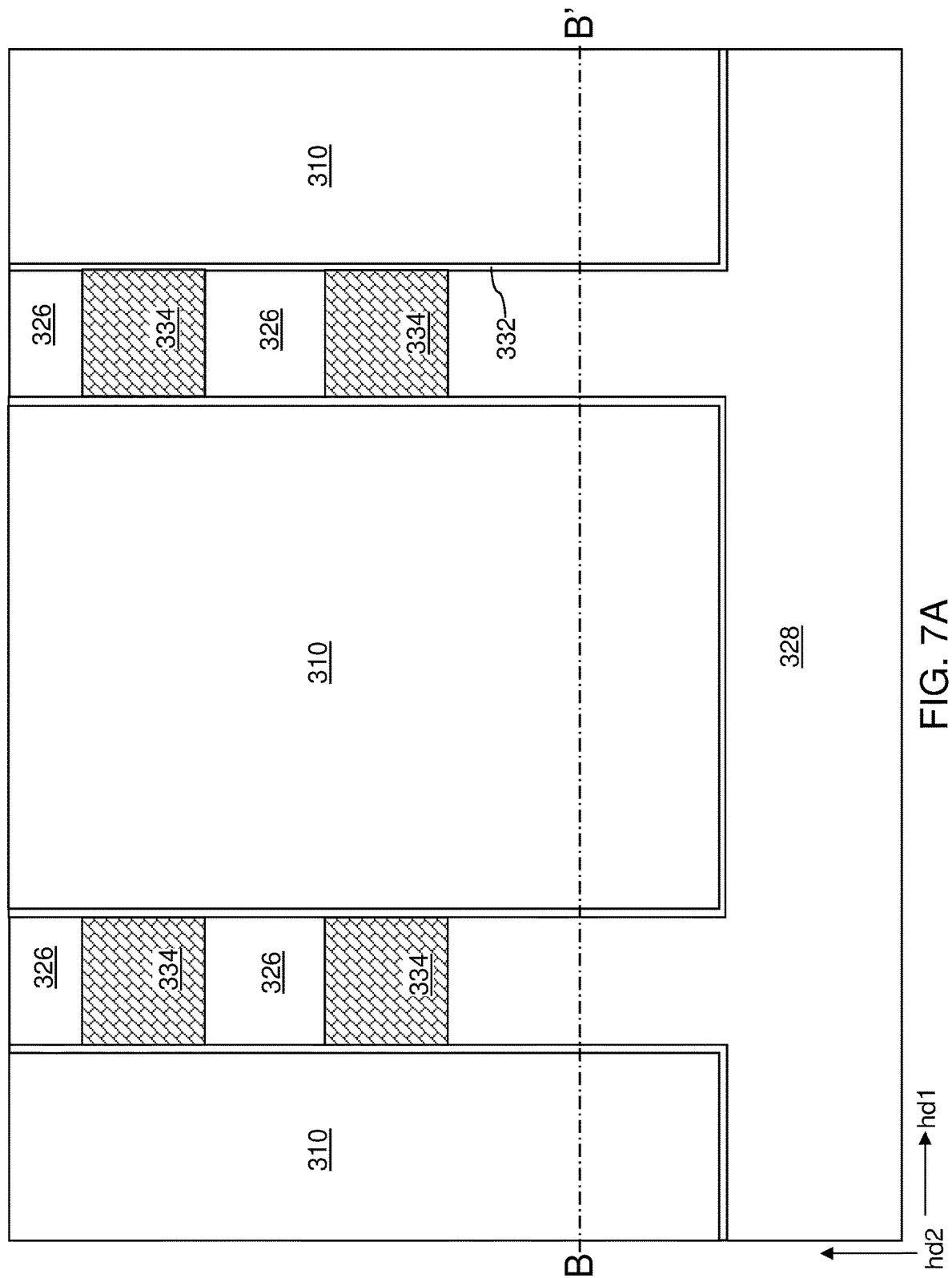
FIG. 7A is a top-down view of the exemplary structure after formation of gate isolation dielectric pillars and field dielectric material portions according to an embodiment of the present disclosure.
Figure 7B:
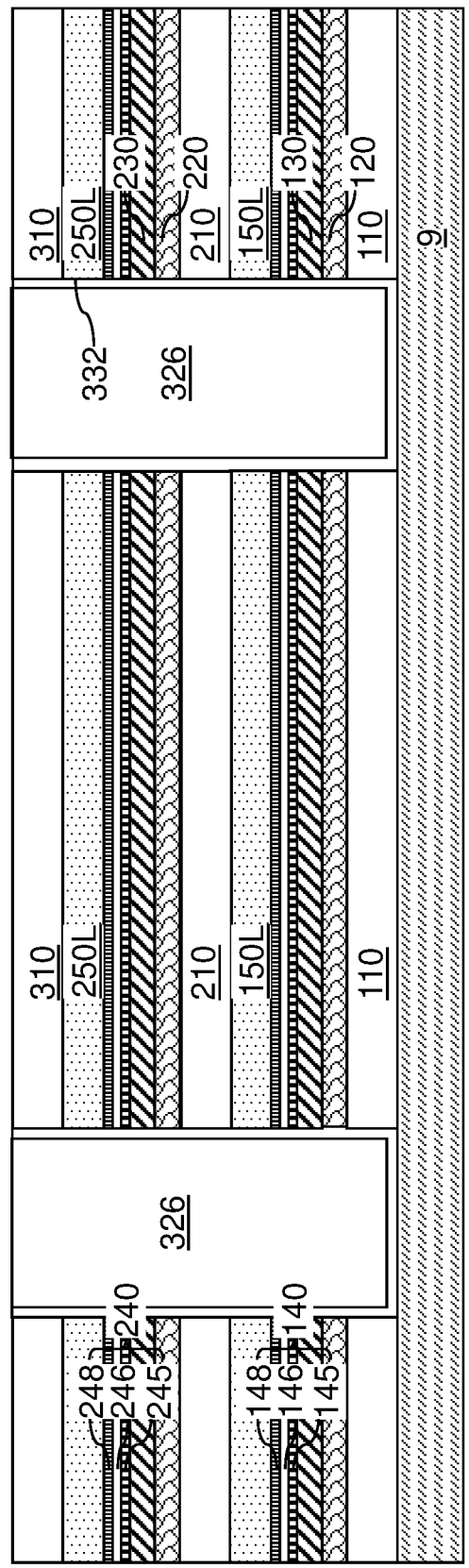
FIG. 7B is a vertical cross-sectional view of the exemplary structure along the vertical plane B-B' of FIG. 7A.

Referring to FIGS. 7A and 7B, a self-planarizing dielectric material (such as flowable oxide (FOX)) or a planarizable dielectric material (such as silicon oxide) may be deposited in the cavities 223 below the horizontal plane including the top surface of the cap insulating material layer 310. The thickness of the deposited dielectric material may be selected to fill the entire volume of the cavities underneath the horizontal plane including the top surface of the cap insulating material layer 310. Portions of the deposited dielectric material that protrude above the horizontal plane including the top surface of the cap insulating material layer 310 may be subsequently removed by a planarization process. The planarization process may use a chemical mechanical planarization (CMP) process or a recess etch process. Remaining portions of the deposited dielectric material include gate isolation dielectric pillars 326 that are formed between each laterally-neighboring pair of gate electrodes 334 that are laterally spaced apart from one another along the second horizontal direction hd1. A field dielectric material portion 328 may be formed outside the areas of the vertical stack of the at least one instance of the unit layer stack, i.e., in each cavity other than the cavities filled by the gate isolation dielectric pillars 326.

Figure 8A:
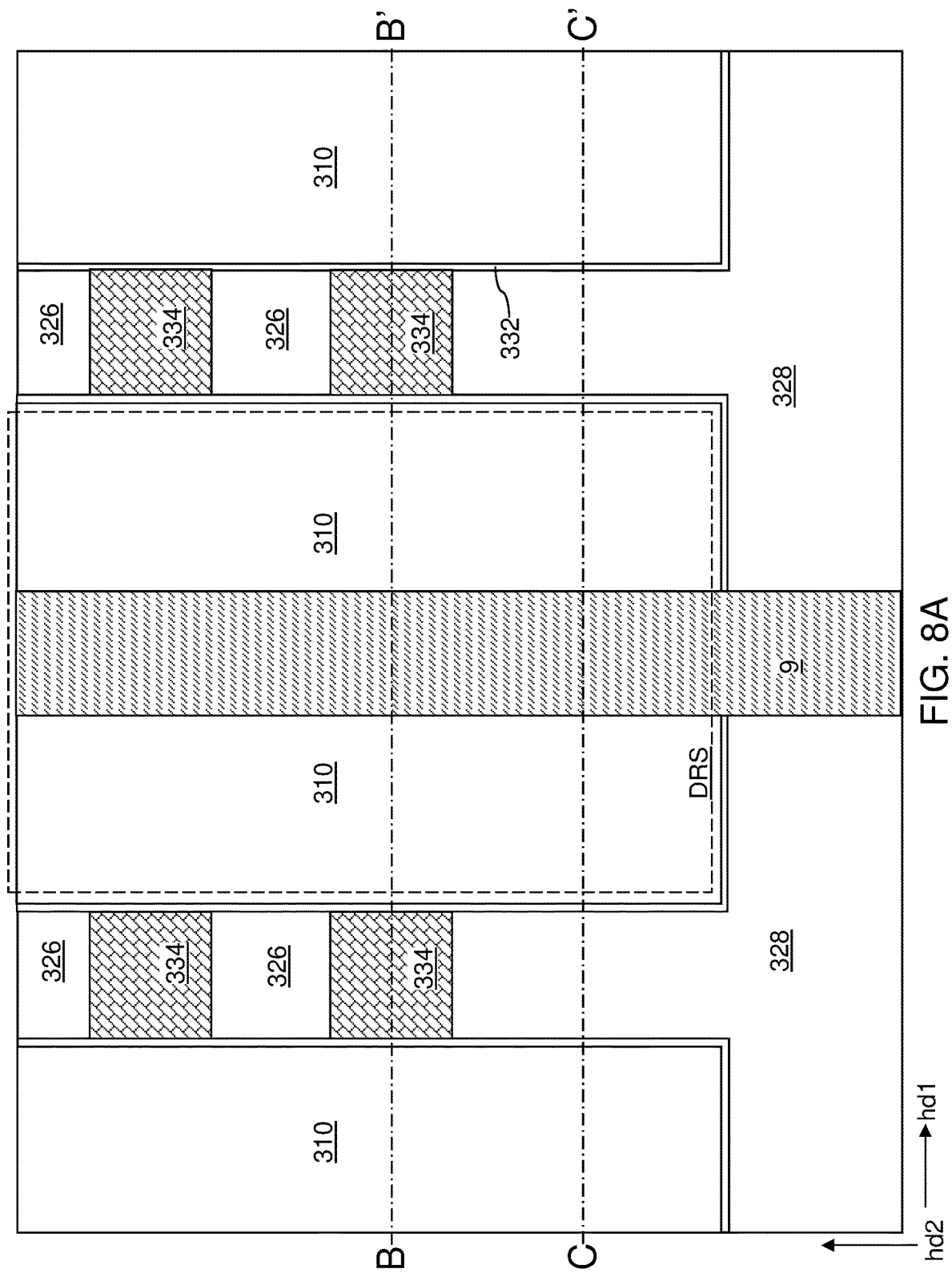
FIG. 8A is a top-down view of the exemplary structure after formation of drain-side trenches according to an embodiment of the present disclosure.
Figure 8B:
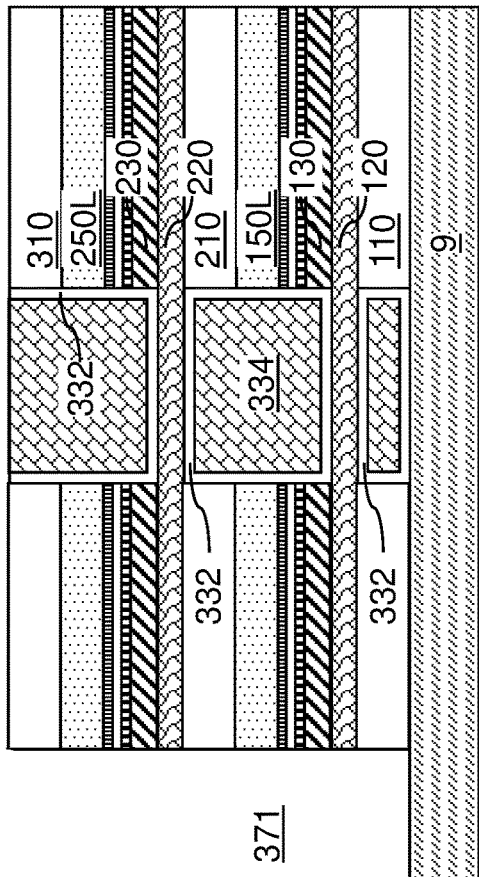
FIG. 8B is a vertical cross-sectional view of the exemplary structure along the vertical plane B-B' of FIG. 8A.
Figure 8B:
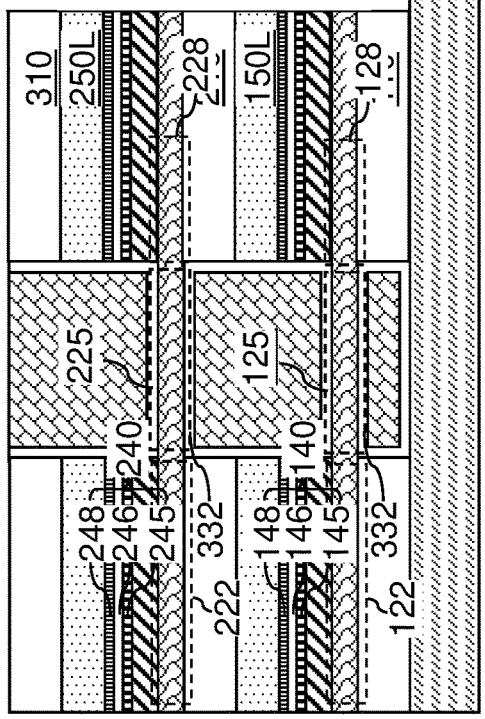
Figure 8C:
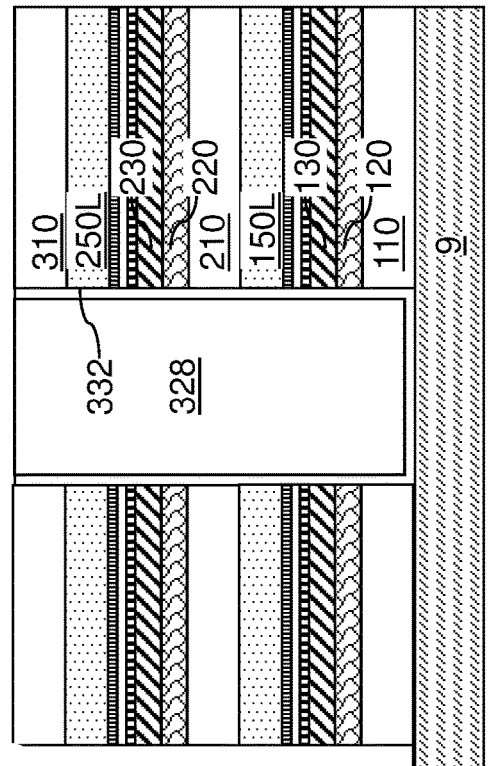
FIG. 8C is a vertical cross-sectional view of the exemplary structure along the vertical plane C-C' of FIG. 8A.
Figure 8C:
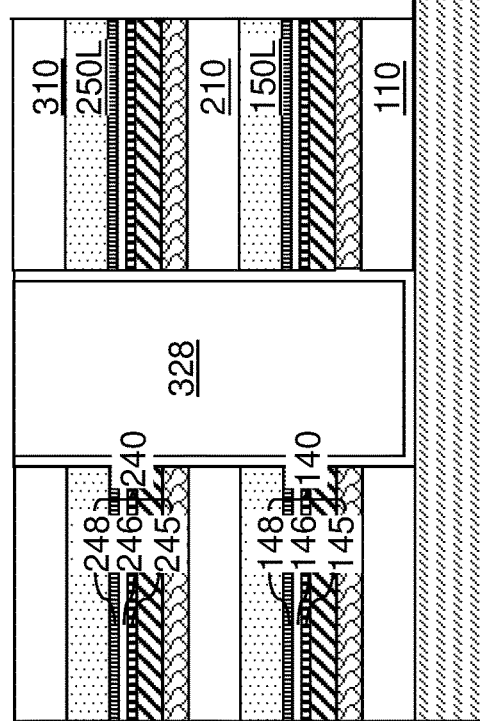

Referring to FIGS. 8A-8C, a drain-side trench 371 may be formed through each remaining portion of the drain region stacks DRS of the vertical stack of the at least one instance of the unit layer stack. Each drain-side trench 371 may laterally extend along the second horizontal direction hd2, and may bisect each remaining portion of drain region stack DRS of the vertical stack. Thus, each semiconductor drain region (128, 228) may be divided into a pair of semiconductor drain regions (128, 228). Each portion of the vertical stack of the at least one instance of the unit layer stack located within a drain region stack DRS is divided into a pair of disjoined material portions. The width of each drain-side trench 371 along the first horizontal direction hd1 may be in a range from 30 nm to 600 nm, such as from 60 nm to 300 nm, although lesser and greater widths may also be used.

Referring to FIGS. 9A and 9B, a series of isotropic etch processes may be performed to etch the materials of the magnetic tunnel junction layers (140, 240), the metallic material layers (130, 230), and the semiconductor material layers (120, 220) selective to the materials of the insulating material layers (110, 210), the cap insulating material layer 310, and the dielectric spacer layers (150L, 250L). Each of the isotropic etch processes may include a respective wet etch process that etches at least one material of the magnetic tunnel junction layers (140, 240), the metallic material layers (130, 230), and the semiconductor material layers (120, 220) selective to the materials of the insulating material layers (110, 210), the cap insulating material layer 310, the dielectric spacer layers (150L, 250L), and the substrate 9.

A plurality of isotropic etch processes (such as wet etch processes) may be sequentially performed to laterally recess each sub-layer of the magnetic tunnel junction layers (140, 240) and to laterally recess each of the metallic material layers (130, 230) and the semiconductor material layers (120, 220). First lateral recesses (133, 233) are formed in volumes from which the materials of the magnetic tunnel junction layers (140, 240), metallic material layers (130, 230), and the semiconductor material layers (120, 220) are removed. The sidewall of each first lateral recess (133, 233) may be vertical and straight, or may have lateral undulations due to variations in the lateral extent of the etch distance that etches each layer of the magnetic tunnel junction layers (140, 240), the metallic material layers (130, 230), and the semiconductor material layers (120, 220).

While the drawings illustrate an embodiment in which each first lateral recess (133, 233) has a straight vertical sidewall, embodiments are expressly contemplated herein in which the first lateral recesses (133, 233) have laterally undulating sidewalls due to the variations of lateral etch distances among the magnetic tunnel junction layers (140, 240), the metallic material layers (130, 230), and the semiconductor material layers (120, 220). The lateral distance of each first lateral recess (133, 233) may be in a range from 20% to 80%, such as from 30% to 70%, of the width of each semiconductor drain region (128, 228) at the processing steps of FIGS. 8A-8C, i.e., after formation of the drain-side trenches 371 and prior to formation of the first lateral recesses (133, 233).

Generally, at least one first lateral recess (133, 233) may be formed by laterally recessing each instance of the semiconductor material layer (120, 220), the metallic material layer (130, 230), and the magnetic tunnel junction layer (140, 240). If the vertical stack includes a plurality of instance of the unit layer stack, the first lateral recesses (133, 233) may be formed in multiple levels.

Figure 10A:
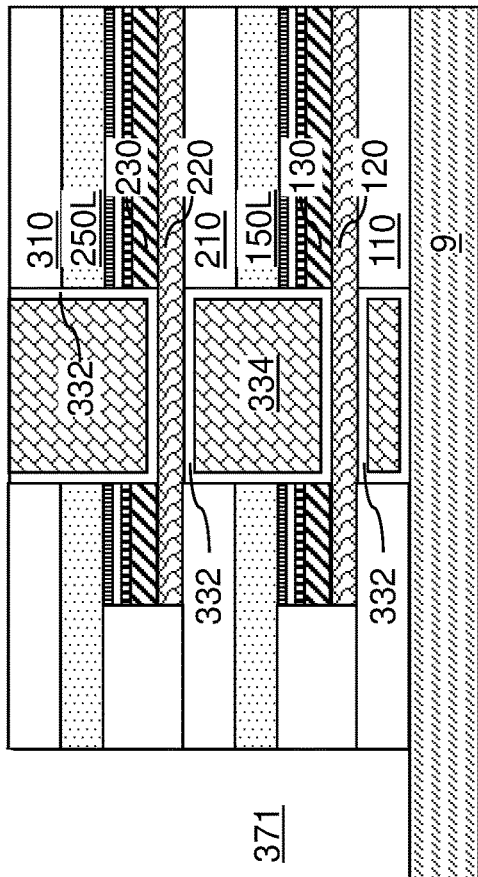
FIG. 10A is a vertical cross-sectional view of the exemplary structure after formation of insulating fill material strips according to an embodiment of the present disclosure.
Figure 10A:
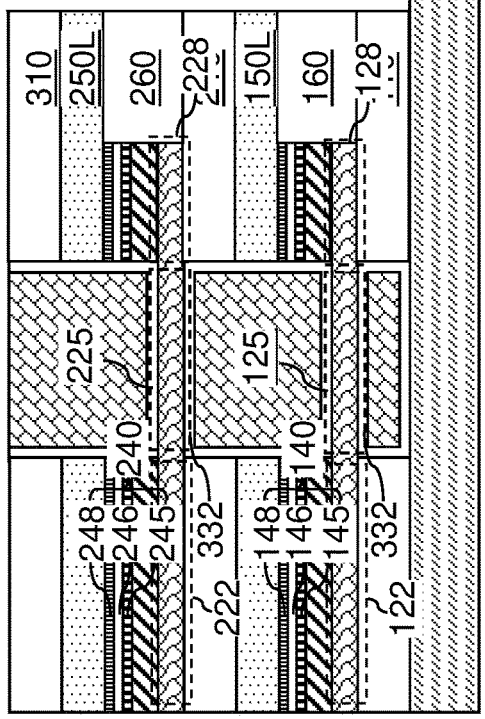
Figure 10B:
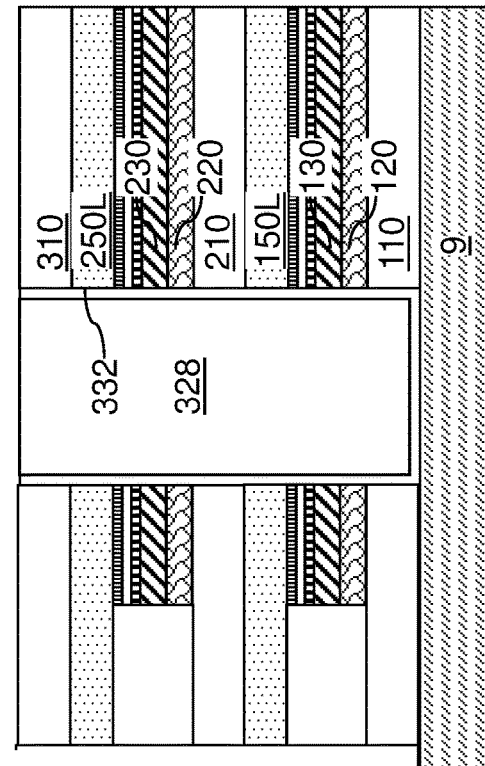
FIG. 10B is another vertical cross-sectional view of the exemplary structure of FIG. 10A.
Figure 10B:
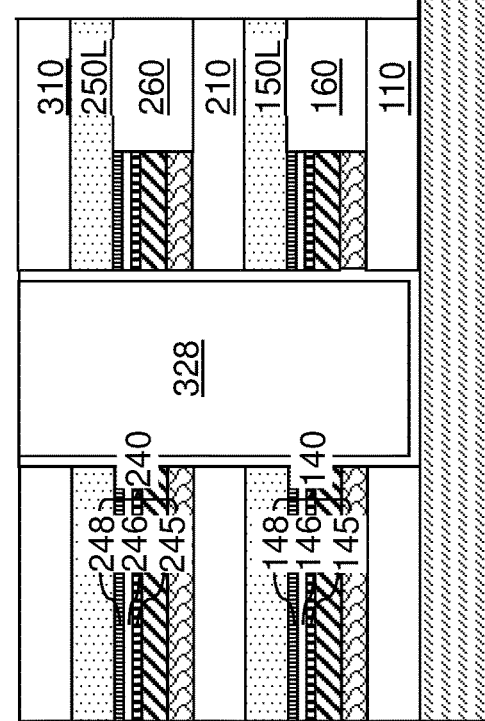

Referring to FIGS. 10A and 10B, an insulating fill material may be deposited in the first lateral recesses (133, 233) by a conformal deposition process such as a chemical vapor deposition. For example, a TEOS oxide material (i.e., a silicon oxide material formed by decomposition of tetraethyl orthosilicate) or silicon nitride may be conformally deposited to fill the first lateral recesses (133, 233). The insulating fill material is different from the material of the dielectric spacer layers (150L, 250L), and may, or may not, be the same as the material of the insulating material layers (110, 210, 310). After the first lateral recesses (133, 233) are filled, an isotropic etch process may be performed to etch back the portions of the deposited insulating fill material that are deposited in the drain-side trenches 371 or over the cap insulating material layer 310. Each remaining portion of the insulating fill material that fills a respective first lateral recess (133, 233) constitutes an insulating fill material strip (160, 260). For example, the insulating fill material strips (160, 260) may include first insulating fill material strips 160 that contacts a respective first semiconductor material layer 120, a respective first metallic material layer 130, and a respective first magnetic tunnel junction layer 140; and second insulating fill material strips 260 that contacts a respective second semiconductor material layer 220, a respective second metallic material layer 230, and a respective second magnetic tunnel junction layer 240.

Referring to FIGS. 11A and 11B, an isotropic etch process may be performed to etch the material of the dielectric spacer layers (150L, 250L) selective to the materials of the insulating material layers (110, 210, 310) and the insulating fill material strips (160, 260). The isotropic etch process may include a wet etch process that etches the material of the dielectric spacer layers (150L, 250L) selective to the materials of the insulating material layers (110, 210), the insulating fill material strips (160, 260), and the substrate 9. For example, if the insulating material layers (110, 210) and the insulating fill material strips (160, 260) include silicon oxide materials and if the dielectric spacer layers (150L, 250L) include silicon nitride, a wet etch process using hot phosphoric acid may be performed to remove the dielectric spacer layers (150L, 250L) selective to the insulating material layers (110, 210) and the insulating fill material strips (160, 260). If the insulating material layers (110, 210) and the insulating fill material strips (160, 260) include undoped silicate glass and if the dielectric spacer layers (150L, 250L) include organosilicate glass or borosilicate glass, a wet etch process using dilute hydrofluoric acid may be performed to remove the dielectric spacer layers (150L, 250L) selective to the insulating material layers (110, 210) and the insulating fill material strips (160, 260).

Second lateral recesses (135, 235) may be formed in volumes from which the materials of the dielectric spacer layers (150L, 250L) are removed. The lateral distance of each first second recess (135, 235) is greater than the lateral extent of the insulating fill material strips (160, 260), and may be in a range from 30% to 98%, such as from 60% to 90%, of the width of each semiconductor drain region (128, 228) at the processing steps of FIGS. 8A-8C, i.e., after formation of the drain-side trenches 371 and prior to formation of the first lateral recesses (133, 233).

Generally, at least one second lateral recess (135, 235) may be formed by laterally recessing each instance of the dielectric spacer layer (150L, 250L). If the vertical stack includes a plurality of instance of the unit layer stack, the second lateral recesses (135, 235) may be formed in multiple levels. Each patterned discrete portion of the dielectric spacer layer (150L, 250L) that remain between a second lateral recess (135, 235) and a proximal one of the gate electrodes 334 is herein referred to as a dielectric spacer (150, 250). The dielectric spacers (150, 250) may be formed in multiple levels. For example, the dielectric spacers (150, 250) may include first dielectric spacers 150 that contact a respective first MTJ layer 140 and second dielectric spacers 250 that contact a respective second MTJ layer 240.

Figure 12A:
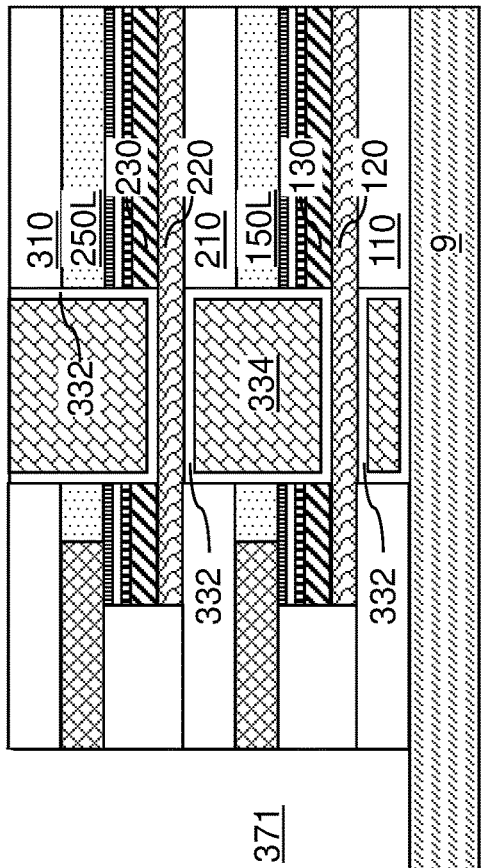
FIG. 12A is a vertical cross-sectional view of the exemplary structure after formation of metallic bit lines according to an embodiment of the present disclosure.
Figure 12A:
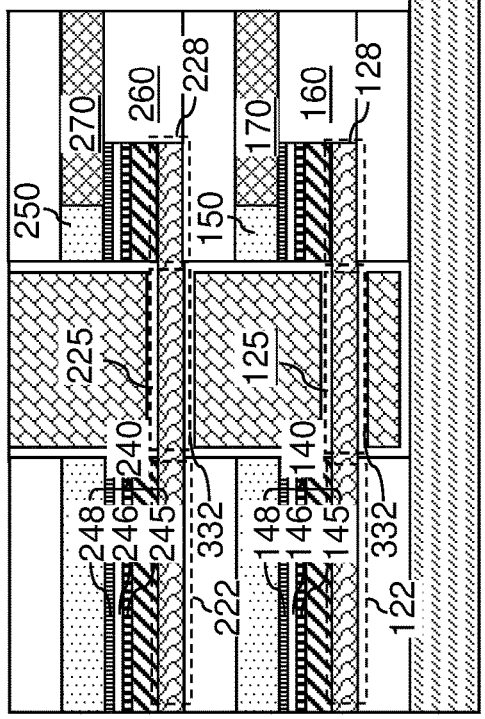
Figure 12B:
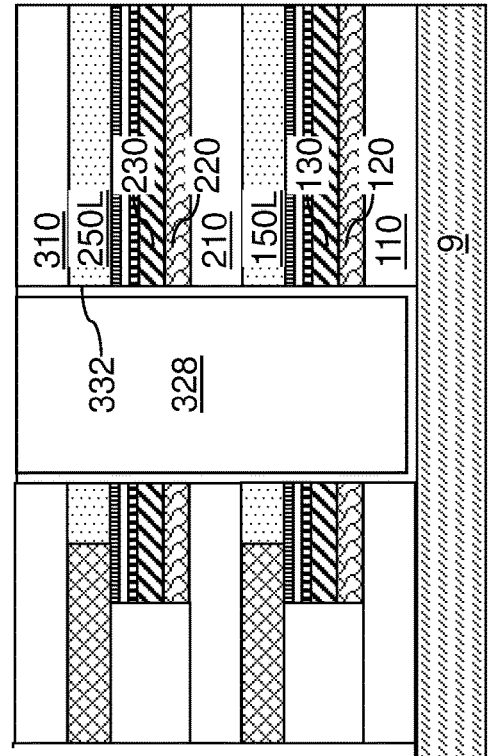
FIG. 12B is another vertical cross-sectional view of the exemplary structure of FIG. 12A.
Figure 12B:
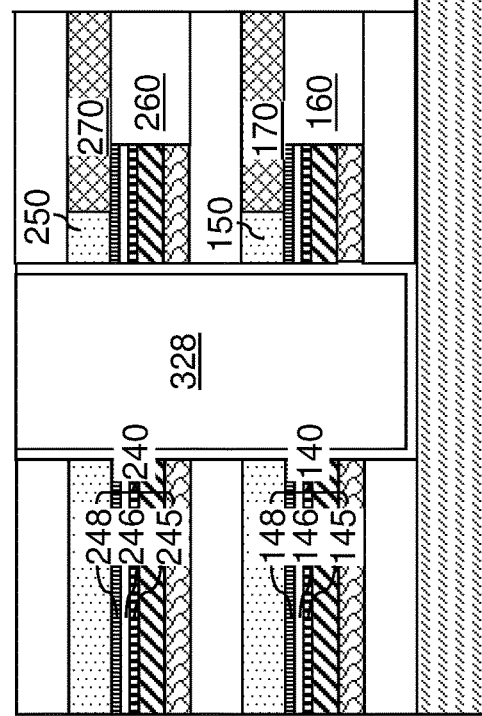
Figure 13A:
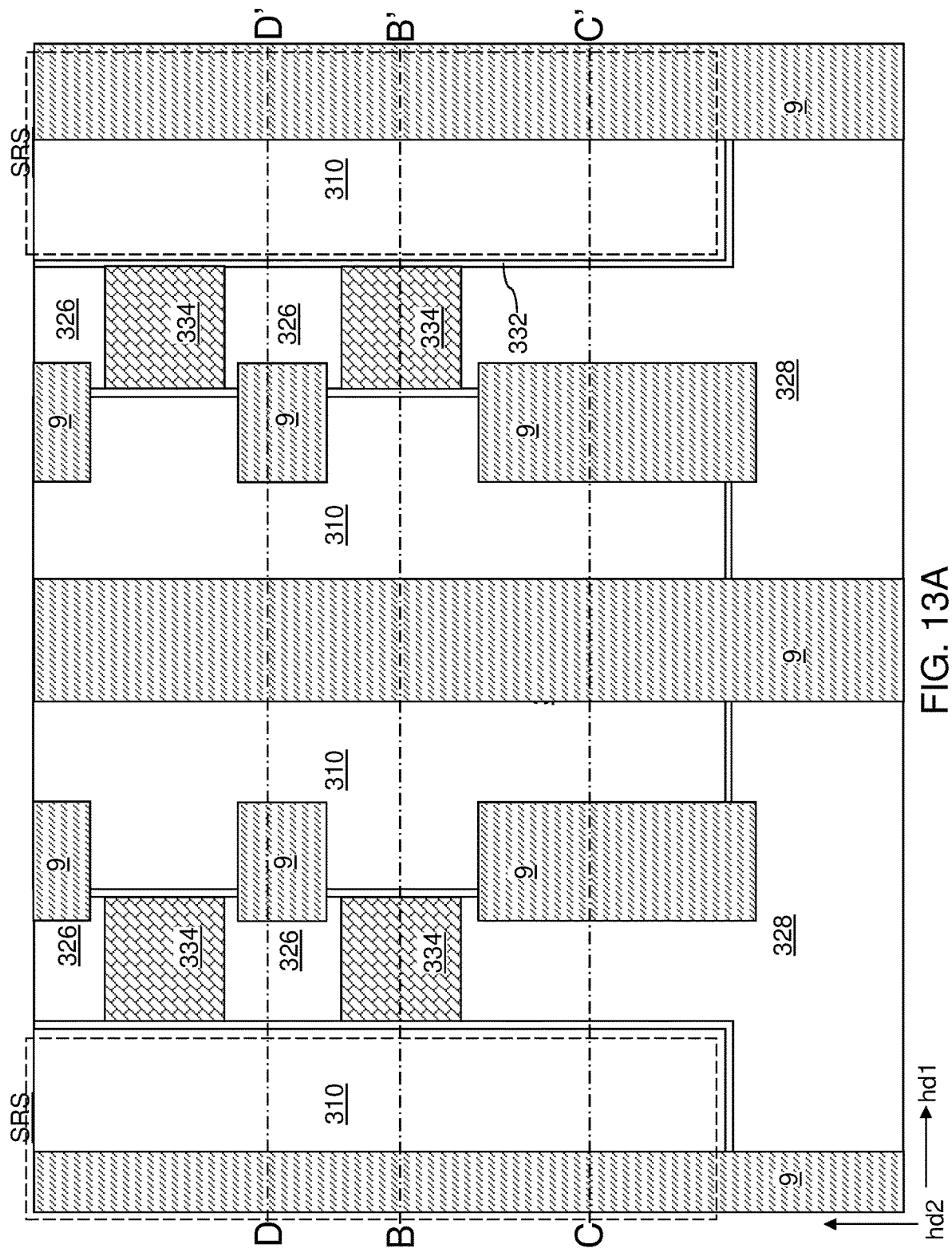
FIG. 13A is a top-down view of the exemplary structure after formation of source-side trenches and pillar cavities according to an embodiment of the present disclosure.
Figure 13B:
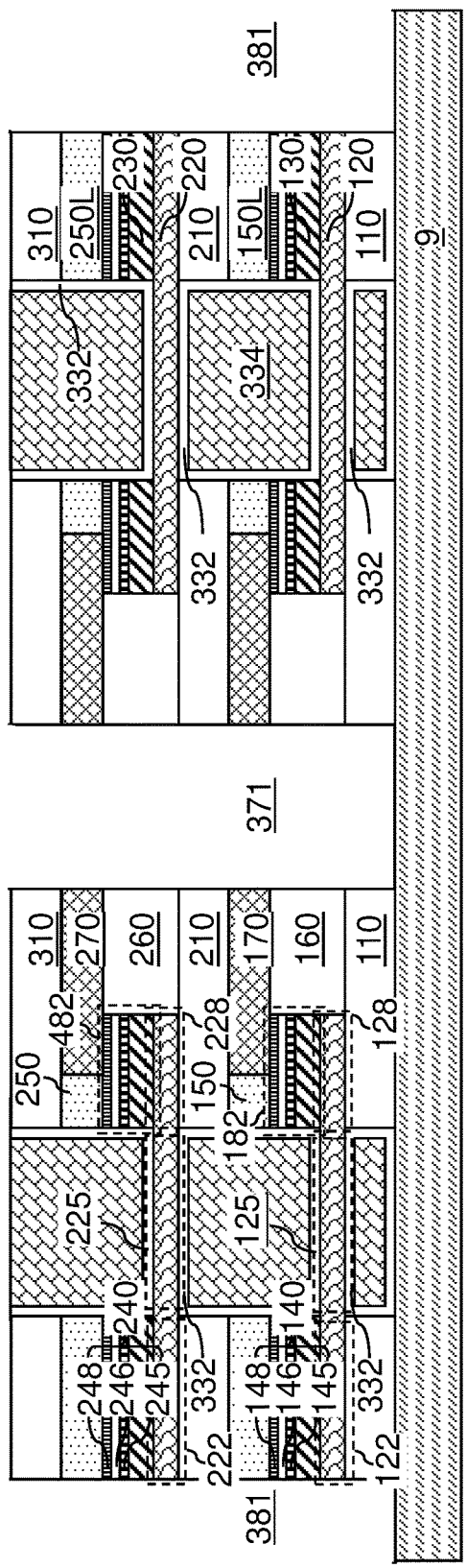
FIG. 13B is a vertical cross-sectional view of the exemplary structure along the vertical plane B-B' of FIG. 13A.
Figure 13C:
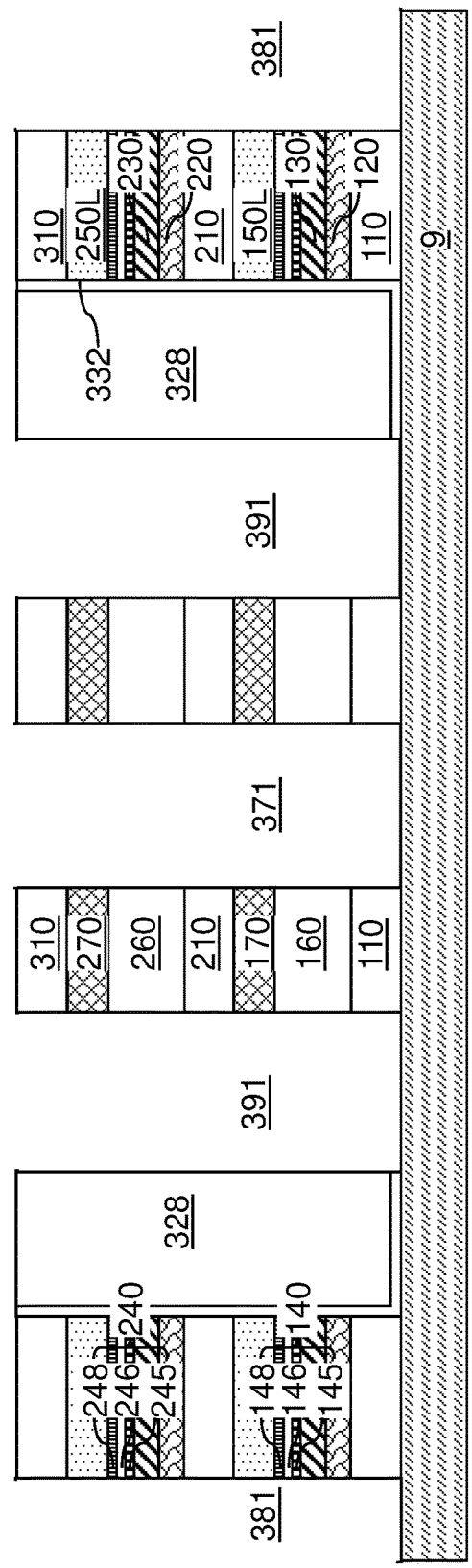
FIG. 13C is a vertical cross-sectional view of the exemplary structure along the vertical plane C-C' of FIG. 13A.
Figure 13D:
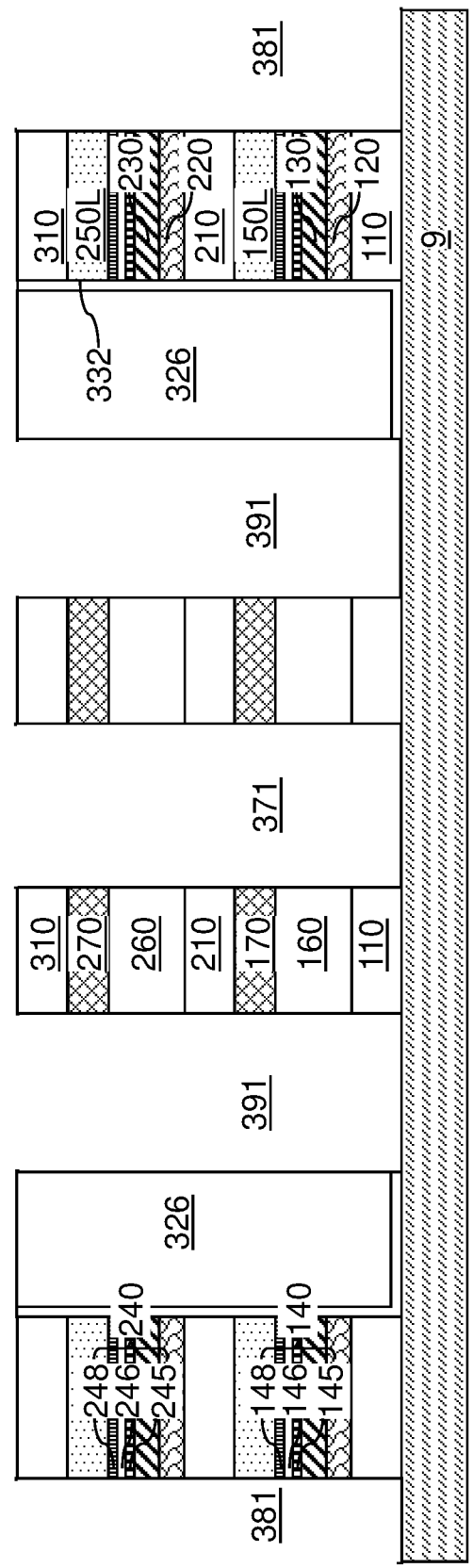
FIG. 13D is a vertical cross-sectional view of the exemplary structure along the vertical plane D-D' of FIG. 13A.
Figure 14A:
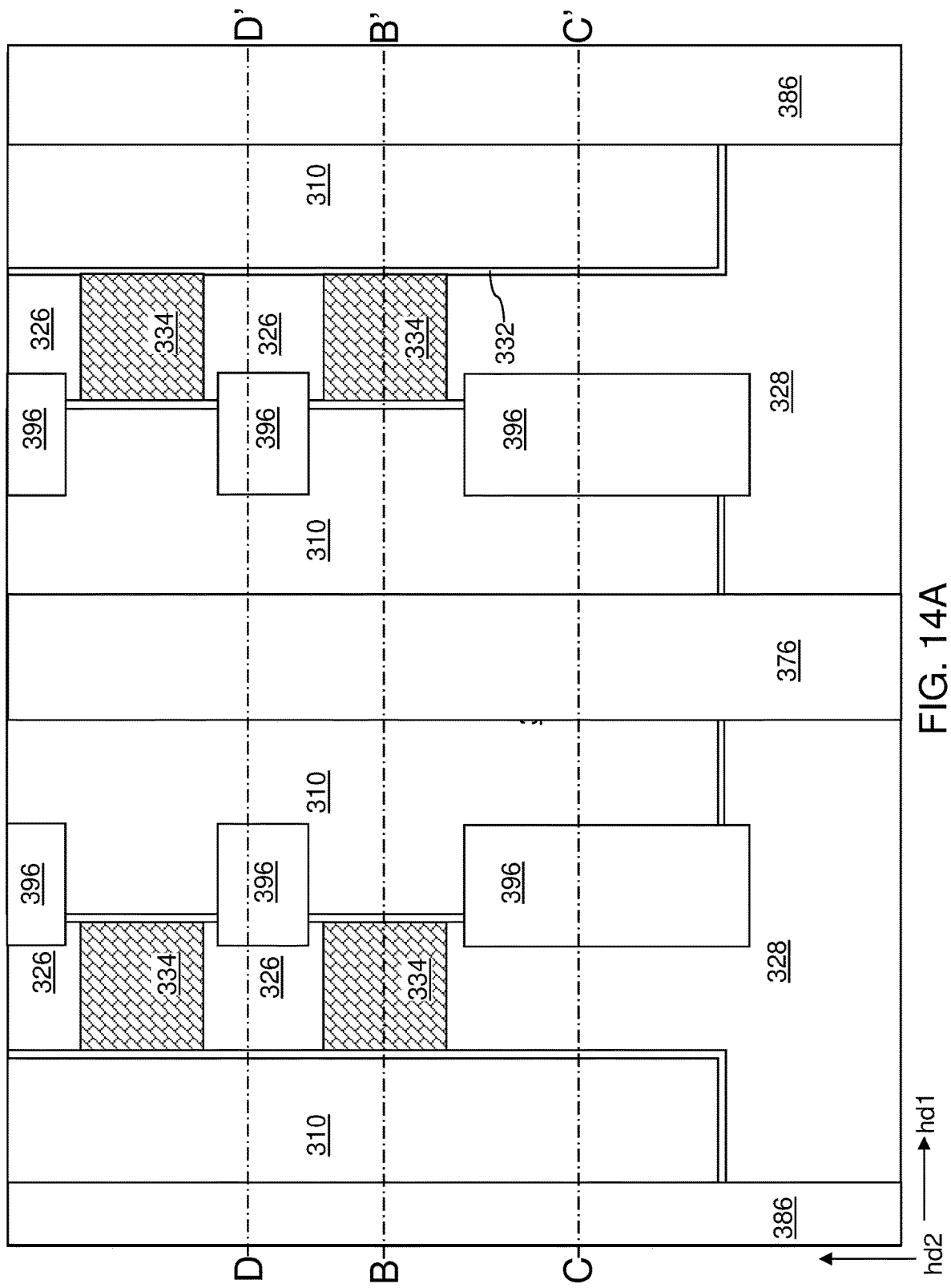
FIG. 14A is a top-down view of the exemplary structure after formation of drain-side trench fill dielectric structures, source-side trench fill dielectric structures, and magnetic tunnel junction isolation dielectric pillars according to an embodiment of the present disclosure.
Figure 14D:
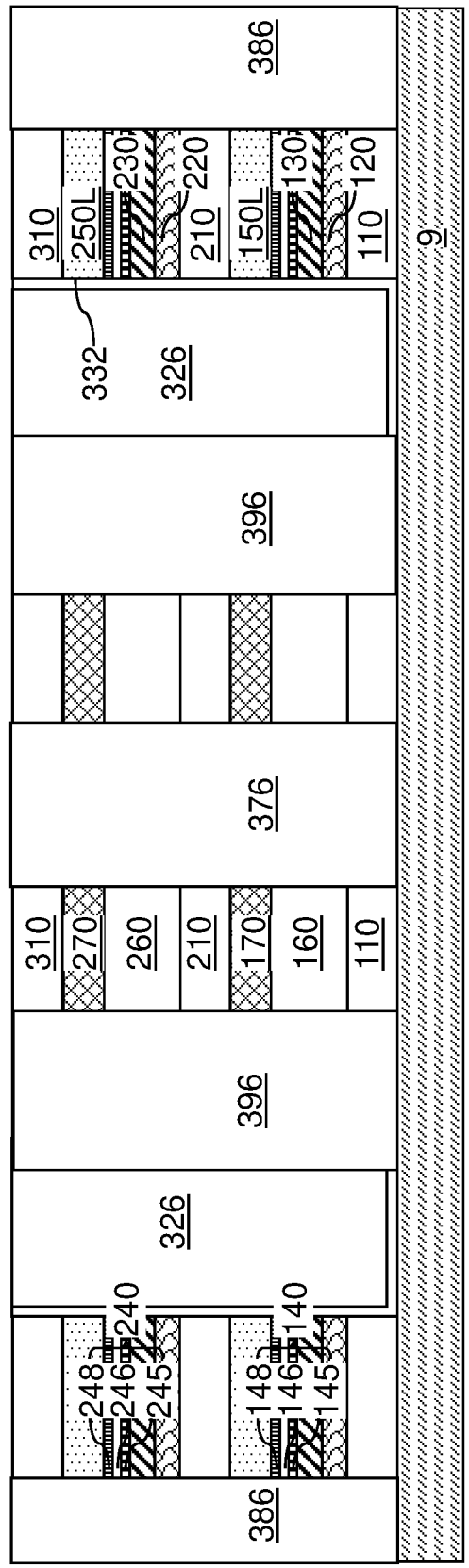
FIG. 14D is a vertical cross-sectional view of the exemplary structure along the vertical plane D-D' of FIG. 14A.
Figure 15B:
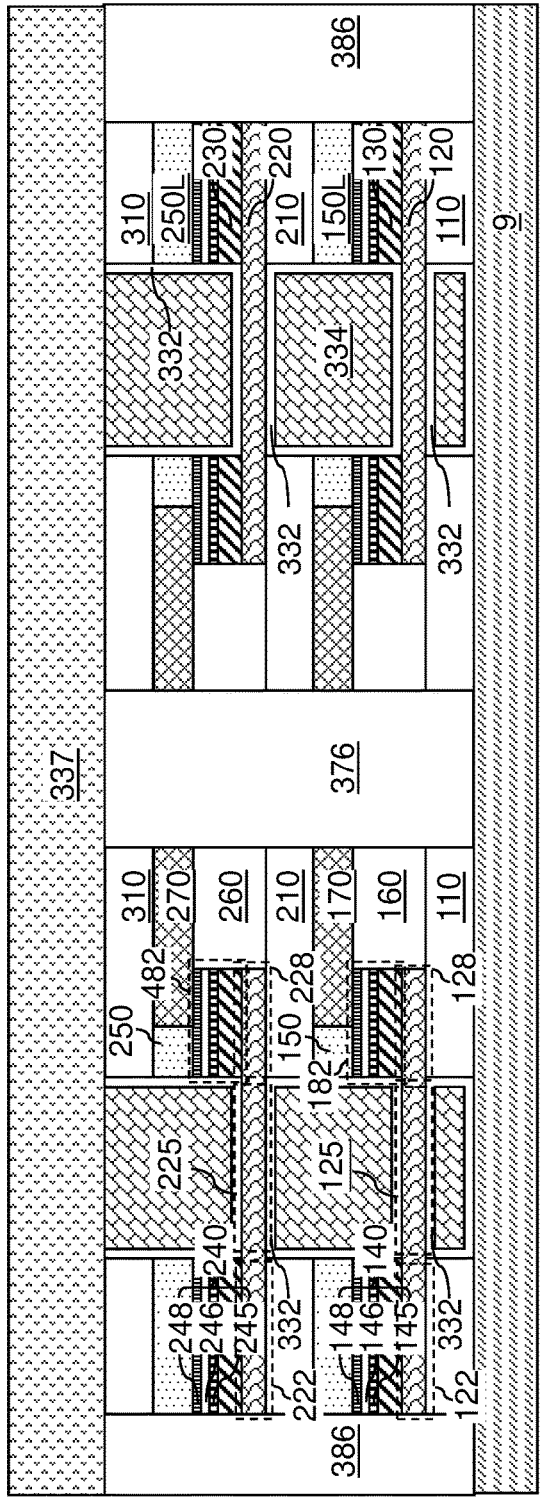
FIG. 15B is a vertical cross-sectional view of the exemplary structure along the vertical plane B-B' of FIG. 15A.
Figure 15C:
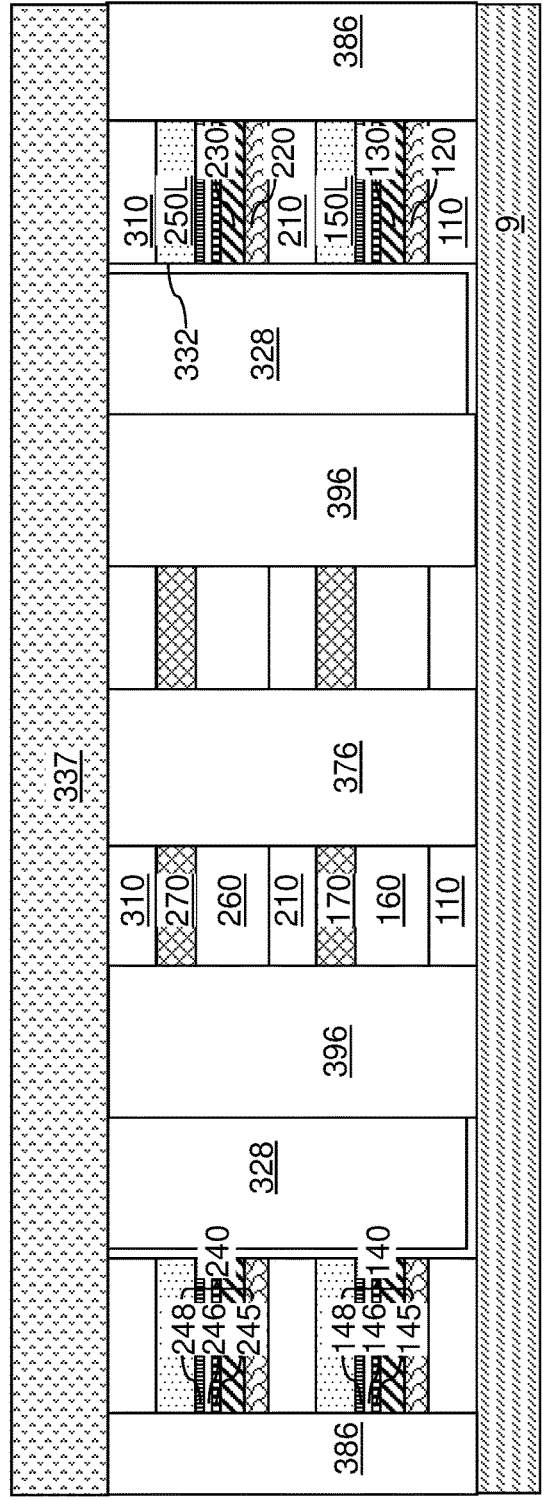
FIG. 15C is a vertical cross-sectional view of the exemplary structure along the vertical plane C-C' of FIG. 15A.
Figure 15D:
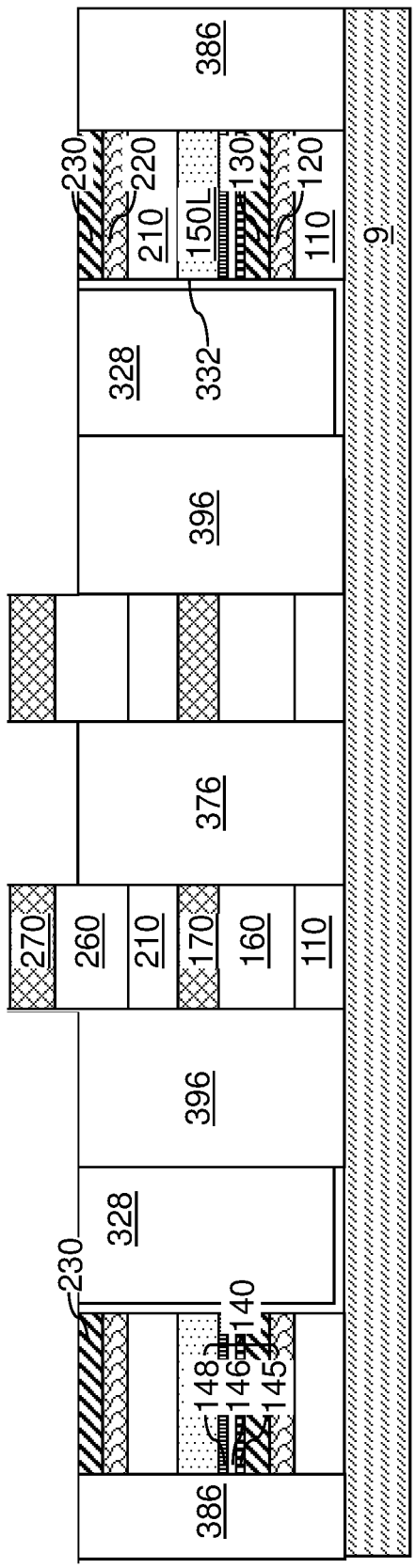
FIG. 15D is a vertical cross-sectional view of the exemplary structure along the vertical plane D-D' of FIG. 15A.
Figure 15E:
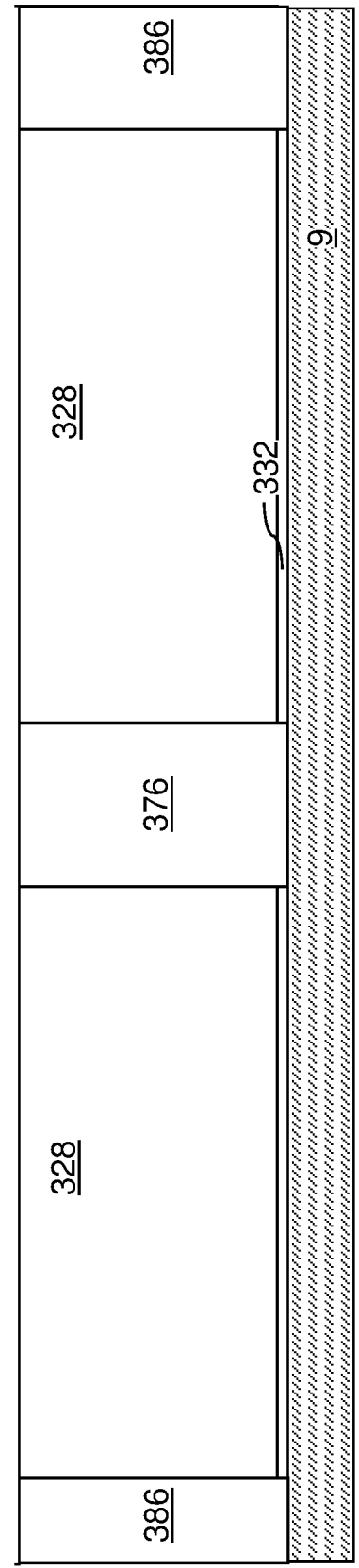
FIG. 15E is a vertical cross-sectional view of the exemplary structure along the vertical plane E-E' of FIG. 15A.
Figure 16A:
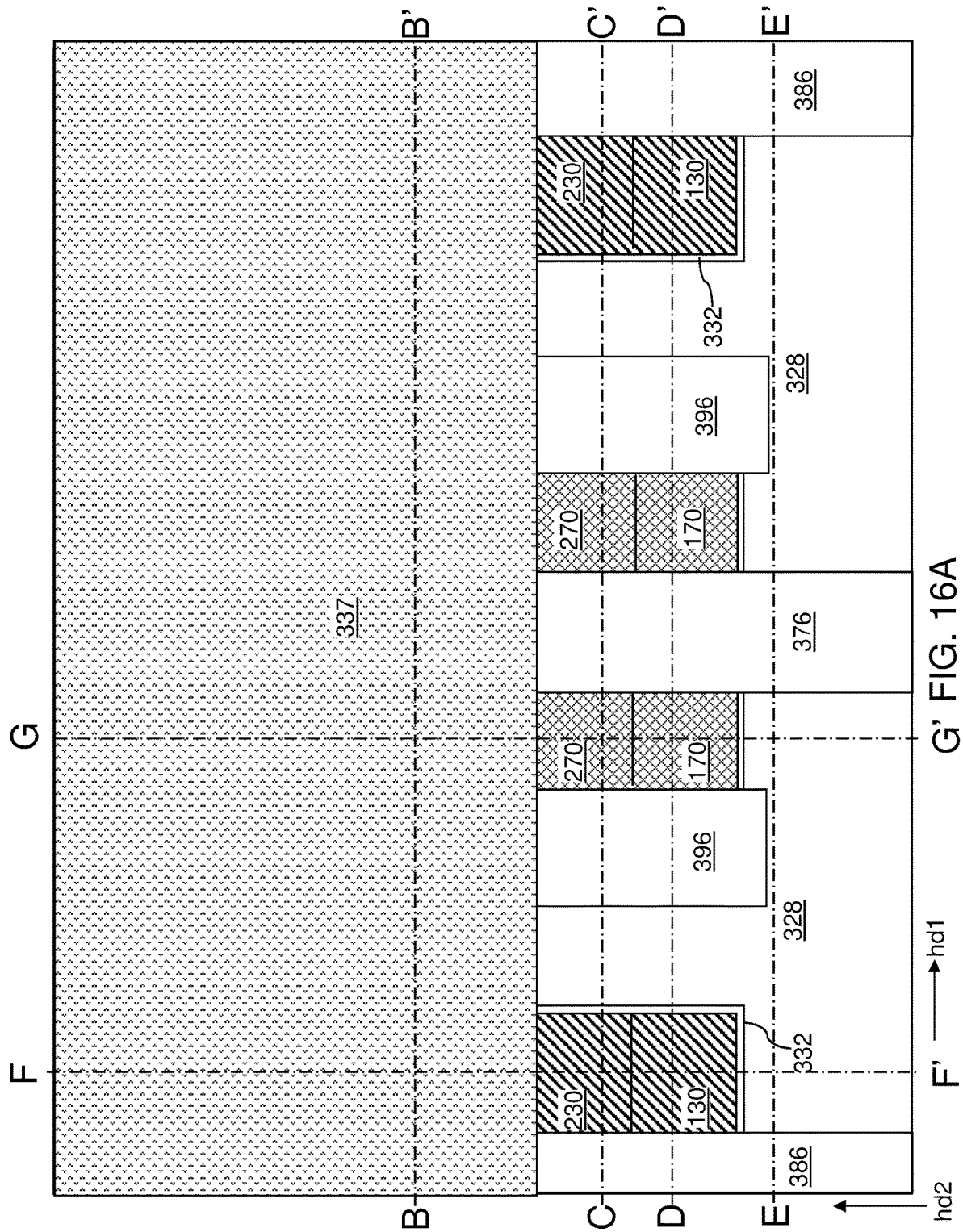
FIG. 16A is a top-down view of the exemplary structure after formation of stepped surfaces by trimming the trimmable mask layer and performing another anisotropic etch process according to an embodiment of the present disclosure.
Figure 16D:
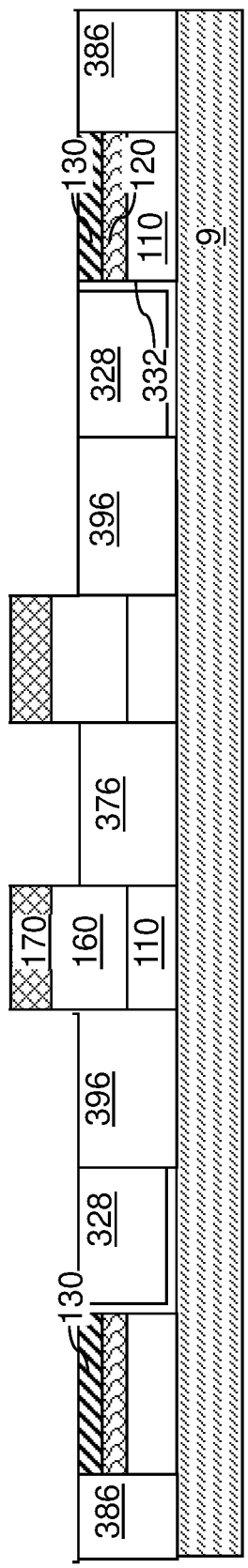
FIG. 16D is a vertical cross-sectional view of the exemplary structure along the vertical plane D-D' of FIG. 16A.
Figure 16E:
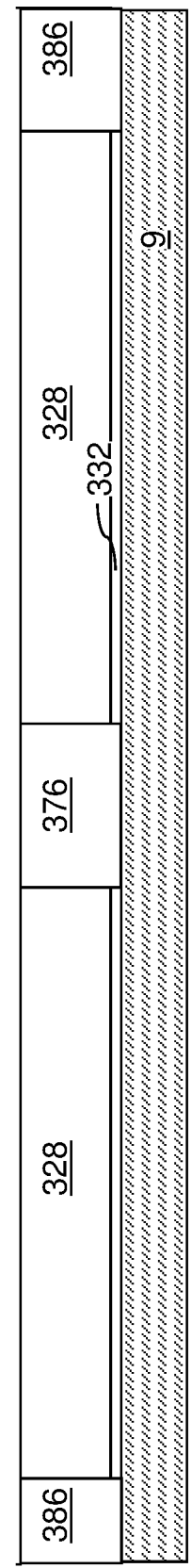
FIG. 16E is a vertical cross-sectional view of the exemplary structure along the vertical plane E-E' of FIG. 16A.
Figure 17A:
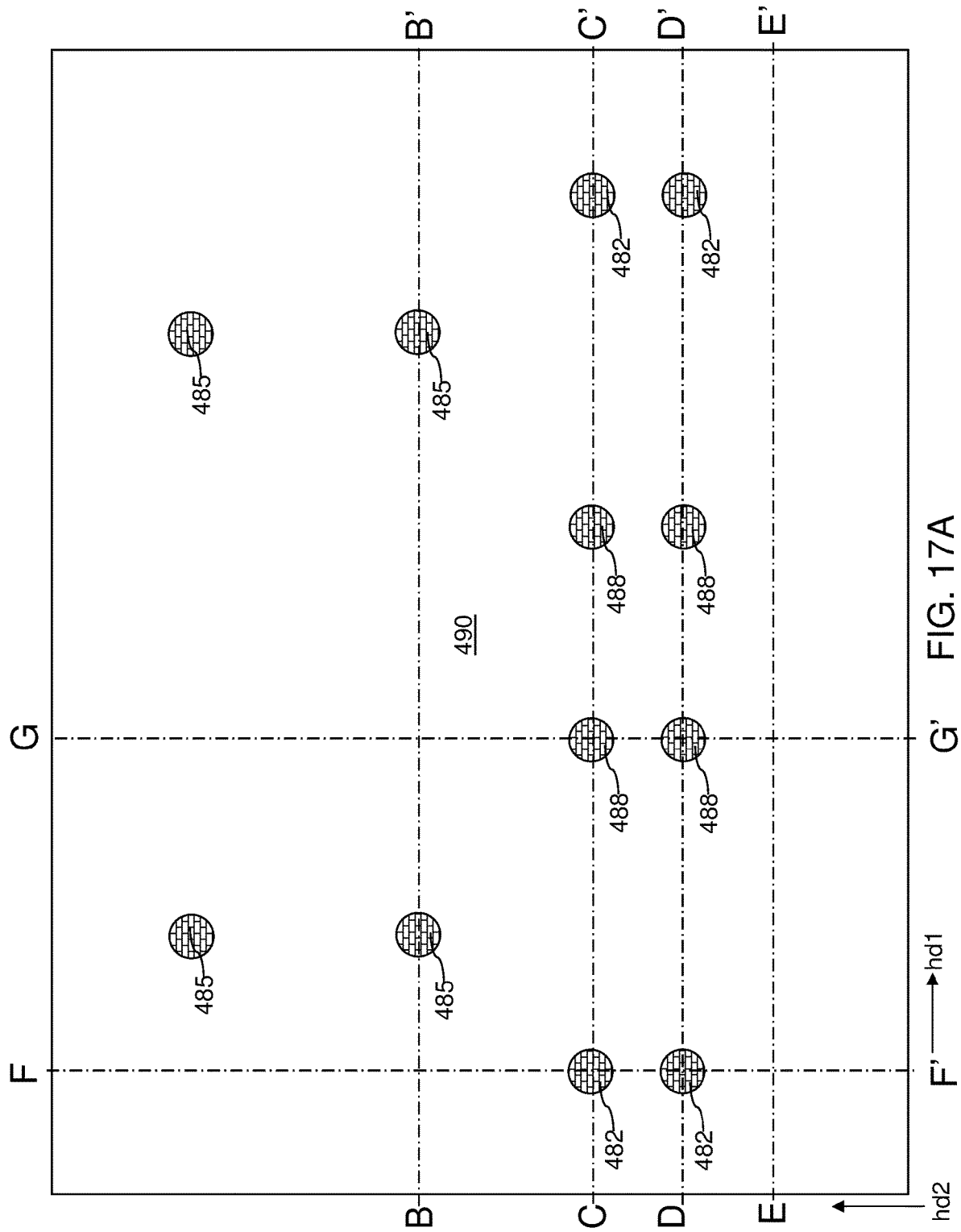
FIG. 17A is a top-down view of the exemplary structure after formation of a contact-level dielectric layer and contact via structures according to an embodiment of the present disclosure.
Figure 17B:
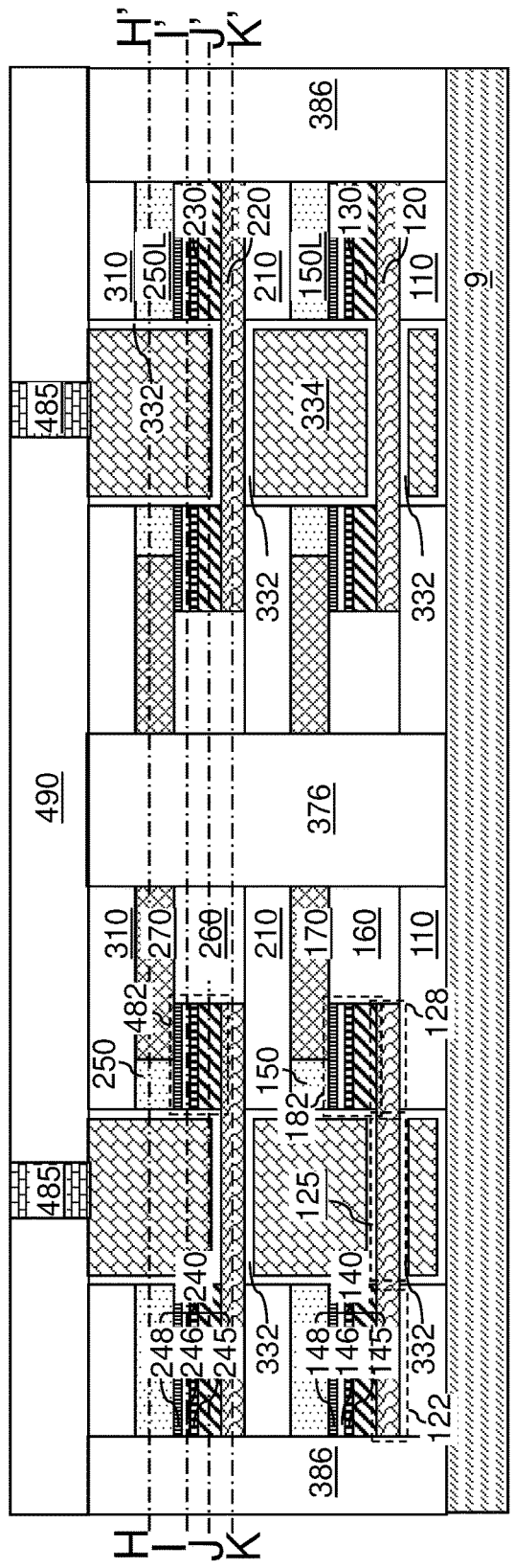
FIG. 17B is a vertical cross-sectional view of the exemplary structure along the vertical plane B-B' of FIG. 17A.
Figure 17C:
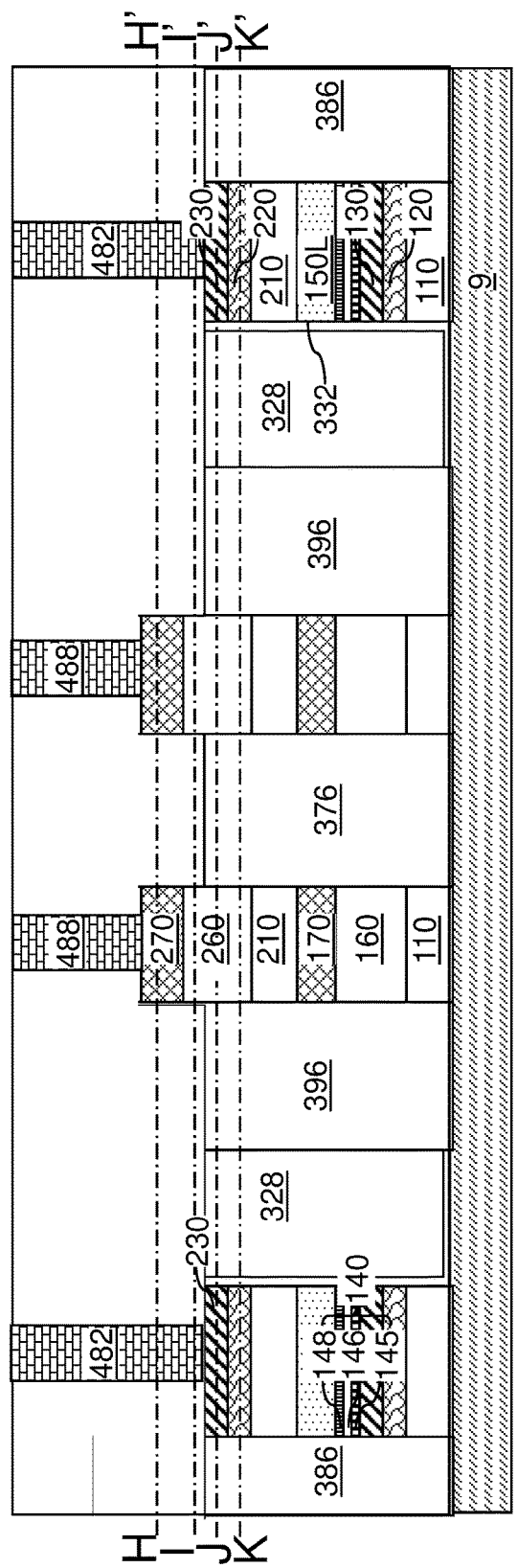
FIG. 17C is a vertical cross-sectional view of the exemplary structure along the vertical plane C-C' of FIG. 17A.
Figure 17H:
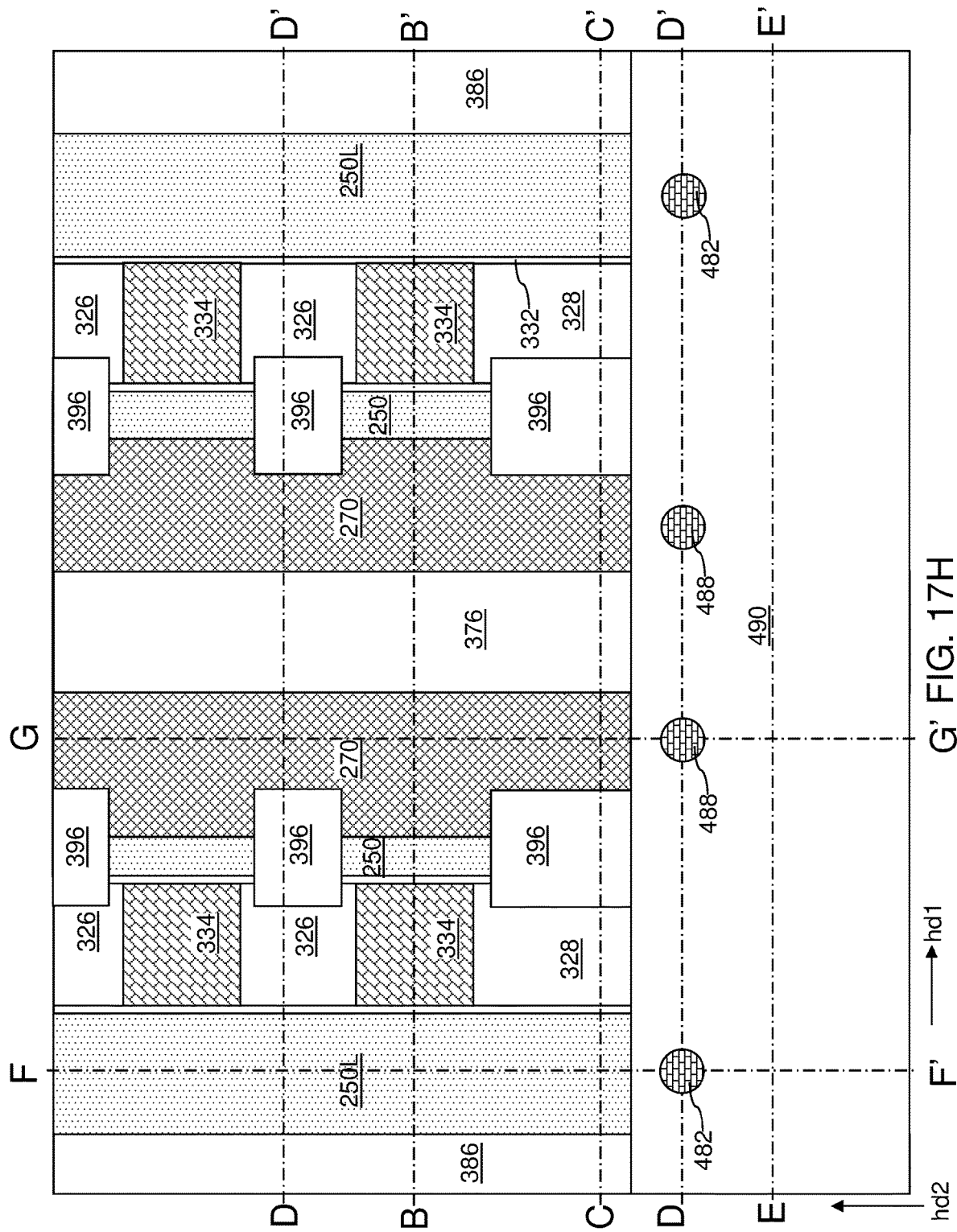
FIG. 17H is a horizontal cross-sectional view of the exemplary structure along the horizontal plane H-H' of FIGS. 17B-17G.

Referring to FIGS. 12A and 12B, a metallic material may be deposited in the second lateral recesses (135, 235) by a conformal deposition process such as a chemical vapor deposition. For example, a conductive metallic nitride material (such as TiN, TaN, WN) and/or a metal (such as Ti, Ta, Cu, Al, W, Ru, Co, Mo, or another transition metal or an alloy thereof) may be conformally deposited to fill the second lateral recesses (135, 235). Other suitable materials within the contemplated scope of disclosure may also be used. After the second lateral recesses (135, 235) are filled, an isotropic etch process may be performed to etch back the portions of the deposited metallic material that are deposited in the drain-side trenches 371 or over the cap insulating material layer 310. Each remaining portion of the metallic material that fills a respective second lateral recess (135, 235) constitutes a metallic bit line (170, 270), which is a metallic strip that functions as a bit line for a magnetic tunnel junction NOR string. For example, the metallic bit lines (170, 270) may include first metallic bit lines 170 that contact a top surface of a respective first magnetic tunnel junction layer 140 and second metallic bit lines 270 that contact a stop surface of a respective second magnetic tunnel junction layer 140. Each metallic bit line (170, 270) may contact a top surface of a capping layer. For example, each first metallic bit line 170 may contact a top surface of a first capping layer 149 within a first upper MTJ layer 148.

Generally, an instance of a metallic bit line (170, 270) may be formed within each second lateral recess (135, 235). A portion of each instance of the dielectric spacer layer (150L, 250L) is replaced with a respective instance of the metallic bit line (170, 270), which contacts a patterned portion of an instance of the magnetic tunnel junction layer (140, 240).

The metallic bit lines (170, 270) may be laterally spaced from adjacent gate electrodes 334 by the dielectric spacers (150, 250). Each dielectric spacer (150, 250) contacts a sidewall of a respective metallic bit line (170, 270). Each metallic bit line (170, 270) contacts a horizontal surface of an insulating fill material strip (160, 260).

Referring to FIGS. 13A-13D, a photoresist layer may be applied over the exemplary structure, and may be lithographically patterned to form openings therein. The lithographic pattern in the patterned photoresist layer includes openings for cutting portions of the MTJ layers (140, 240) such that individual MTJ cells can be subsequently defined. The pattern of the openings may be transferred through the vertical stack of the at least one instance of the unit layer stack, the field dielectric material portions 328, and the gate isolation dielectric pillars 326. The combination of the lithographic patterning process and the anisotropic etch process individually defines MTJ cells, thereby removing direct electrical coupling between neighboring MTJ cells.

A source-side trenches 381 may be formed through each remaining portion of the source region stacks SRS of the vertical stack of the at least one instance of the unit layer stack. Each source-side trench 381 may laterally extend along the second horizontal direction hd2, and may bisect each remaining portion of source region stack SRS of the vertical stack. Thus, each semiconductor source region (122, 222) is divided into a pair of semiconductor source regions (122, 222). Each portion of the vertical stack of the at least one instance of the unit layer stack located within a source region stack SRS is divided into a pair of disjoined material portions. The width of each source-side trench 381 along the first horizontal direction hd1 may be in a range from 30 nm to 600 nm, such as from 60 nm to 300 nm, although lesser and greater widths may also be used.

Further, a plurality of pillar cavities 391 may be formed through the vertical stack after formation of the metallic bit lines (170, 270). The pillar cavities 391 may be formed through portions of the MTJ layers (140, 240) and the metallic material layers (130, 230) located between gate electrodes 334 and the insulating fill material strips (160, 260). The plurality of pillar cavities 391 divide a region of each instance of a combination of the magnetic tunnel junction layer (140, 240) and the metallic material layer (130, 230) within the vertical stack into multiple magnetic tunnel junction (MTJ) memory cells (182, 282). Each MTJ memory cell (182, 282) may be located between a respective metallic bit line (170, 270) and a respective row of semiconductor channels (125, 225) connected to a common semiconductor source regions (122, 222). The plurality of pillar cavities 391 divide each semiconductor drain region (128, 228) into multiple semiconductor drain regions (128, 228) that are laterally spaced apart along the second horizontal direction hd2.

A plurality of magnetic tunnel junction (MTJ) memory cells (182, 282) having a respective first electrode is provided. Each first electrode may be a patterned portion of an instance of the metallic material layer (130, 230). Each first electrode may be located on a respective one of the plurality of semiconductor drain regions (128, 228), which is patterned from a single semiconductor drain region (128, 228) as provided at the processing steps of FIGS. 4A-4C. A patterned portion of an instance of a capping layer (such as the first capping layer 149) may function as a second electrode of a respective MTJ memory cell (182, 282). A metallic bit line (170, 270) contacts each second electrode of the plurality of magnetic tunnel junction memory cells (182, 282).

The patterned portion of the metallic material layer (130, 230) that contacts a top surface of a semiconductor source region (122, 222) comprises a metallic source line contacting a horizontal surface of the semiconductor source region (122, 222). Each combination of a semiconductor source region (122, 222), a metallic source line, a plurality of semiconductor channels (125, 225), a plurality of semiconductor drain regions (128, 228), a plurality of MTJ memory cells (182, 282) located on the plurality of semiconductor drain regions (128, 228), a metallic bit line (170, 270), portions of the gate dielectric layer 332 that surrounds the plurality of semiconductor channels (125, 225), and the gate electrodes 334 that laterally surround the plurality of semiconductor channels (125, 225) constitutes a magnetic tunnel junction (MTJ) NOR string. Each magnetic tunnel junction NOR string may comprise a metallic source line (which is a patterned portion of the metallic material layer (130, 230)) contacting a horizontal surface of the semiconductor source region (122, 222), and the first electrodes (which are additional patterned portions of the metallic material layer (130, 230)) of the plurality of magnetic tunnel junction memory cells (182, 282) within each magnetic tunnel junction NOR string have a same material composition as, and have a same vertical thickness as, the metallic source line within each magnetic tunnel junction NOR string. As such, the first electrodes are vertically spaced from the substrate 9 by a same vertical spacing as the metallic source line within each magnetic tunnel junction NOR string.

The plurality of semiconductor channels (125, 225) within each magnetic tunnel junction NOR string may be parallel to one another, laterally extend along the first horizontal direction hd1, and may be laterally spaced apart along the second horizontal direction hd2. The plurality of semiconductor drain regions (128, 228) within each magnetic tunnel junction NOR string is laterally spaced from one another along the second horizontal direction hd2. The plurality of magnetic tunnel junction memory cells (182, 282) within each magnetic tunnel junction NOR string is laterally spaced from one another along the second horizontal direction hd2. In one embodiment, the plurality of magnetic tunnel junction memory cells (182, 282) within each magnetic tunnel junction NOR string is laterally spaced from each gate electrode 334 within each magnetic tunnel junction NOR string by a vertically-extending portion of the gate dielectric layer 332.

Referring to FIGS. 14A-14D, a dielectric fill material such as silicon oxide may be deposited in the drain-side trenches 371, the source-side trenches 381, and the pillar trenches 391. Excess portions of the dielectric fill material may be removed from above the horizontal plane including the top surface of the cap insulating material layer 310 by a planarization process such as a chemical mechanical process. Drain-side trench fill dielectric structures 376 are formed in the drain-side trenches 371, source-side trench fill dielectric structures 386 are formed in the source-side trenches 381, and magnetic tunnel junction (MTJ) isolation dielectric pillars 396 are formed in the pillar cavities 391.

The magnetic tunnel junction isolation dielectric pillars 396 are formed between each laterally-neighboring pair of magnetic tunnel junction memory cells (182, 282) within each magnetic tunnel junction NOR string, and may be laterally spaced apart from one another along the second horizontal direction hd2.

Each drain-side trench fill dielectric structure 376 vertically extends through each level of a vertical stack of magnetic tunnel junction NOR strings, and laterally extends along the second horizontal direction hd2. Each dielectric spacer (150, 250) contacts a sidewall of a respective metallic bit line (170, 270), and are laterally spaced apart along the second horizontal direction hd2. The dielectric spacers (150, 250) contact a top surface of the second electrodes of the magnetic tunnel junction memory cells (182, 282) of each magnetic tunnel junction NOR string.

Referring to FIGS. 15A-15G, processing steps for forming stepped surfaces for the metallic material layers (130, 230) and the metallic bit lines (170, 270) can be subsequently formed. The stepped surface of the metallic material layers (130, 230) and the metallic bit lines (170, 270) enable formation of contact via structures thereupon in subsequent processing steps. For example, a trimmable mask layer 337 may be applied over the exemplary structure. The trimmable mask layer 337 includes a trimmable mask material such as a trimmable photoresist material that may be isotropically trimmed by a wet etch process or a slow ashing process. The trimmable mask layer 337 may be lithographically patterned to cover the entire area including the gate electrodes 334, and to form a straight edge that laterally extend along the first horizontal direction hd1 and overlies portions of the metallic material layers (130, 230) (comprising metallic source lines) and portions of the metallic bit lines (170, 270) that are located outside the areas of the gate electrodes 334. For example, a straight edge of the trimmable mask layer 337 may extend over regions of the field dielectric material portion 328 that are interlaced with the metallic material layers (130, 230) and the metallic bit lines (170, 270).

An anisotropic etch process may be performed to vertically recess unmasked portions of the dielectric materials of the field dielectric material portions 328, the drain-side trench fill dielectric structures 376, the source-side trench fill dielectric structures 386, and the magnetic tunnel junction (MTJ) isolation dielectric pillars 396 selective to the materials of the metallic material layers (130, 230) and the metallic bit lines (170, 270). Surfaces of the metallic material layers (130, 230) and the metallic bit lines (170, 270) within the magnetic tunnel junction NOR strings located at a topmost level may be physically exposed by the anisotropic etch process.

Referring to FIGS. 16A-16G, the trimmable mask layer 337 may be isotropically trimmed to increase the unmasked area over the exemplary structure. The straight edge that laterally extends along the first horizontal direction hd1 may laterally shift along the second horizontal direction hd2 by a trimming distance, which is greater than the critical dimension of a subsequent lithographic process to form contact via patterns. For example, the trimming distance may be in a range from 200 nm to 900 nm, such as from 300 nm to 600 nm, although lesser and greater trimming distances may also be used.

A first anisotropic etch process may be performed to etch through the physically exposed portions of the metallic material layers (130, 230) and the metallic bit lines (170, 270), which include the topmost ones of the metallic material layers (130, 230) and the metallic bit lines (170, 270). A second anisotropic etch process may be performed to vertically recess unmasked portions of the dielectric materials of the field dielectric material portions 328, the drain-side trench fill dielectric structures 376, the source-side trench fill dielectric structures 386, and the magnetic tunnel junction (MTJ) isolation dielectric pillars 396 selective to the materials of the metallic material layers (130, 230) and the metallic bit lines (170, 270). Surfaces of the metallic material layers (130, 230) and the metallic bit lines (170, 270) within the magnetic tunnel junction NOR strings located at a topmost level and an immediately underlying level may be physically exposed by the second anisotropic etch process. The physically exposed surfaces of the metallic material layers (130, 230) and the metallic bit lines (170, 270) are stepped along the second horizontal direction hd2 to provide subsequent formation of contact via structures to the metallic material layers (130, 230) and the metallic bit lines (170, 270) that are located at different levels.

Generally, the trimming process and the combination of the first anisotropic etch process and the second anisotropic etch process may be repeated until each of the metallic material layers (130, 230) and the metallic bit lines (170, 270) has physically exposed horizontal surfaces. For example, if the vertical stack of the at least one instance of the unit layer stack includes N instances of the unit layer stack in which N is an integer greater than 2, the trimming process and the combination of the first anisotropic etch process and the second anisotropic etch process may be repeated (N−1) times to provide a physically exposed horizontal surface for each of the metallic material layers (130, 230) and the metallic bit lines (170, 270). The trimmable mask layer 337 may be subsequently removed, for example, by ashing.

Generally, portions of metallic material layers (130, 230) having an areal overlap within the semiconductor source regions (122, 222) (i.e., the metallic source lines) may be patterned such that each overlying metallic material layer (130, 230) has a lesser lateral extent than any underlying metallic material layer (130, 230). Portions of the metallic bit lines (170, 270) may be patterned such that each overlying metallic bit line (170, 270) has a lesser lateral extent than any underlying metallic bit line (170, 270). The semiconductor source regions (122, 222) are patterned with a same pattern as the metallic material layers (130, 230). In one embodiment, each overlying semiconductor source region (122, 222) selected from the semiconductor source regions within the vertical stack of multiple magnetic tunnel junction NOR strings has a lesser lateral extent along the second horizontal direction hd2 than any underlying semiconductor source region (122, 222) selected from the semiconductor source regions within the vertical stack of multiple magnetic tunnel junction NOR strings. In one embodiment, each overlying metallic bit line (170, 270) selected from the metallic bit lines within the vertical stack of multiple magnetic tunnel junction NOR strings has a lesser lateral extent along the second horizontal direction hd2 than any underlying metallic bit line (170, 270) selected from the metallic bit lines within the vertical stack of multiple magnetic tunnel junction NOR strings.

While the present disclosure is describe employing an embodiment in which formation of the pillar cavities 391 (illustrated in FIGS. 13A-13D) and formation of the magnetic tunnel junction isolation dielectric pillars 396 (illustrated in FIGS. 14A-14D) precedes formation of stepped surfaces for the metallic material layers (130, 230) and the metallic bit lines (170, 270) (illustrated in FIGS. 14A-16G), embodiments are expressly contemplated herein in which formation of stepped surfaces for the metallic material layers (130, 230) and the metallic bit lines (170, 270) (illustrated in FIGS. 14A-16G) precedes formation of the pillar cavities 391. In this case, a contact-level dielectric layer may, or may not, be formed after formation of the stepped surfaces for the metallic material layers (130, 230) and the metallic bit lines (170, 270) and prior to formation of the pillar cavities 391.

Referring to FIGS. 17A-17K, a contact-level dielectric layer 490 including a dielectric material may be deposited over the stepped surfaces of the metallic material layers (130, 230) and the metallic bit lines (170, 270) and over the gate electrodes 334. The contact-level dielectric layer 490 may be planarized, for example, by chemical mechanical planarization, to provide a horizontal planar surface.

Contact via structures (482, 488, 485) may be formed through the contact-level dielectric layer 490 on a respective one of the metallic material layers (130, 230), the metallic bit lines (170, 270), and the gate electrodes 334. The contact via structures (482, 488, 485) include source-contact via structures 482 that contact a horizontal surface of a respective one of the metallic material layers (130, 230) (which function as metallic source lines), bit-line-contact via structures 488 that contact a horizontal surface of a respective one of the metallic bit lines (170, 270), and gate-contact via structures 485 that contact a horizontal surface of a respective one of the gate electrodes 334.

Figure 18:
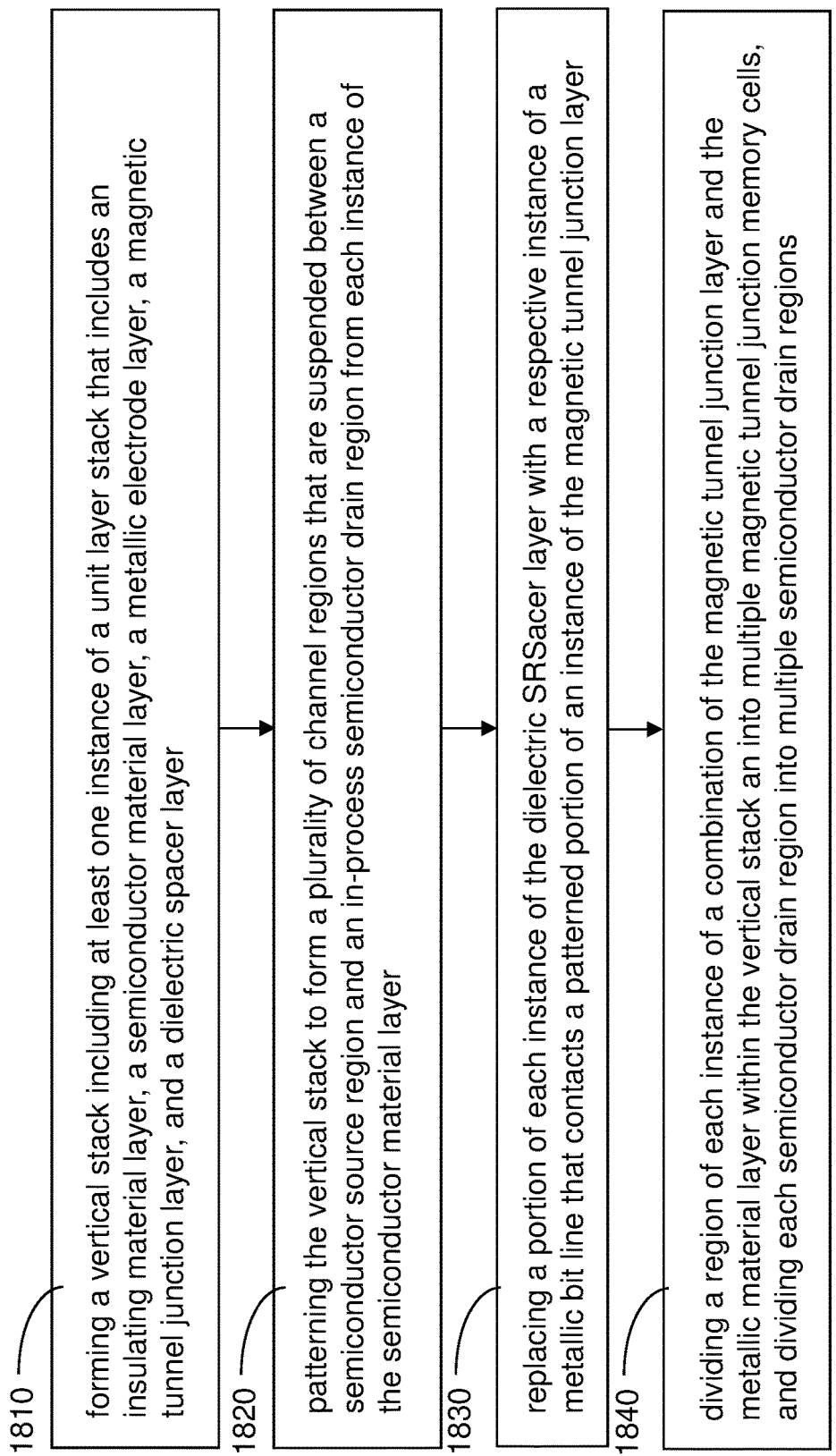
FIG. 18 is a flowchart that illustrates the general processing steps of the methods of the present disclosure.

Referring to FIG. 18, a general method of forming a magnetic tunnel junction is provided according to an embodiment of the present disclosure. Referring to step 1810, a vertical stack including at least one instance of a unit layer stack is formed. The unit layer stack includes an insulating material layer (110, 210), a semiconductor material layer (120, 220), a metallic material layer (130, 230), a magnetic tunnel junction layer (140, 240), and a dielectric spacer layer (150L, 250L). Referring to step 1820, each instance of the semiconductor material layer (120, 220) in the vertical stack is patterned to form a plurality of semiconductor channels (125, 225) that are suspended between a semiconductor source region (122, 222) and a semiconductor drain region (128, 228). Patterned portions of all layers other than each instance of the semiconductor material layer (120, 220) overlie, or underlie, the semiconductor source region (122, 222) or the semiconductor drain region (128, 228). Referring to step 1830, a portion of each instance of the dielectric spacer layer (150L, 250L) is replaced with a respective instance of a metallic bit line (170, 270) that contacts a patterned portion of an instance of the magnetic tunnel junction layer (140, 240). Referring to step 1840, a region of each instance of a combination of the magnetic tunnel junction layer (140, 240) and the metallic material layer (130, 230) within the vertical stack is divided into multiple magnetic tunnel junction memory cells (182, 282), and each semiconductor drain region (128, 228) is divided into multiple semiconductor drain regions (128, 228) that do not directly contact one another.

Referring to all drawings and according to various embodiments of the present disclosure, a magnetic tunnel junction memory device is provided, which comprises at least one magnetic tunnel junction NOR string located over a substrate 9. Each magnetic tunnel junction NOR string comprises: a respective semiconductor material layer (120, 220) including a semiconductor source region (122, 222), a plurality of semiconductor channels (125, 225), and a plurality of semiconductor drain regions (128, 228); a plurality of magnetic tunnel junction memory cells (182, 282) having a respective first electrode (which is a patterned portion of a metallic material layer (130, 230)) that is located on a respective one of the plurality of semiconductor drain regions (128, 228); and a metallic bit line (170, 270) contacting each second electrode of the plurality of magnetic tunnel junction memory cells (182, 282).

In one embodiment, each magnetic tunnel junction NOR string comprises a metallic source line (comprising a portion of metallic material layer (130, 230)) contacting a horizontal surface of the semiconductor source region (122, 222). In one embodiment, the first electrodes of the plurality of magnetic tunnel junction memory cells (182, 282) within each magnetic tunnel junction NOR string have a same material composition as, and have a same vertical thickness as, the metallic source line within each magnetic tunnel junction NOR string, and are vertically spaced from the substrate 9 by a same vertical spacing as the metallic source line within each magnetic tunnel junction NOR string.

In one embodiment, the plurality of semiconductor channels (125, 225) within each magnetic tunnel junction NOR string is parallel to one another, laterally extend along a first horizontal direction hd1, and are laterally spaced apart along a second horizontal direction hd2. In one embodiment, the plurality of semiconductor drain regions (128, 228) within each magnetic tunnel junction NOR string is laterally spaced from one another along the second horizontal direction hd2; and the plurality of magnetic tunnel junction memory cells (182, 282) within each magnetic tunnel junction NOR string is laterally spaced from one another along the second horizontal direction hd2.

In one embodiment, the magnetic tunnel junction memory device comprises: gate isolation dielectric pillars 326 located between each laterally-neighboring pair of gate electrodes 334 within each magnetic tunnel junction NOR string and laterally spaced apart from one another along the second horizontal direction hd2; and magnetic tunnel junction isolation dielectric pillars 396 located between each laterally-neighboring pair of magnetic tunnel junction memory cells (182, 282) within each magnetic tunnel junction NOR string and laterally spaced apart from one another along the second horizontal direction hd2.

In one embodiment, the metallic bit line (170, 270) of each magnetic tunnel junction NOR string is laterally spaced from gate electrodes 334 that laterally surround the plurality of semiconductor channels (125, 225) of each magnetic tunnel junction NOR string by dielectric spacers (150, 250) that contact a sidewall of the metallic bit line (170, 270), are laterally spaced apart along the second horizontal direction hd1, and contact a top surface of the second electrodes of the magnetic tunnel junction memory cells (182, 282) of each magnetic tunnel junction NOR string.

In one embodiment, the metallic bit line (170, 270) of each magnetic tunnel junction NOR string contacts a horizontal surface of an insulating fill material strip (160, 260) that contacts sidewalls of each of the plurality of semiconductor drain regions (128, 228), contacts sidewalls of each of the plurality of magnetic tunnel junction memory cells (182, 282), and laterally extends along the second horizontal direction hd2.

In one embodiment, the at least one magnetic tunnel junction NOR string comprises a vertical stack of magnetic tunnel junction NOR strings. The insulating fill material strip (160, 260) and the metallic bit line (170, 270) contact a sidewall of a drain-side trench fill dielectric structure 376 that vertically extends through each level of the vertical stack of magnetic tunnel junction NOR strings and laterally extends along the second horizontal direction hd2.

In one embodiment, each semiconductor channel (125, 225) of the plurality of semiconductor channels within each magnetic tunnel junction NOR string is laterally surrounded by a laterally-extending tubular portion of a gate dielectric layer 332; and each laterally-extending tubular portion of the gate dielectric layer 332 is laterally surrounded by a respective gate electrode 334. In one embodiment, each gate electrode 334 laterally surrounds multiple semiconductor channels (125, 225) that are provided within multiple magnetic tunnel junction NOR strings of the vertical stack of magnetic tunnel junction NOR strings and have an areal overlap among one another in a plan view along a direction that is perpendicular to top surface of the substrate 9. In one embodiment, the plurality of magnetic tunnel junction memory cells (182, 282) within each magnetic tunnel junction NOR string is laterally spaced from each gate electrode 334 within each magnetic tunnel junction NOR string by a vertically-extending portion of the gate dielectric layer 332.

According to an embodiment of the present disclosure, a magnetic tunnel junction memory device is provided, which comprises a vertical stack of multiple magnetic tunnel junction NOR strings located over a substrate 9. Each magnetic tunnel junction NOR string within the vertical stack of multiple magnetic tunnel junction NOR strings comprises a parallel connection of multiple series connections of a respective field effect transistor and a respective magnetic tunnel junction in which source regions of the field effect transistors may comprise a semiconductor source region (122, 222) that is a single continuous material portion, each first electrode (which is a portion of a metallic material layer (130, 230)) of the magnetic tunnel junction memory cells is connected to a respective semiconductor drain region (128, 228) of the field effect transistors, and each second electrode of the magnetic tunnel junction is connected to a metallic bit line (170, 270); semiconductor channels (125, 225) within the vertical stack of multiple magnetic tunnel junction NOR strings laterally extend along a first horizontal direction hd1 and are arranged as a two-dimensional rectangular array with repetition along a second horizontal direction hd2 and along a vertical direction; and each overlying semiconductor source region selected from the semiconductor source regions (122, 222) within the vertical stack of multiple magnetic tunnel junction NOR strings has a lesser lateral extent along the second horizontal direction hd2 than any underlying semiconductor source region selected from the semiconductor source regions (122, 222) within the vertical stack of multiple magnetic tunnel junction NOR strings.

In one embodiment, each gate electrode 334 wraps around a respective plurality of semiconductor channels (125, 225) that are vertically spaced apart and have an areal overlap among one another in a plan view along a direction that is perpendicular to a top surface of the substrate 9; and each overlying metallic bit line selected from the metallic bit lines (170, 270) within the vertical stack of multiple magnetic tunnel junction NOR strings has a lesser lateral extent along the second horizontal direction hd2 than any underlying metallic bit line (170, 270) selected from the metallic bit lines within the vertical stack of multiple magnetic tunnel junction NOR strings.

According to another aspect of the present disclosure, a magnetic tunnel junction memory device may be provided. The magnetic tunnel junction memory device may include: a contiguous semiconductor material portion 120, 220 that includes a semiconductor source region 122, 222, a plurality of semiconductor channels 125, 225, and a plurality of semiconductor drain regions 128, 228; a plurality of magnetic tunnel junction memory cells 182, 282 located on a respective one of the plurality of semiconductor drain regions 128, 228; and a metallic bit line 170, 270 contacting each the plurality of magnetic tunnel junction memory cells 182, 282.

In one embodiment, the magnetic tunnel junction memory device may also include: a metallic source line contacting a horizontal surface of the semiconductor source region 122, 222. In one embodiment, the plurality of magnetic tunnel junction memory cells 182, 282 may include first electrodes that have a same material composition as, and have a same vertical thickness as, the metallic source line, and are vertically spaced from the substrate by a same vertical spacing as the metallic source line. In one embodiment, the plurality of semiconductor channels 125, 225 is parallel among another, laterally extend along a first horizontal direction, and are laterally spaced apart along a second horizontal direction. In one embodiment, the plurality of semiconductor drain regions 128, 228 is laterally spaced from one another along the second horizontal direction; and the plurality of magnetic tunnel junction memory cells 182, 282 is laterally spaced from one another along the second horizontal direction. In one embodiment, the magnetic tunnel junction memory device may also include: gate isolation dielectric pillars 326 located between each laterally-neighboring pair of gate electrodes 334 and laterally spaced apart from one another along the second horizontal direction; and magnetic tunnel junction isolation dielectric pillars 326 located between each laterally-neighboring pair of magnetic tunnel junction memory cells 182, 282 and laterally spaced apart from one another along the second horizontal direction. In one embodiment, the metallic bit line 170, 270 is laterally spaced from gate electrodes 334 that laterally surround the plurality of semiconductor channels 125, 225 by dielectric spacers 150, 250 that contact a sidewall of the metallic bit line 170, 270, are laterally spaced apart along the second horizontal direction, and contact a top surface of the plurality of magnetic tunnel junction memory cells 182, 282. In one embodiment, the metallic bit line 170, 270 contacts a horizontal surface of an insulating fill material strip 160, 260 that contacts sidewalls of each of the plurality of semiconductor drain regions 128, 228, contacts sidewalls of each of the plurality of magnetic tunnel junction memory cells 182, 282, and laterally extends along the second horizontal direction. In one embodiment, the insulating fill material strip 160, 260 and the metallic bit line 170, 270 contact a sidewall of a drain-side trench fill dielectric structure 376 that vertically extends through each level of a combination of the continuous semiconductor material portion, the plurality of magnetic tunnel junction memory cells 182, 282, and the metallic bit line 170, 270, and laterally extends along the second horizontal direction. In one embodiment, each semiconductor channel of the plurality of semiconductor channels 125, 225 is laterally surrounded by a laterally-extending tubular portion of a gate dielectric layer 332; and each laterally-extending tubular portion of the gate dielectric layer 332 is laterally surrounded by a gate electrode 334. In one embodiment, the magnetic tunnel junction memory device may include a magnetic tunnel junction NOR string; and a gate electrode 334 laterally surrounds each of the plurality of semiconductor channel 125, 225. In one embodiment, the plurality of magnetic tunnel junction memory cells 182, 282 within each magnetic tunnel junction NOR string is laterally spaced from the gate electrode 334 by a vertically-extending portion of the gate dielectric layer 332.

In another aspect of the present disclosure, a device comprising a vertical stack of multiple magnetic tunnel junction devices located over a substrate 9, wherein: each magnetic tunnel junction device within the vertical stack of multiple magnetic tunnel junction devices comprises a parallel connection of multiple series connections of a respective field effect transistor and a respective magnetic tunnel junction in which source regions 122, 222 of the field effect transistors comprise a semiconductor source region 122, 222 that is a single continuous material portion; and semiconductor channels 125, 225 within the vertical stack of multiple magnetic tunnel junction devices laterally extend along a first horizontal direction and are arranged as a two-dimensional rectangular array with repetition along a second horizontal direction and along a vertical direction.

In one embodiment, each first electrode of the magnetic tunnel junction memory cells is connected to a respective semiconductor drain region 128, 228 of the field effect transistors; and each second electrode of the magnetic tunnel junction is connected to a respective metallic bit line 170, 270 within a vertical stack of metallic bit lines. In one embodiment, each overlying metallic bit line 170, 270 within the vertical stack of metallic bit lines has a lesser lateral extent along the second horizontal direction than any underlying metallic bit line within the vertical stack of metallic bit lines. In one embodiment, each overlying semiconductor source region 122, 222 selected from the semiconductor source regions within the vertical stack of multiple magnetic tunnel junction devices has a lesser lateral extent along the second horizontal direction than any underlying semiconductor source region selected from the semiconductor source regions 122, 222 within the vertical stack of multiple magnetic tunnel junction devices. In one embodiment, the device may also include a plurality of gate electrodes 334 that are laterally spaced apart, wherein each gate electrode 334 wraps around a respective plurality of semiconductor channels 125, 225 that are vertically spaced apart and have an areal overlap among one another in a plan view along a direction that is perpendicular to a top surface of the substrate 9.

In another aspect of the present disclosure, a device comprising a plurality of magnetic tunnel junction NOR strings arranged along a vertical direction and over a substrate 9, wherein each magnetic tunnel junction NOR string among the plurality of magnetic tunnel junction NOR strings may include: a respective semiconductor material layer including a semiconductor source region 122, 222, a plurality of semiconductor channels 125, 225 that are laterally spaced apart along a second horizontal direction that is perpendicular to the first horizontal direction, and a plurality of semiconductor drain regions 128, 228 that are laterally spaced apart from the semiconductor source region 122, 222 by a respective one of the plurality of semiconductor channels and arranged along the second horizontal direction; a plurality of magnetic tunnel junction memory cells 182, 282 in contact with a respective one of the plurality of semiconductor drain regions 128, 228 and arranged along the second horizontal direction; and a metallic bit line 170, 270 contacting each of the plurality of magnetic tunnel junction memory cells 182, 282 within a respective magnetic tunnel junction NOR string and laterally extending along the second horizontal direction.

In one embodiment, the device may also include a gate electrode 334 that laterally surrounds all semiconductor channels 125, 225 within the plurality of magnetic tunnel junction NOR strings. In one embodiment, the gate electrode 334 is located within a trench that laterally extends along the second horizontal direction between a vertical stack of semiconductor source regions 122, 222 and a two-dimensional array of semiconductor drain regions 128, 228 arranged along the second horizontal direction and along the vertical direction.

The various embodiments of the present disclosure may be used to provide a magnetic tunnel junction memory device such as a three-dimensional array of magnetic tunnel junction memory cells. The magnetic tunnel junction memory cells may be arranged as multiple magnetic tunnel junction NOR strings that are repeated along a vertical direction and/or along two horizontal directions. The various embodiment configurations provide memory devices with high density and high performance in a compact cell size. Such device improve the overall cost of manufacture.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a magnetic tunnel junction memory device, comprising:
    forming a vertical stack comprising at least one instance of a unit layer stack that includes an insulating material layer, a semiconductor material layer, a metallic material layer, a magnetic tunnel junction layer, and a dielectric spacer layer;
    patterning each instance of the semiconductor material layer in the vertical stack into a plurality of semiconductor channels that are suspended between a semiconductor source region and a semiconductor drain region, wherein patterned portions of all layers other than each instance of the semiconductor material layer overlie, or underlie, the semiconductor source region or the semiconductor drain region; and
    replacing a portion of each instance of the dielectric spacer layer with a respective instance of a metallic bit line that contacts a patterned portion of an instance of the magnetic tunnel junction layer.

2. The method of claim 1, further comprising dividing a region of each instance of a combination of the magnetic tunnel junction layer and the metallic material layer within the vertical stack into multiple magnetic tunnel junction memory cells.

3. The method of claim 2, further comprising dividing each semiconductor drain region into multiple semiconductor drain regions.

4. The method of claim 1, further comprising forming a gate dielectric layer on each of the plurality of semiconductor channels.

5. The method of claim 4, further comprising forming gate electrodes over the gate dielectric layer, wherein each of the gate electrodes wraps around at least one of the plurality of semiconductor channels.

6. The method of claim 1, further comprising forming a plurality of pillar cavities through the vertical stack after formation of at least one instance of the metallic bit line, wherein the plurality of pillar cavities divide a region of each instance of the magnetic tunnel junction layer into multiple magnetic tunnel junction memory cells, and divide each semiconductor drain region into multiple semiconductor drain regions.

7. The method of claim 6, further comprising forming magnetic tunnel junction isolation dielectric pillars in the plurality of pillar cavities.

8. The method of claim 1, further comprising:
    forming a drain-side trench through the vertical stack;
    forming at least one first lateral recess by laterally recessing each instance of the semiconductor material layer, the metallic material layer, and the magnetic tunnel junction layer;
    forming an insulating fill material strip within each first lateral recess;
    forming at least one second lateral recess by laterally recessing each instance of the dielectric spacer layer; and
    forming an instance of the metallic bit line within each second lateral recess.

9. A method of forming a magnetic tunnel junction memory device, comprising:
    forming a vertical stack comprising at least one instance of a unit layer stack that includes a semiconductor material layer, a metallic material layer, a magnetic tunnel junction layer, and a dielectric spacer layer;
    patterning each instance of the semiconductor material layer in the vertical stack into a plurality of semiconductor channels that are suspended between a semiconductor source region and a semiconductor drain region;
    replacing a portion of each instance of the dielectric spacer layer with a respective instance of a metallic bit line; and
    dividing a region of each instance of a combination of the magnetic tunnel junction layer and the metallic material layer within the vertical stack into multiple magnetic tunnel junction memory cells.

10. The method of claim 9, further comprising dividing each semiconductor drain region into multiple semiconductor drain regions.

11. The method of claim 9, wherein the metallic bit line is formed on patterned portions of an instance of the magnetic tunnel junction layer.

12. The method of claim 9, wherein the vertical stack comprises multiple instances of the unit layer stack containing a plurality of metallic material layers, and the method comprises patterning portions of the plurality of metallic material layers having an areal overlap within the semiconductor source regions such that each overlying metallic material layer has a lesser lateral extent than any underlying metallic material layer.

13. The method of claim 12, further comprising patterning the metallic bit lines such that each overlying metallic bit line has a lesser lateral extent than any underlying metallic bit line.

14. The method of claim 13, further comprising:
    forming source-contact via structures on the metallic material layers; and
    forming bit-line-contact via structures on the metallic bit lines.

15. The method of claim 9, wherein patterned portions of all layers within the vertical stack other than each instance of the semiconductor material layer overlie, or underlie, the semiconductor source region or the semiconductor drain region.

16. A method of forming a magnetic tunnel junction memory device, the method comprising:
    providing a layer stack including a semiconductor material layer, a metallic material layer, a magnetic tunnel junction layer,
    and a dielectric spacer layer;
    patterning the semiconductor material layer into a contiguous structure including a semiconductor source region, a plurality of semiconductor channels, and a plurality of semiconductor drain regions; and patterning the metallic material layer and the magnetic tunnel junction layer, wherein patterned portions of the magnetic tunnel junction layer comprise a plurality of magnetic tunnel junction memory cells, and patterned portions of the metallic material layer comprise first electrodes underlying a respective one of the plurality of magnetic tunnel junction memory cells, wherein each of the first electrodes is formed on a respective one of the plurality of semiconductor drain regions.

17. The method of claim 16, further comprising forming a metallic bit line contacting each second electrode of the plurality of magnetic tunnel junction memory cells by replacing a portion of the dielectric spacer layer with a conductive material.

18. The method of claim 16, wherein:
the plurality of semiconductor drain regions is laterally spaced apart from the semiconductor source region along a first horizontal direction; and
the plurality of semiconductor channels are laterally spaced apart among one another along a second horizontal direction and do not contact among one another.

19. The method of claim 18, wherein:
the plurality of semiconductor drain regions is laterally spaced from one another along the second horizontal direction; and
the plurality of magnetic tunnel junction memory cells is laterally spaced from one another along the second horizontal direction.

20. The method of claim 16, wherein the patterned portions of the metallic material layer comprise a metallic source line that is formed on a horizontal surface of the semiconductor source region.

* * * * *